(12) United States Patent
Lee et al.

(10) Patent No.: US 12,532,458 B2
(45) Date of Patent: Jan. 20, 2026

(54) SEMICONDUCTOR MEMORY DEVICE

(71) Applicant: Samsung Electronics Co., Ltd., Suwon-si (KR)

(72) Inventors: Kiseok Lee, Suwon-si (KR);
Moonyoung Jeong, Suwon-si (KR);
Keunnam Kim, Suwon-si (KR);
Seokhan Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 353 days.

(21) Appl. No.: 18/182,539

(22) Filed: Mar. 13, 2023

(65) Prior Publication Data

US 2023/0363143 A1 Nov. 9, 2023

(30) Foreign Application Priority Data

May 4, 2022 (KR) ........................ 10-2022-0055441

(51) Int. Cl.
*H10B 12/00* (2023.01)
*H10B 80/00* (2023.01)

(52) U.S. Cl.
CPC .......... *H10B 12/315* (2023.02); *H10B 12/05* (2023.02); *H10B 12/482* (2023.02); *H10B 80/00* (2023.02)

(58) Field of Classification Search
CPC .... H10B 12/315; H10B 12/05; H10B 12/482; H10B 80/00; H10B 12/488; H10B 12/30; H10B 63/30; H10B 12/34; H10D 30/6728; G11C 11/4097
See application file for complete search history.

(56) References Cited

U.S. PATENT DOCUMENTS

| | | | |
|---|---|---|---|
| 5,656,842 A | 8/1997 | Iwamatsu et al. | |
| 8,372,715 B2 | 2/2013 | Chung et al. | |
| 8,936,982 B2 | 1/2015 | Cho et al. | |
| 9,136,376 B2 | 9/2015 | Moon et al. | |
| 11,696,455 B2 * | 7/2023 | Matsuzaki | H10D 86/60 257/43 |
| 2009/0258470 A1 | 10/2009 | Choi et al. | |
| 2014/0256104 A1 * | 9/2014 | Nagai | H10B 12/01 438/270 |
| 2017/0213833 A1 | 7/2017 | Godo et al. | |
| 2021/0104526 A1 | 4/2021 | Son | |
| 2021/0225849 A1 | 7/2021 | Kim | |

(Continued)

FOREIGN PATENT DOCUMENTS

KR 10-2010-0097462 A 9/2010
KR 10-2021-0091794 A 7/2021

(Continued)

*Primary Examiner* — Jonathan Han
(74) *Attorney, Agent, or Firm* — Fish & Richardson P.C.

(57) ABSTRACT

A semiconductor memory device is disclosed. The semiconductor memory device may include a bit line extending in a first direction, first and second active patterns disposed on the bit line, a back-gate electrode, which is disposed between the first and second active patterns and is extended in a second direction to cross the bit line, a first word line, which is provided at a side of the first active pattern and is extended in the second direction, a second word line, which is provided at an opposite side of the second active pattern and is extended in the second direction, and contact patterns coupled to the first and second active patterns, respectively.

20 Claims, 89 Drawing Sheets

(56) References Cited

U.S. PATENT DOCUMENTS

2021/0320106 A1  10/2021  Teo
2021/0327881 A1  10/2021  Tang et al.
2021/0358922 A1  11/2021  Liu
2022/0102352 A1* 3/2022  Lee ..................... H10B 12/395

FOREIGN PATENT DOCUMENTS

KR  10-2022-0043981 A  4/2022
TW           I762173 B  4/2022

* cited by examiner

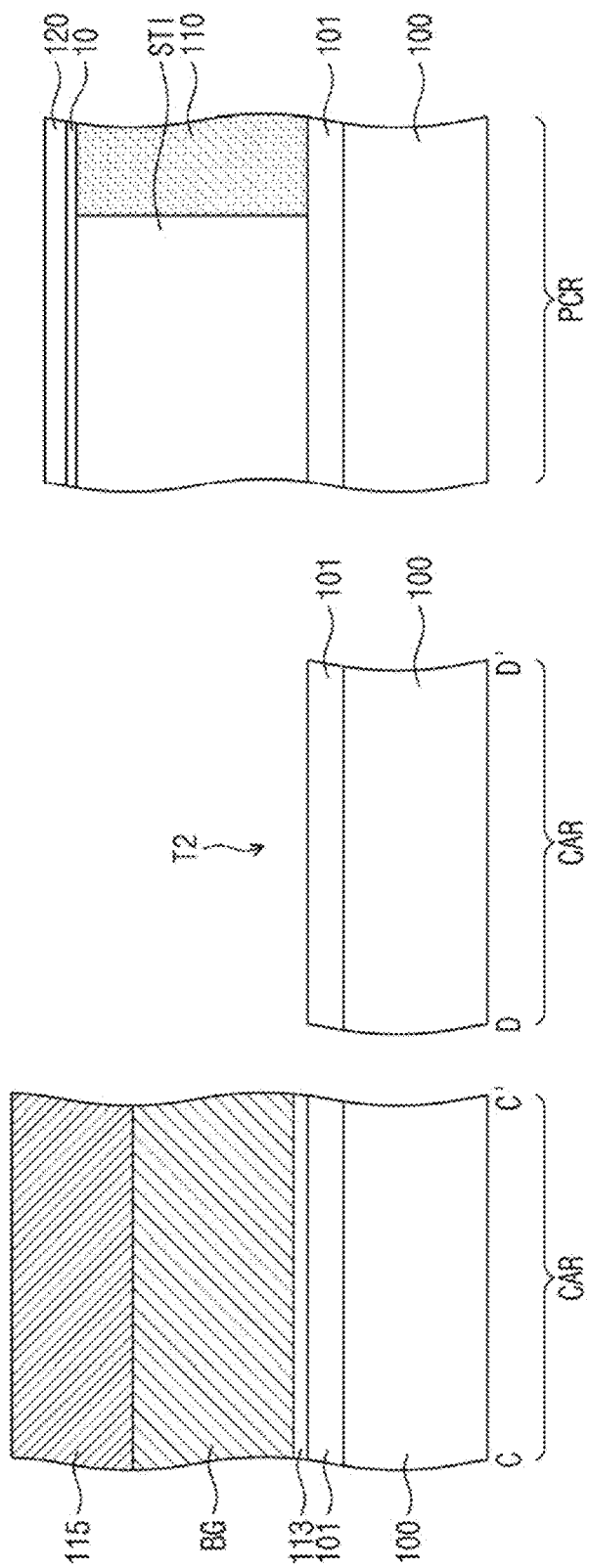

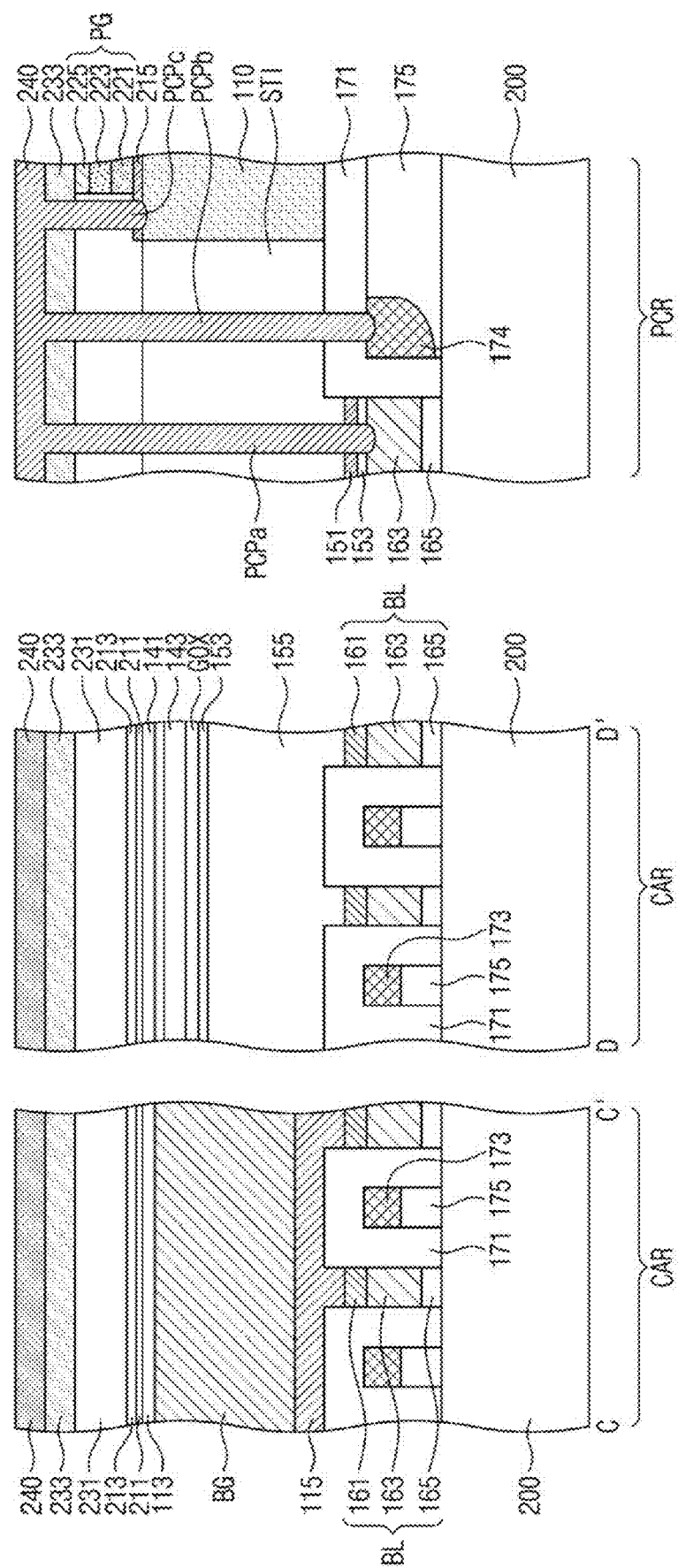

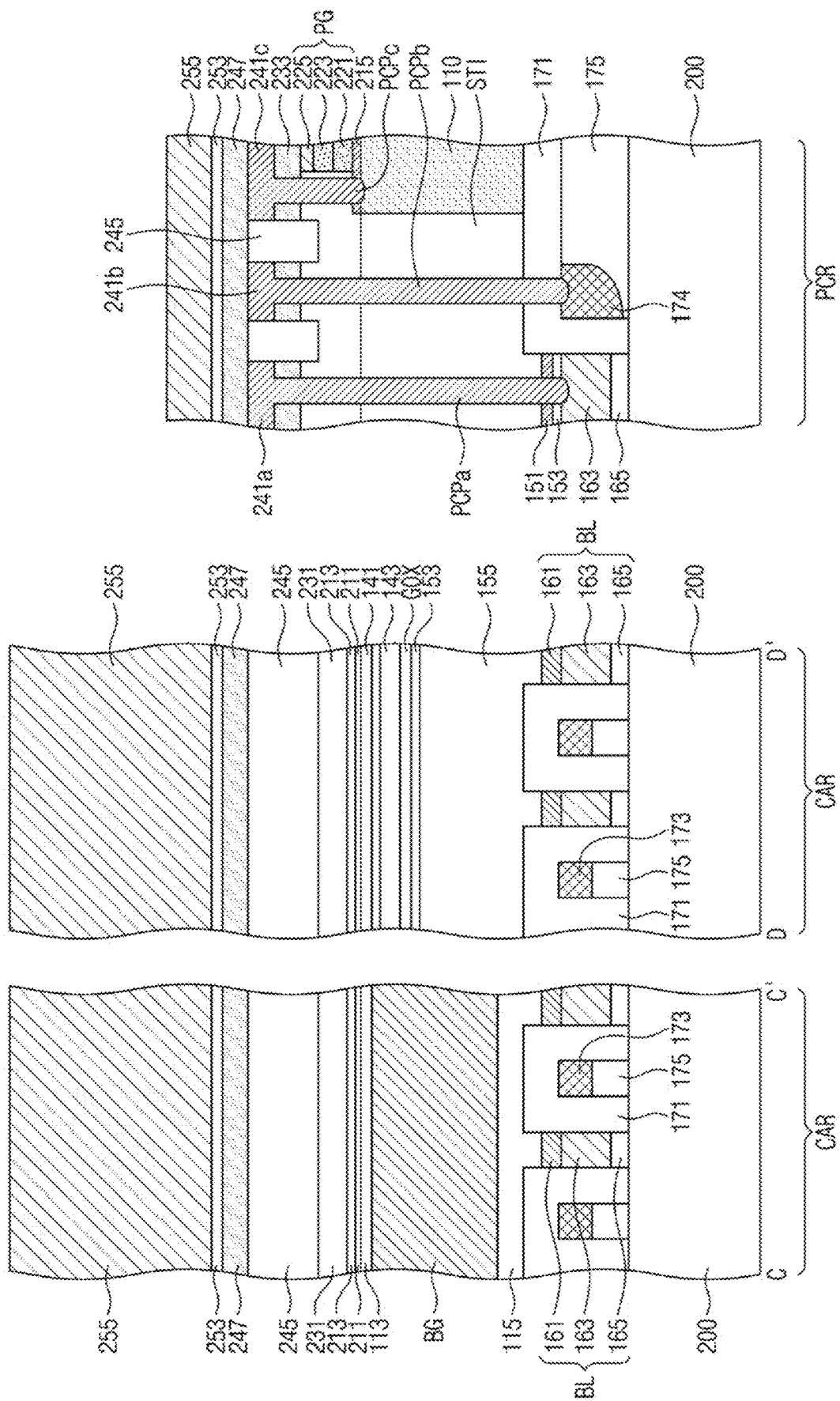

SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2022-0055441, filed on May 4, 2022, in the Korean Intellectual Property Office, the entire contents of which are hereby incorporated by reference.

BACKGROUND

The present inventive concepts relate to semiconductor memory devices, and in particular, to semiconductor memory devices with improved electric characteristics and an increased integration density.

Higher integration of semiconductor devices is required to satisfy consumer demands for superior performance and inexpensive prices. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Accordingly, various semiconductor technologies have been suggested to improve an integration density, resistance, and current driving ability of a semiconductor device.

SUMMARY

Some example embodiments of the inventive concepts provide a semiconductor memory device with an increased integration density and improved electric characteristics.

According to some example embodiments of the inventive concepts, a semiconductor memory device may include a bit line extending in a first direction, first and second active patterns on the bit line, a back-gate electrode, which is between the first and second active patterns and extends in a second direction that is different from the first direction to cross the bit line, a first word line, which is at a side of the first active pattern and extends in the second direction such that the first active pattern is between the first word line and the back-gate electrode, a second word line, which is at an opposite side of the second active pattern and extends in the second direction such that the second active pattern is between the second word line and the back-gate electrode, and contact patterns coupled to separate, respective active patterns of the first and second active patterns.

According to some example embodiments of the inventive concepts, a semiconductor memory device may include an active pattern having a first surface and a second surface, which are opposite to each other in a vertical direction, and having a first side surface and a second side surface, which are opposite to each other in a horizontal direction, a bit line in contact with the first surface of the active pattern, a word line crossing the bit line and to be adjacent to the first side surface of the active pattern, a gate insulating pattern including a vertical portion, which is between the first side surface of the active pattern and the word line, and a horizontal portion, which protrudes from the vertical portion in the horizontal direction, a back-gate electrode crossing the bit line and adjacent to the second side surface of the active pattern, a back-gate insulating pattern between the second side surface of the active pattern and the back-gate electrode, and a contact pattern in contact with the second surface of the active pattern. The horizontal portion of the gate insulating pattern may be closer to the contact pattern than to the bit line.

According to some example embodiments of the inventive concepts, a semiconductor memory device may include bit lines on a substrate and extending in a first direction, first active patterns and second active patterns on the bit lines in an alternating arrangement, which alternates in the first direction between the first and second active patterns, back-gate electrodes, which are respectively between adjacent ones of the first and second active patterns and each extend in a second direction that is different from the first direction to cross the bit line, first word lines, which are adjacent to separate, respective first active patterns of the first active patterns, and each extend in the second direction, second word lines, which are adjacent to separate, respective second active patterns of the second active patterns, and each extend in the second direction, gate insulating patterns between the first and second active patterns and the first and second word lines, back-gate insulating patterns between the first and second active patterns and the back-gate electrodes, contact patterns coupled to the first and second active patterns, respectively, isolation insulating patterns between the first and second word lines, which are adjacent to each other in the first direction, first insulating patterns between the bit lines and the back-gate electrodes, second insulating patterns between the first and second word lines and the bit lines, third insulating patterns between the contact patterns and the back-gate electrodes, fourth insulating patterns between the contact patterns and the first and second word lines, and data storage patterns coupled to the contact patterns, respectively. Each of the gate insulating patterns may include a vertical portion, which is adjacent to the first and second active patterns, and a horizontal portion, which protrudes from the vertical portion in the first direction. The horizontal portion of each of the gate insulating patterns may be between at least one of the fourth insulating patterns and at least one of the isolation insulating patterns.

According to some example embodiments of the inventive concepts, a method of fabricating a semiconductor memory device may include preparing a first substrate including a semiconductor substrate, a gapfill insulating layer, and an active layer, forming a back-gate electrode in the active layer to extend in a first direction, patterning the active layer to form first and second active patterns on the gapfill insulating layer and at opposite sides of the back-gate electrode, forming word lines at a side of the first active pattern and at an opposite side of the second active pattern such that the first and second active patterns are between the word lines, forming bit lines, which are in contact with first surfaces of the first and second active patterns and are extended in a second direction that is different from the first direction to cross the word lines, bonding a second substrate to the bit lines, removing the semiconductor substrate and the gapfill insulating layer of the first substrate to expose second surfaces of the first and second active patterns, wherein the second surfaces of the first and second active patterns are opposite to the first surfaces of the first and second active patterns, forming an interlayer insulating layer on the second surfaces of the first and second active patterns, and forming contact patterns to penetrate the interlayer insulating layer and to be in contact with the second surfaces of the first and second active patterns.

BRIEF DESCRIPTION OF THE DRAWINGS

FIGS. 10B, 11B, 12B, 13B, 14B, 15B, 16B, 17B, 18B, 19B, 20B, 21B, 22B, 23B, 24B, 25B, 26B, 27B, 28B, 29B, 30B, and 31B and 10C, 11C, 12C, 13C, 14C, 15C, 16C, 17C, 18C, 19C, 20C, 21C, 22C, 23C, 24C, 25C, 26C, 27C, 28C, 29C, 30C, and 31C are sectional views, which are taken along lines A-A', B-B', C-C', and D-D' of FIGS. 10A, 11A, 12A, 13A, 14A, 15A, 16A, 17A, 18A, 19A, 20A, 21A, 22A, 23A, 24A, 25A, 26A, 27A, 28A, 29A, 30A, and 31A to illustrate a method of fabricating a semiconductor memory device, according to some example embodiments of the inventive concepts.

DETAILED DESCRIPTION

Example embodiments of the inventive concepts will now be described more fully with reference to the accompanying drawings, in which example embodiments are shown.

Figure 1A:
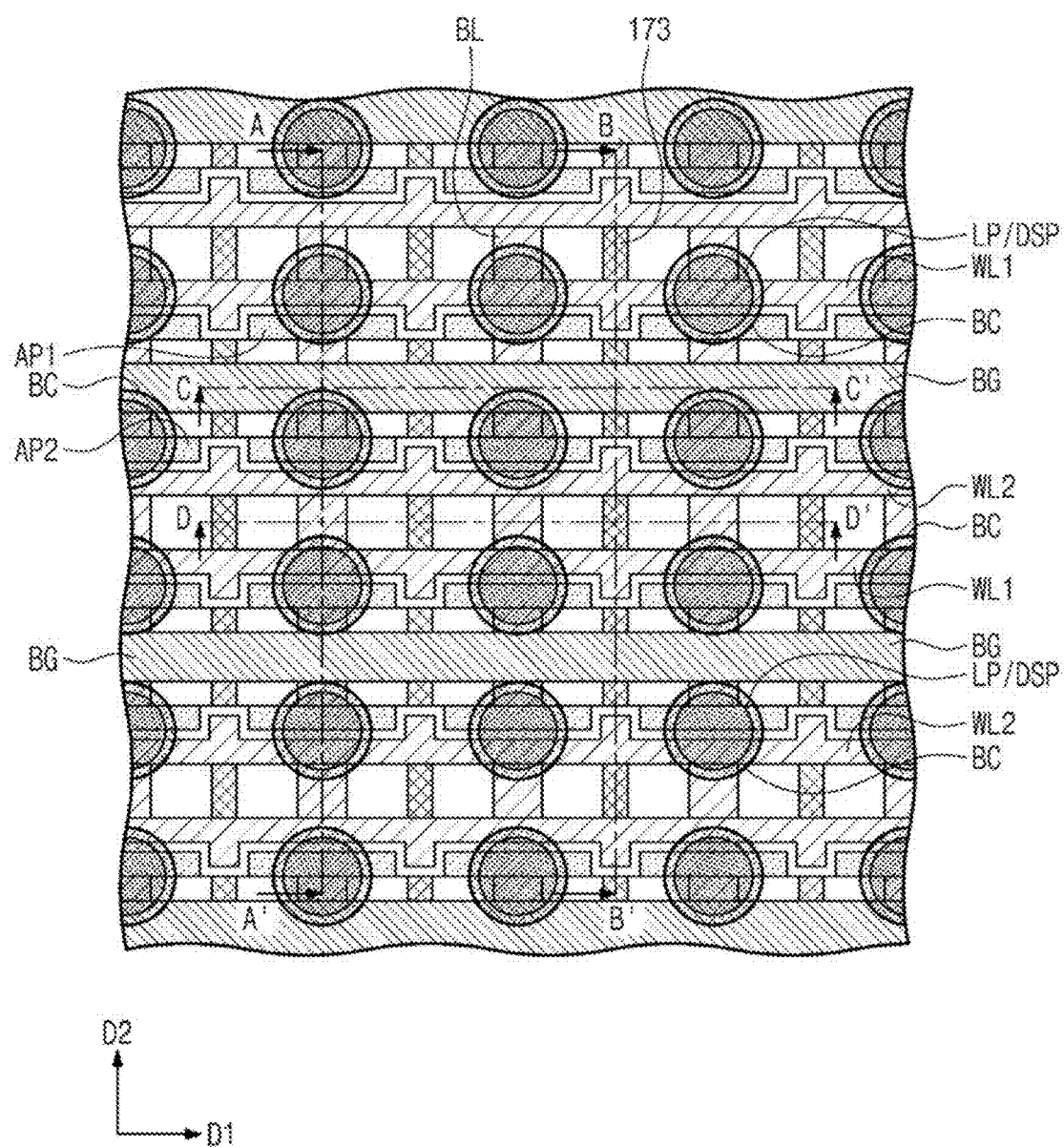
FIG. 1A is a plan view illustrating a semiconductor memory device according to some example embodiments of the inventive concepts.
Figure 1B:
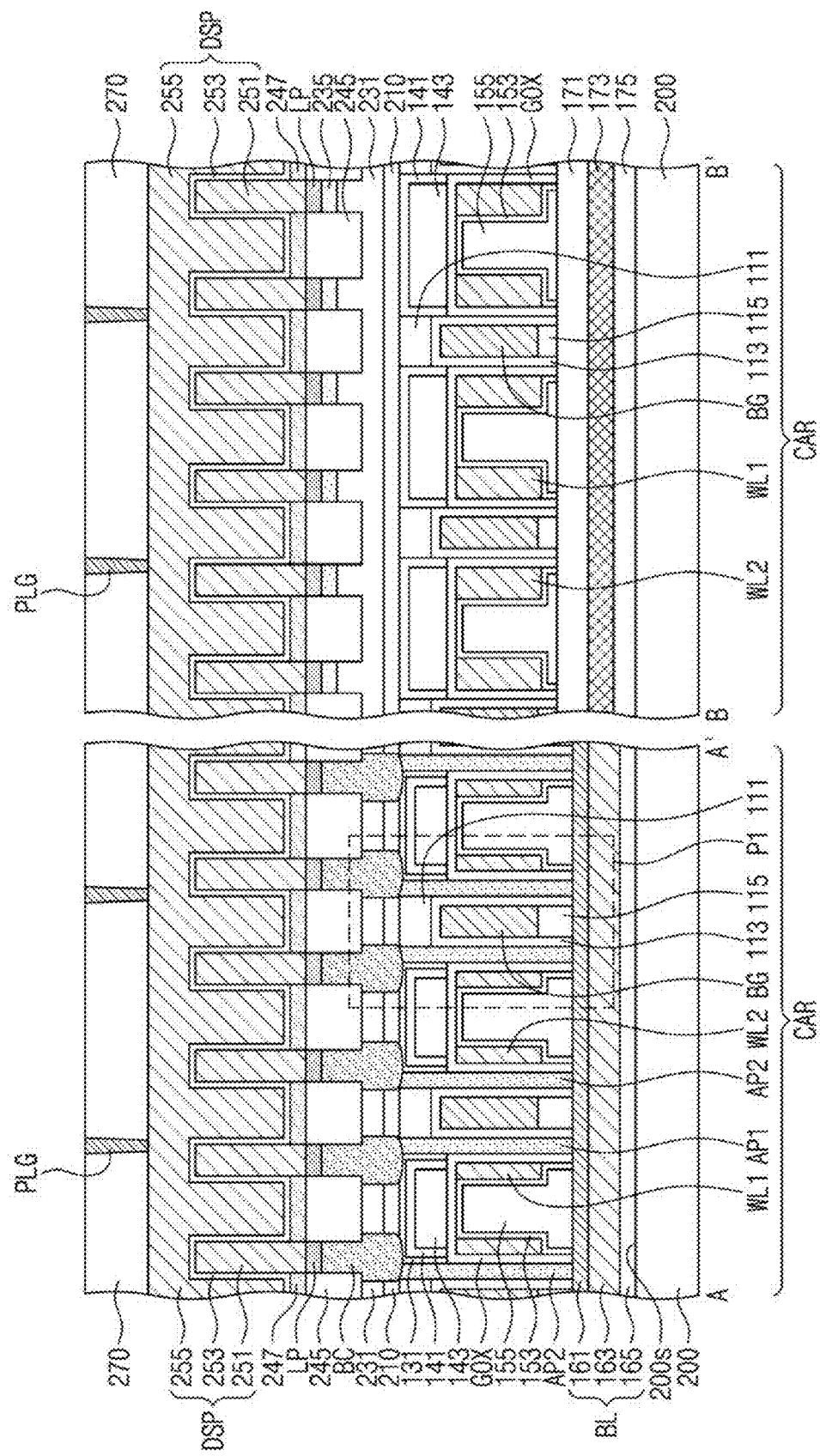
FIG. 1B is a sectional view, which is taken along lines A-A' and B-B' of FIG. 1A to illustrate a semiconductor memory device according to some example embodiments of the inventive concepts.
Figure 1C:
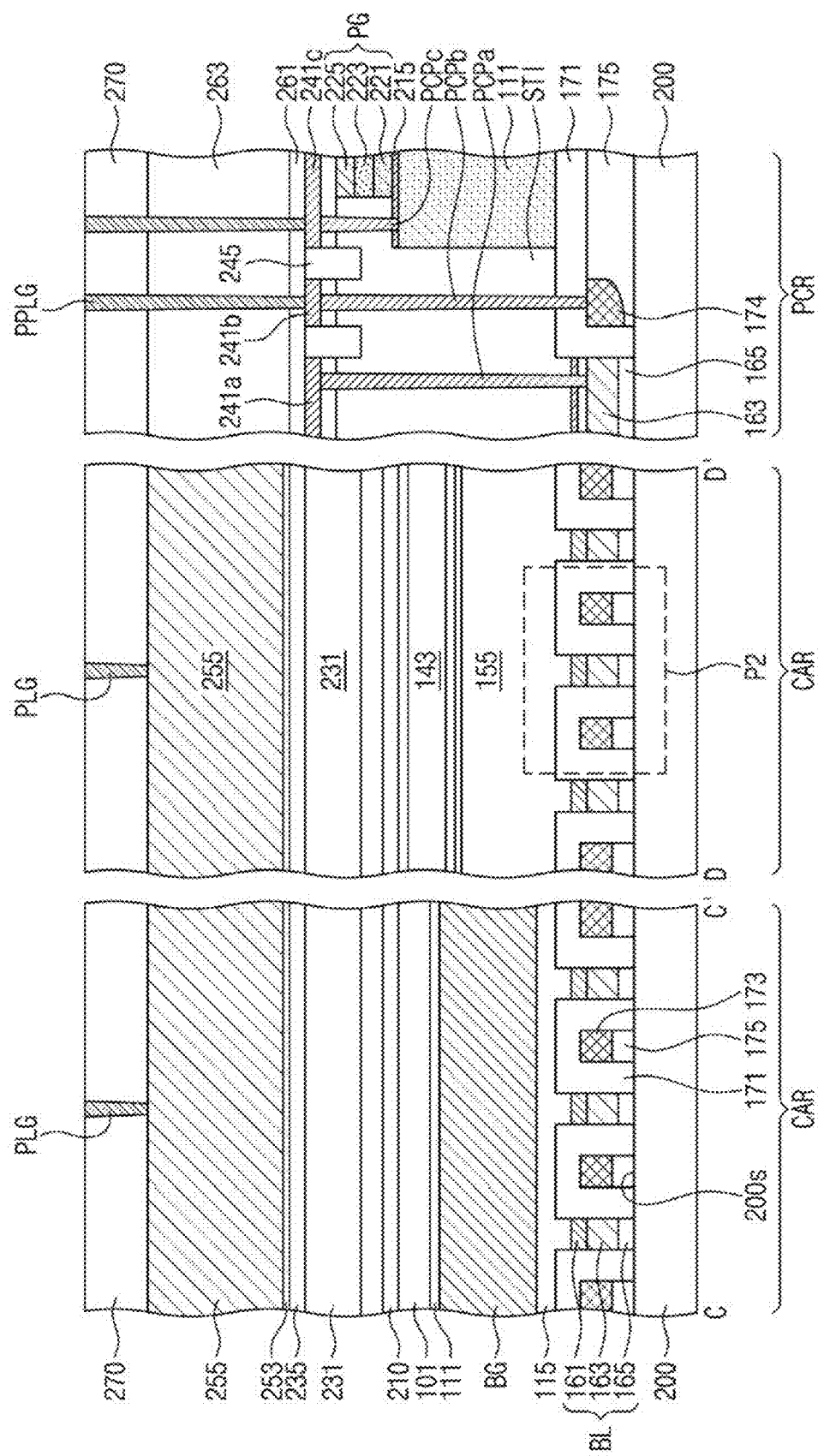
FIG. 1C is a sectional view, which is taken along lines C-C' and D-D' of FIG. 1A to illustrate a semiconductor memory device according to some example embodiments of the inventive concepts.

FIG. 1A is a plan view illustrating a semiconductor memory device according to some example embodiments of the inventive concepts. FIG. 1B is a sectional view taken along lines A-A' and B-B' of FIG. 1A. FIG. 1C is a sectional view taken along lines C-C' and D-D' of FIG. 1A. FIGS. 2A, 2B, 2C, 2D, 2E, 2F, 2G, 2H, and 2I are enlarged sectional views illustrating a portion 'P1' of FIG. 1B. FIGS. 3A, 3B, 3C, 3D, 3E, and 3F are enlarged sectional views illustrating a portion 'P2' of FIG. 1C.

A semiconductor memory device according to some example embodiments of the inventive concepts may include memory cells, each of which includes a vertical channel transistor (VCT).

Referring to FIGS. 1A, 1B, and 1C, bit lines BL may be disposed on a substrate 200 (also referred to herein as a second substrate) to be spaced apart from each other in a first direction D1. The bit lines BL may be extended in a second direction D2 that is different from (e.g., crossing, perpendicular or substantially perpendicular to, etc.) the first direction D1 and may be parallel to each other.

The substrate 200 may be one of a semiconductor material (e.g., silicon wafer), an insulating material (e.g., glass), or a semiconductor or conductor covered with an insulating material.

The bit lines BL may be extended from a cell array region CAR to a peripheral circuit region PCR, and an end portion of the bit line BL may be located in the peripheral circuit region PCR.

Each of the bit lines BL may include a poly-silicon pattern 161, a metal pattern 163, and a hard mask pattern 165 sequentially stacked. Here, the hard mask patterns 165 of the bit lines BL may be in contact with the substrate 200. The metal pattern 163 (also referred to herein as a metal layer) may be formed of or include at least one of conductive metal nitride materials (e.g., titanium nitride and tantalum nitride) or metallic materials (e.g., tungsten, titanium, and tantalum). The hard mask pattern 165 (also referred to herein as a hard mask layer) may be formed of or include at least one of insulating materials (e.g., silicon nitride or silicon oxynitride). The metal pattern 163 may be formed of or include at least one of metal silicide materials (e.g., titanium silicide, cobalt silicide, or nickel silicide).

In some example embodiments, the semiconductor memory device may include gap structures 173, which are provided between the bit lines BL. Each of the gap structures 173 may be surrounded by first and second line insulating patterns 171 and 175.

The gap structures 173 may be extended to be parallel to the second direction D2. The gap structures 173 may be provided in the first and second line insulating patterns 171 and 175 and may have top surfaces that are located at a level lower than top surfaces of the bit lines BL.

In some example embodiments, the gap structures 173 may be formed of a conductive material, in which an air gap or void is formed. In some example embodiments, the gap structures 173 may be air gaps surrounded by the first and second line insulating patterns 171 and 175 (also referred to herein as first and second line insulating layers, respectively). The gap structures 173 may reduce a coupling noise between the bit lines BL, which are adjacent to each other.

As an example, the gap structures 173 may be shielding lines, which are formed of a conductive material and are extended from the cell array region CAR to the peripheral circuit region PCR, and each of the shielding lines may have an end portion 174 located in the peripheral circuit region PCR.

Figure 3A:
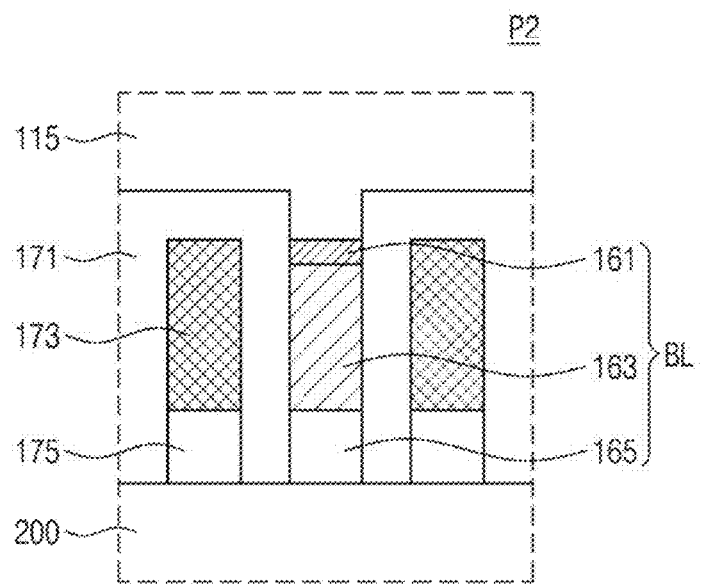
FIGS. 3A, 3B, 3C, 3D, 3E, and 3F are enlarged sectional views illustrating a portion 'P2' of FIG. 1C.
Figure 3B:
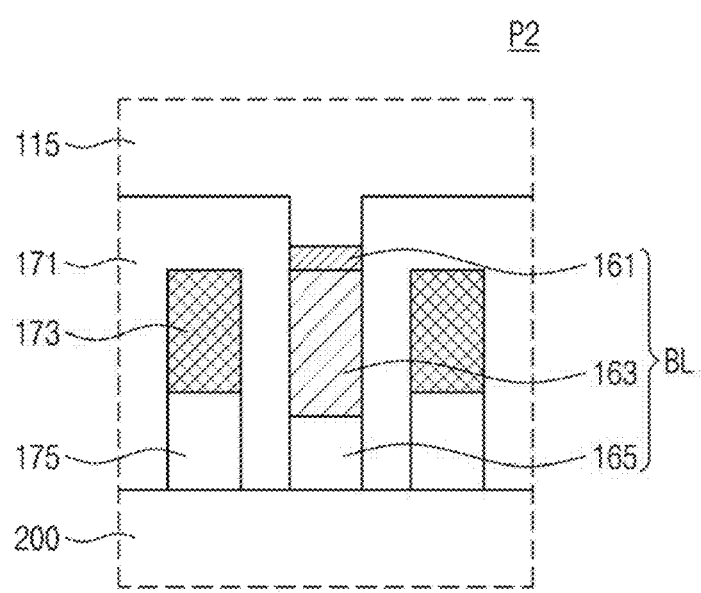
Figure 3C:
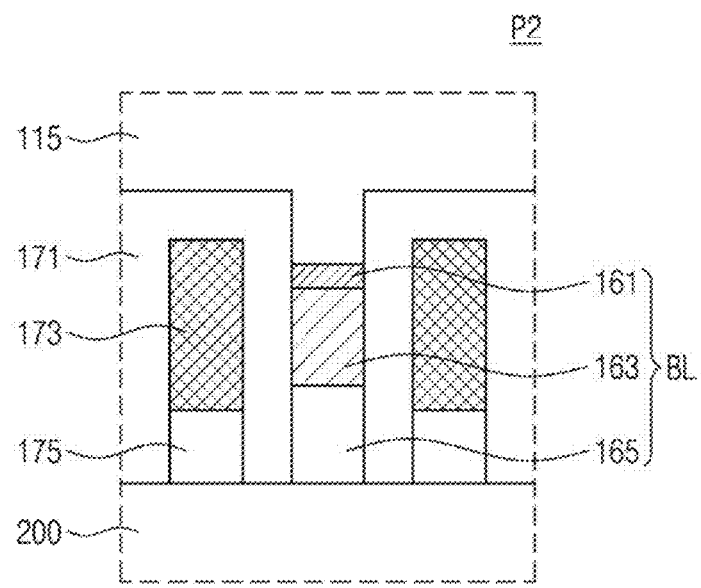
Figure 3D:
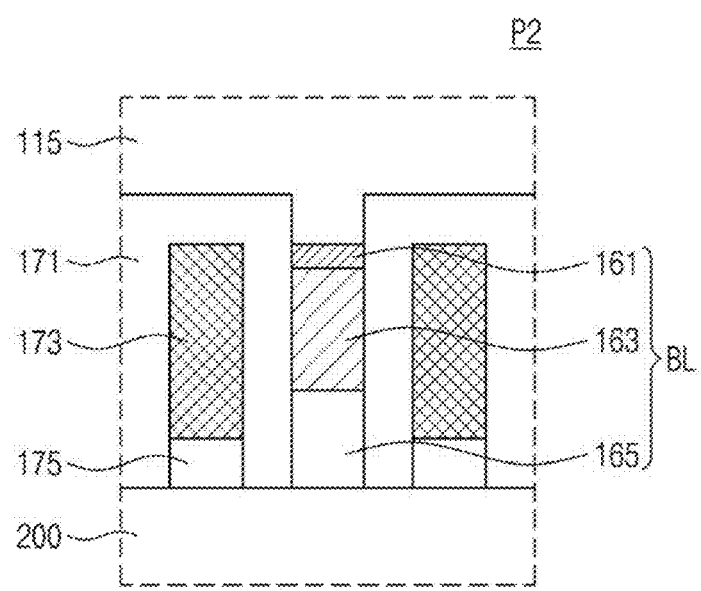
Figure 3E:
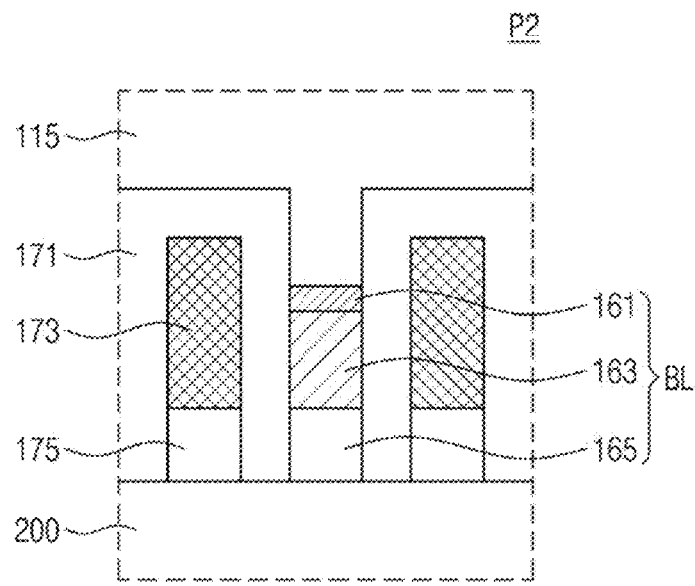
Figure 3F:
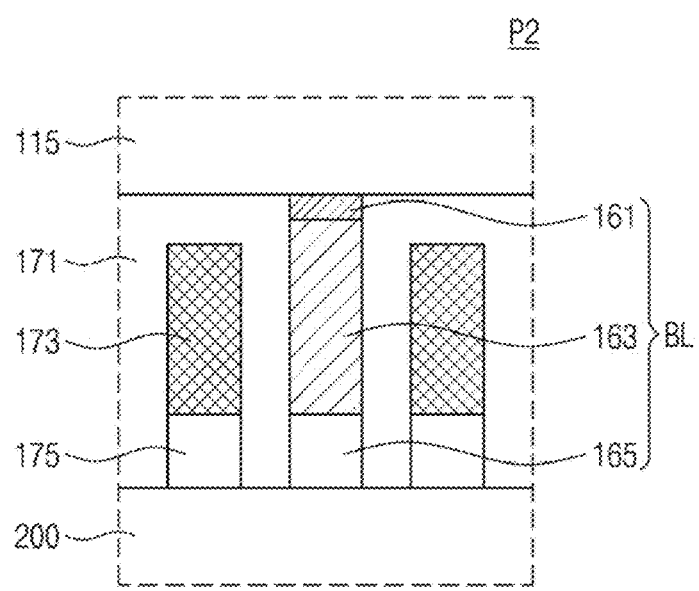

In detail, referring to FIG. 3A, a bottom surface of the gap structure 173 may be located at substantially the same level as a bottom surface of the metal pattern 163 of the bit line BL (i.e., an interface between the metal pattern 163 and the hard mask pattern 165). That is, a height of the gap structures 173 may be substantially equal to a height of the bit lines BL, when measured in a vertical direction. In some example embodiments, referring to FIGS. 3B to 3F, the height of the gap structures 173 may be different from the height of the bit lines BL, when measured in the vertical direction. As an example, referring to FIG. 3B, the height of the gap structures 173 may be smaller than the height of the bit lines BL, when measured in the vertical direction. Referring to FIG. 3C, the height of the gap structures 173 may be larger than the height of the bit lines BL, when measured in the vertical direction. The bottom surface of the metal pattern 163 may be located at a level different from the bottom surface of the gap structure 173. In addition, a top surface of the metal pattern 163 and a top surface of the gap structure 173 may be located at different levels. Referring to FIG. 3D, the bottom surface of the metal pattern 163 may be located at a level different from the bottom surface of the gap structure 173, and the top surface of the metal pattern 163 may be located at substantially the same level as the top surface of the gap structure 173. In some example embodiments, as shown in FIG. 3E, the bottom surface of the metal pattern 163 may be located at substantially the same level as the bottom surface of the gap structure 173, and the top surface of the metal pattern 163 may be located at a level different from the top surface of the gap structure 173. Referring to FIG. 3F, a top surface of the bit line BL may be located at substantially the same level as an interface between a first line insulating pattern 171 and a back-gate capping pattern 115.

In the present specification, the term 'level', 'vertical level', 'depth', 'height', or the like may mean a vertical height (e.g., vertical distance) measured from a reference location (e.g., the upper surface 200s of the substrate 200) in a direction perpendicular to the plane or surface at the reference location (e.g., a vertical direction perpendicular to the upper surface 200s of the substrate 200). For example, where elements (e.g., surfaces) are described herein to be at different levels, it will be understood that the respective distances of the elements element from the reference location (e.g., the upper surface 200s of the substrate 200) in the vertical direction may be different from each other. In another example, where a level of a first element is described herein to be lower, less, or smaller than a level of a second element, it will be understood that the distance of the first element from the reference location (e.g., the upper surface 200s of the substrate 200) in the vertical direction may be smaller than the distance of the second element from the reference location in the vertical direction. In another example, where a level of a first element is described herein to be higher, larger, or greater than a level of a second element, it will be understood that the distance of the first element from the reference location (e.g., the upper surface 200s of the substrate 200) in the vertical direction may be greater than the distance of the second element from the reference location in the vertical direction. In another example, where a level of a first element is described herein to be the same or substantially the same as a level of a second element, it will be understood that the distance of the first element from the reference location (e.g., the upper surface 200s of the substrate 200) in the vertical direction may be the same or substantially the same as the distance of the second element from the reference location in the vertical direction. In some example embodiments, a 'height' of an element may refer to a dimension of the element in the vertical direction (e.g., length of the element between opposing top/bottom surfaces of the element in the vertical direction). The vertical direction as described herein may be perpendicular to the first and second directions D1 and D2.

Referring back to FIGS. 1A, 1B, and 1C, first and second active patterns AP1 and AP2 may be alternately disposed in the second direction D2 on each of the bit lines BL, for example such that the first and second active patterns AP1 and AP2 are on the bit lines BL in an alternating arrangement which alternates in the second direction D2 between the first and second active patterns AP1 and AP2. The first active patterns AP1 may be spaced apart from each other in the first direction D1 by a specific distance, and the second active patterns AP2 may be spaced apart from each other in the first direction D1 by a specific distance. In other words, the first and second active patterns AP1 and AP2 may be two-dimensionally arranged in the first and second directions D1 and D2 that are not parallel to each other.

In some example embodiments, the first and second active patterns AP1 and AP2 may be formed of a single-crystalline semiconductor material. For example, the first and second active patterns AP1 and AP2 may be formed of single-crystalline silicon. In the case where the first and second active patterns AP1 and AP2 are formed of the single-crystalline semiconductor material, it may be possible to reduce a leakage current during an operation of the semiconductor memory device.

Each of the first and second active patterns AP1 and AP2 may have a length in the first direction D1, a width in the second direction D2, and a height in a direction perpendicular to the first and second directions D1 and D2. Each of the first and second active patterns AP1 and AP2 may have a substantially uniform width. For example, each of the first and second active patterns AP1 and AP2 may have substantially the same width on first and second surfaces S1 and S2.

The width of the first and second active patterns AP1 and AP2 may range from several nanometers to several tens of nanometers. For example, the width of the first and second active patterns AP1 and AP2 may range from about 1 nm to 30 nm (in particular, from about 1 nm to 10 nm). As shown in at least FIG. 1A, a length of each of the first and second active patterns AP1 and AP2 in the first direction D1 may be larger (e.g., greater) than a line width of the bit line BL (e.g., a bit line width of the bit line BL) in the first direction D1.

Figure 2A:
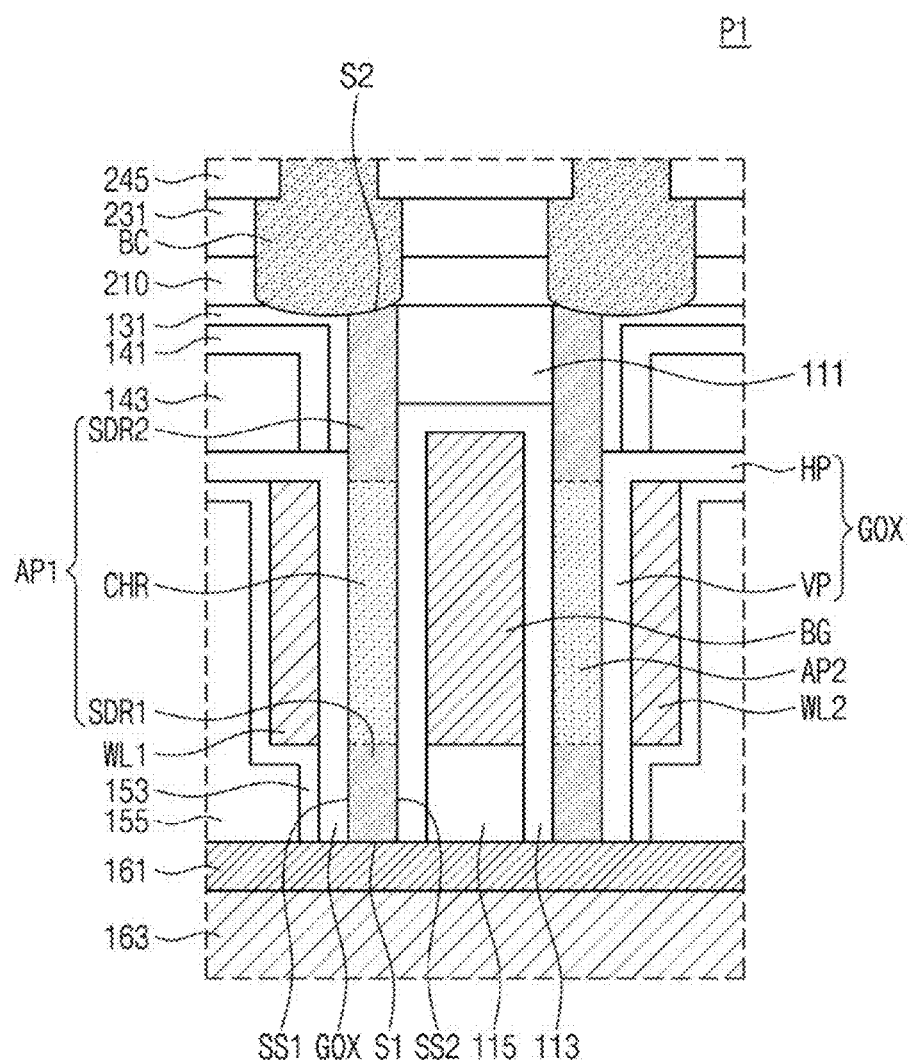
FIGS. 2A, 2B, 2C, 2D, 2E, 2F, 2G, 2H, and 2I are enlarged sectional views illustrating a portion 'P1' of FIG. 1B.

Referring to FIG. 2A, each of the first and second active patterns AP1 and AP2 may have a first surface S1 and a second surface S2, which are opposite to each other in a direction perpendicular to the first and second directions D1 and D2. For example, the first surfaces S1 of the first and second active patterns AP1 and AP2 may be in contact with the poly-silicon pattern 161 of the bit line BL, and in the case where the poly-silicon pattern 161 (also referred to herein as a poly-silicon layer) is omitted, the first surfaces S1 may be in contact with the metal pattern 163.

Each of the first and second active patterns AP1 and AP2 may have a first side surface SS1 and a second side surface SS2, which are opposite to each other in the second direction D2. The first side surface SS1 of the first active pattern AP1 may be adjacent to a first word line WL1, and the second side surface SS2 of the second active pattern AP2 may be adjacent to a second word line WL2. Accordingly, the first word lines WL1 may be adjacent to separate, respective first active patterns AP1, and the second word lines WL2 may be adjacent to separate, respective second active patterns AP2.

Each of the first and second active patterns AP1 and AP2 may include a first dopant region SDR1 adjacent to the bit line BL, a second dopant region SDR2 adjacent to a contact pattern BC, and a channel region CHR between the first and second dopant regions SDR1 and SDR2. The first and second dopant regions SDR1 and SDR2 may be portions of the first and second active patterns AP1 and AP2 doped with impurities, and a doping concentration in the first and second active patterns AP1 and AP2 may be higher than a doping concentration in the channel region CHR.

During the operation of the semiconductor memory device, the channel regions CHR of the first and second active patterns AP1 and AP2 may be controlled by the first and second word lines WL1 and WL2 and back-gate electrodes BG.

In detail, the back-gate electrodes BG may be disposed on the bit lines BL to be spaced apart from each other in the second direction D2 by a specific distance. The back-gate electrodes BG may be extended in the first direction D1 to cross the bit lines BL.

Each of the back-gate electrodes BG may be disposed between the first and second active patterns AP1 and AP2, which are adjacent to each other in the second direction D2. That is, the first active pattern AP1 may be disposed at a side of each of the back-gate electrodes BG, and the second active pattern AP2 may be disposed at an opposite side of each of the back-gate electrodes BG. When measured in the vertical direction, the back-gate electrodes BG may have a height, which is smaller than the height of the first and second active patterns AP1 and AP2.

In more detail, referring to FIG. 2A, the back-gate electrode BG may have a first surface and a second surface, which are placed near the bit line BL and the contact pattern BC, respectively. For example, the back-gate electrode BG may have a bottom surface (e.g., first surface) that is proximate to the bit line BL and a top surface (e.g., second surface) that is proximate to at least one contact pattern BC. The first and second surfaces of the back-gate electrode BG may be vertically spaced apart from the first and second surfaces S1 and S2 of the first and second active patterns AP1 and AP2.

In some example embodiments, the back-gate electrodes BG may be formed of or include at least one of doped poly-silicon, conductive metal nitride materials (e.g., titanium nitride and tantalum nitride), metallic materials (e.g., tungsten, titanium, and tantalum), conductive metal silicide materials, conductive metal oxide materials, or combinations thereof.

During the operation of the semiconductor memory device, a negative voltage may be applied to the back-gate electrodes BG, and in this case, a threshold voltage of the vertical channel transistor may be increased. That is, it may be possible to reduce, minimize, or prevent a leakage current property of the vertical channel transistor from being deteriorated by a reduction of the threshold voltage of the vertical channel transistor, which occurs when the vertical channel transistor is scaled down.

A first insulating pattern 111 may be disposed between the first and second active patterns AP1 and AP2, which are adjacent to each other in the second direction D2. The first insulating pattern 111 may be disposed between the second dopant regions SDR2 of the first and second active patterns AP1 and AP2. The first insulating pattern 111 may be extended in the first direction D1 to be parallel to the back-gate electrodes BG. A distance between the second surfaces of the first and second active patterns AP1 and AP2 and the back-gate electrode BG may vary depending on a thickness of the first insulating pattern 111. In some example embodiments, the first insulating pattern 111 may be formed of or include at least one of silicon oxide, silicon oxynitride, or silicon nitride.

A back-gate insulating pattern 113 may be disposed between the back-gate electrode BG and the first and second active patterns AP1 and AP2 and between the back-gate electrode BG and the first insulating pattern 111. The back-gate insulating pattern 113 may include vertical portions, which are provided to cover opposite side surfaces of the back-gate electrode BG, and a horizontal portion, which is provided to connect the vertical portions to each other. The horizontal portion of the back-gate insulating pattern 113 may be closer to the contact pattern BC than the bit line BL and may cover the second surface of the back-gate electrode BG.

In some example embodiments, the back-gate insulating pattern 113 may be formed of or include at least one of silicon oxide, silicon oxynitride, high-k dielectric materials having dielectric constants higher than silicon oxide, or combinations thereof.

The back-gate capping pattern 115 may be disposed between the bit lines BL and the back-gate electrode BG. The back-gate capping pattern 115 may be formed of an insulating material, and a bottom surface of the back-gate capping pattern 115 may be in contact with the poly-silicon pattern 161 of the bit lines BL. The back-gate capping pattern 115 may be disposed between the vertical portions of the back-gate insulating pattern 113. A thickness of the back-gate capping pattern 115 between the bit lines BL may be different from a thickness of the back-gate capping pattern 115 on the bit lines BL.

The first and second word lines WL1 and WL2 may be extended in the first direction D1 on the bit lines BL and may be alternately arranged in the second direction D2.

The first word line WL1 may be disposed at a side of the first active pattern AP1, and the second word line WL2 may be disposed at an opposite side of the second active pattern AP2. For example, as shown in at least FIG. 1B, the first word line WL1 may be disposed at a first side of the first active pattern AP1 (e.g., a left side as shown in FIG. 1B) such that the first active pattern AP1 is between the first word line WL1 and the back-gate electrode BG that is itself between the first and second active patterns AP1 and AP2 in the second direction D2, and the second word line WL2 may be at an opposite, second side of the second active pattern AP2 (e.g., a right side as shown in FIG. 1B) such that the second active pattern AP2 is between the second word line WL2 and the back-gate electrode BG that is itself between the first and second active patterns AP1 and AP2 in the second direction D2. Accordingly, the first and second active patterns AP1 and AP2 may be between the first and second word lines WL1 and WL2 in the second direction D2. The first and second word lines WL1 and WL2 may be vertically spaced apart from the bit lines BL and the contact patterns BC. In other words, the first and second word lines WL1 and WL2 may be located between the bit lines BL and the contact patterns BC, when viewed in a vertical sectional view.

The first and second word lines WL1 and WL2 may have a width in the second direction D2, and here, the width on the bit line BL may be different from the width on the gap structure 173. Portions of the first word lines WL1 may be disposed between the first active patterns AP1, which are adjacent to each other in the first direction D1, and portions of the second word lines WL2 may be disposed between the second active patterns AP2, which are adjacent to each other in the first direction D1.

In some example embodiments, the first and second word lines WL1 and WL2 may be formed of or include at least one of doped poly-silicon, metallic materials, conductive metal nitride materials, conductive metal silicide materials, conductive metal oxide materials, or combinations thereof.

The first and second word lines WL1 and WL2, which are adjacent to each other, may have side surfaces facing each other. Each of the first and second word lines WL1 and WL2 may have a first surface and a second surface, which are placed near (e.g., proximate to) the bit line BL and the contact pattern BC, respectively. For example, each of the first and second word lines WL1 and WL2 may have a bottom surface (e.g., first surface) that is proximate to the bit line BL and a top surface (e.g., second surface) that is proximate to at least one contact pattern BC.

Figure 2B:
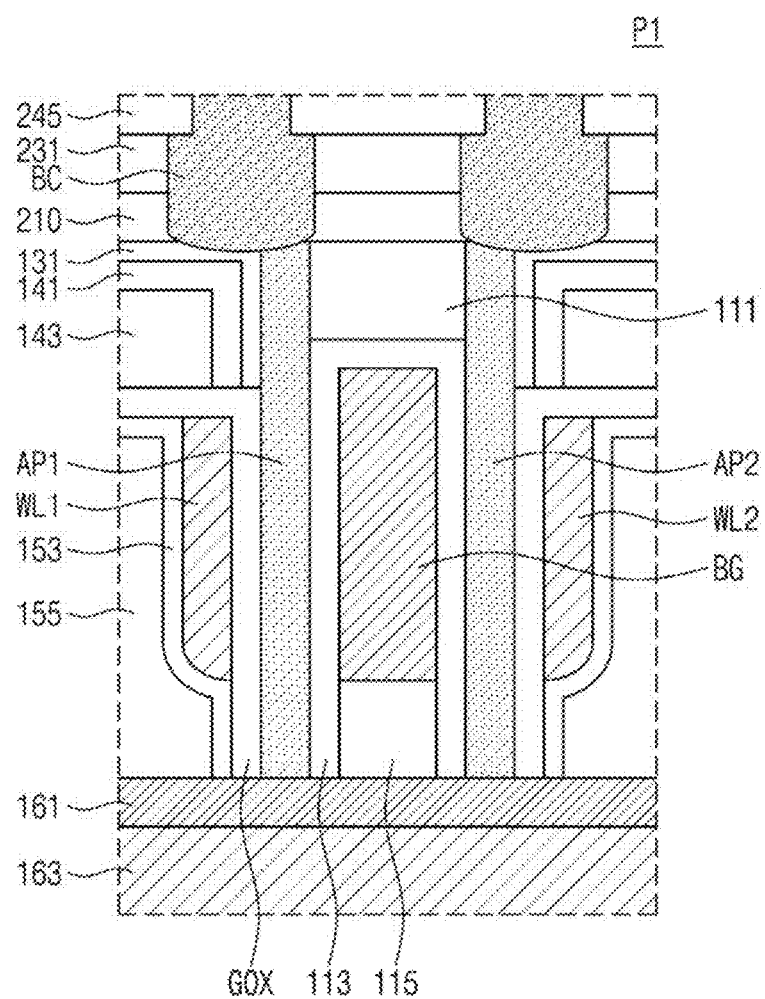
Figure 2C:
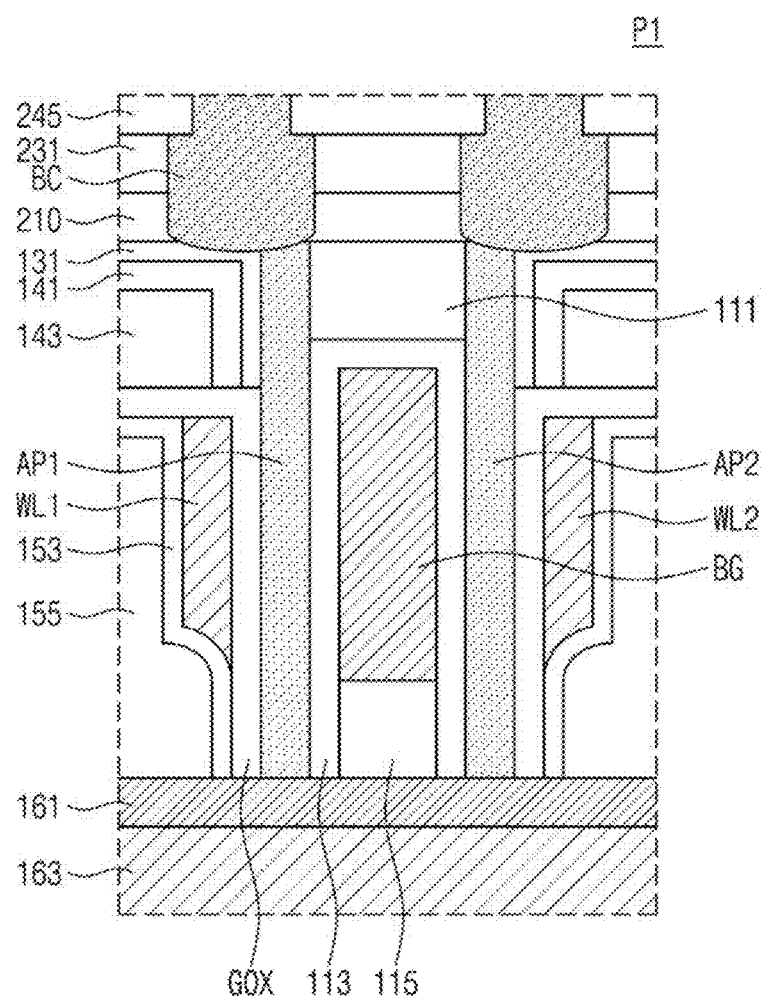

Referring to FIGS. 2B and 2C, the first surfaces of the first and second word lines WL1 and WL2 may have various shapes. Referring to FIG. 2B, each of the first and second word lines WL1 and WL2 may have a spacer-like shape. For example, the first surfaces of the first and second word lines WL1 and WL2 may have a rounded shape. Referring to FIG. 2C, the first surfaces of the first and second word lines WL1 and WL2 may have a recessed shape.

Figure 2D:
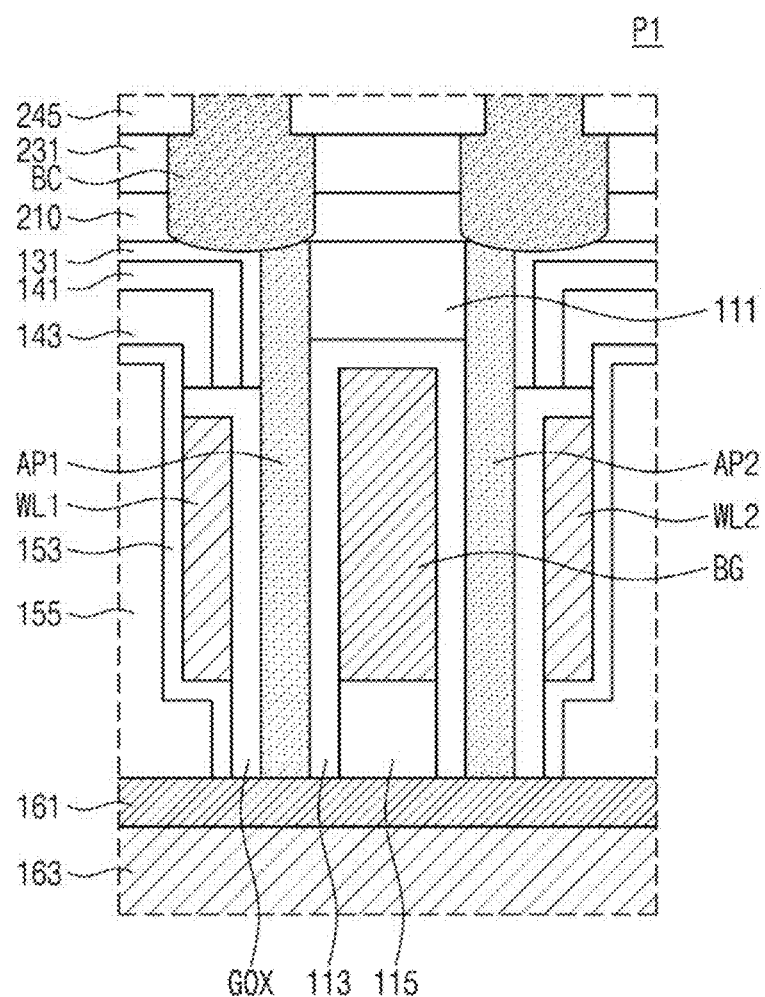
Figure 2E:
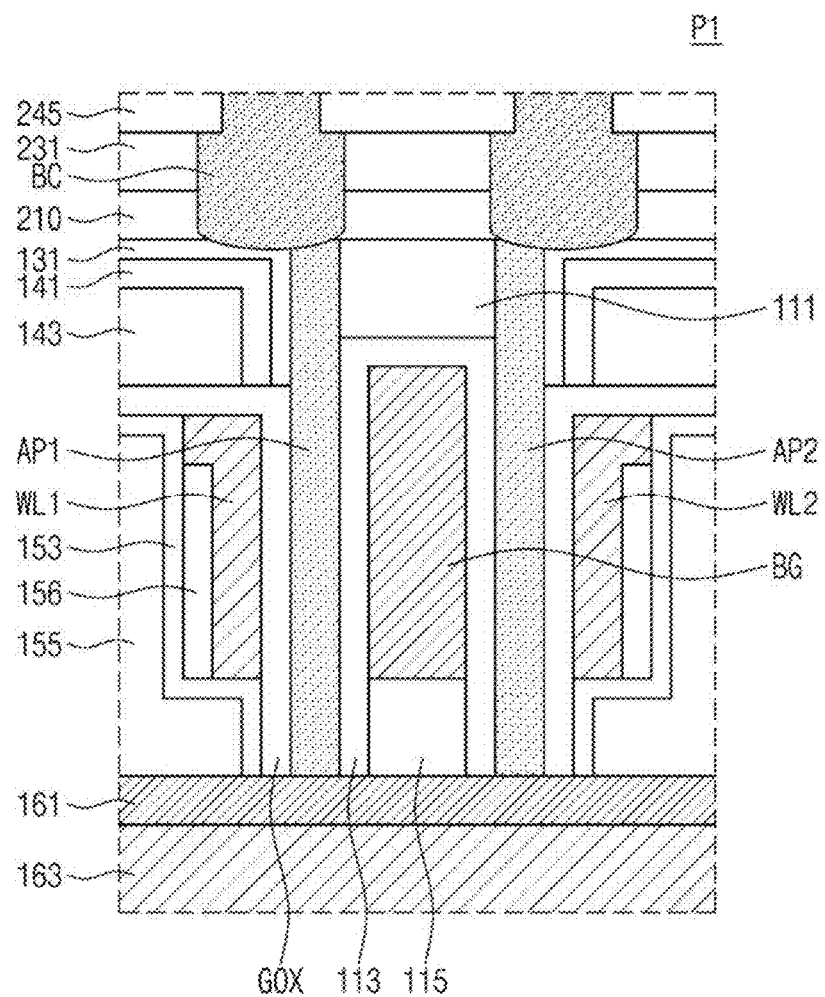

Referring to FIG. 2E, each of the first and second word lines WL1 and WL2 may have an L-shaped section. In other words, each of the first and second word lines WL1 and WL2 may include a vertical portion, which is adjacent to the first and second active patterns AP1 and AP2, and a horizontal portion, which protrudes from the vertical portion in a horizontal direction (i.e., the second direction D2).

The first and second word lines WL1 and WL2 may have a height that is smaller than the height of the first and second active patterns AP1 and AP2, when measured in the vertical direction. The height of the first and second word lines WL1 and WL2 may be equal to or smaller than the height of the back-gate electrodes BG, when measured in the vertical direction.

Referring to FIGS. 2A to 2I, the first and second word lines WL1 and WL2 may each be located at a level (e.g., a particular level) that is different from the back-gate electrodes BG, when measured in the vertical direction. For example, as shown, each of the first and second word lines WL1 and WL2 and the back-gate electrode BG may have a bottom surface (e.g., substrate-proximate surface) that is close to (e.g., proximate to) to the bit line BL and a top surface (e.g., substrate-distal surface) that is proximate to at least one contact pattern BC of the contact patterns BC. The respective bottom surfaces (e.g., substrate-proximate surfaces) of the first and second word lines WL1 and WL2 may be located at a level that is different from a level of the bottom surface (e.g., substrate-proximate surface) of the back-gate electrode BG. The respective top surfaces (e.g., substrate-distal surfaces) of the first and second word lines WL1 and WL2 may be located at a level that is different from a level of the top surface (e.g., substrate-distal surface) of the back-gate electrode BG.

Referring to FIGS. 2A to 2E, the second surfaces of the first and second word lines WL1 and WL2 may be located at a level different from the second surfaces of the back-gate electrodes BG. Referring to FIGS. 2F, 2G, 2H, and 2I, the first surfaces of the first and second word lines WL1 and WL2 may be located at a level different from the first surfaces of the back-gate electrodes BG.

Figure 2F:
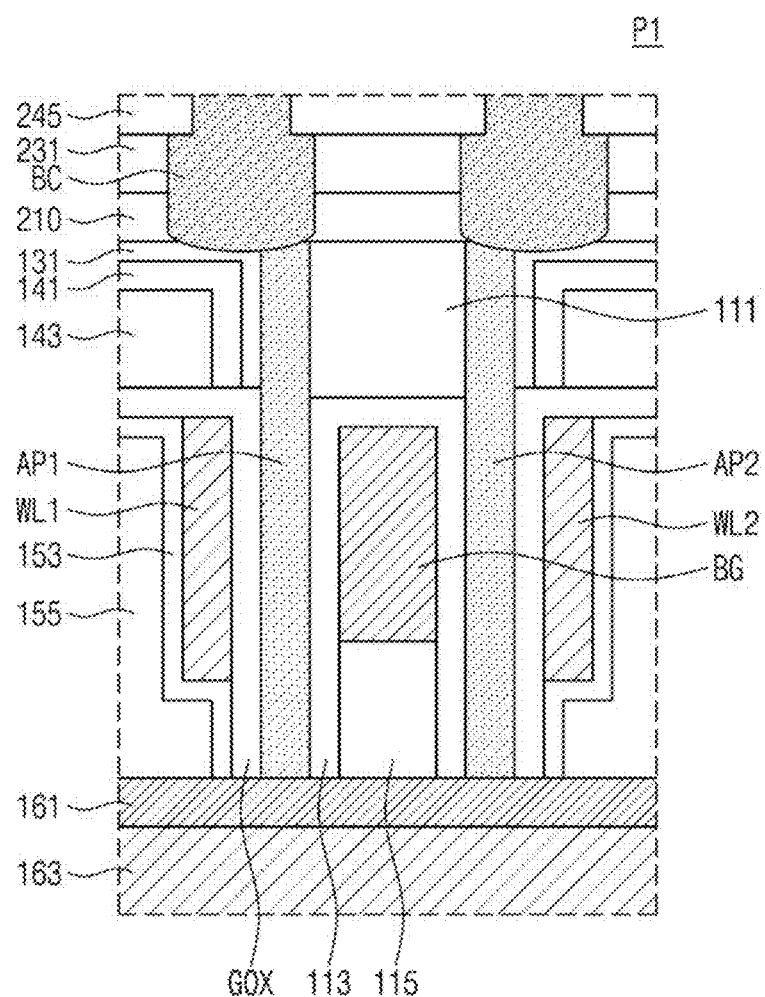

Referring to FIG. 2F, the first surfaces of the first and second word lines WL1 and WL2 may be closer to the bit line BL than the first surface of the back-gate electrode BG. In other words, a distance from the bit line BL to the first and second word lines WL1 and WL2 may be smaller than a distance from the bit line BL to the back-gate electrode BG.

Figure 2G:
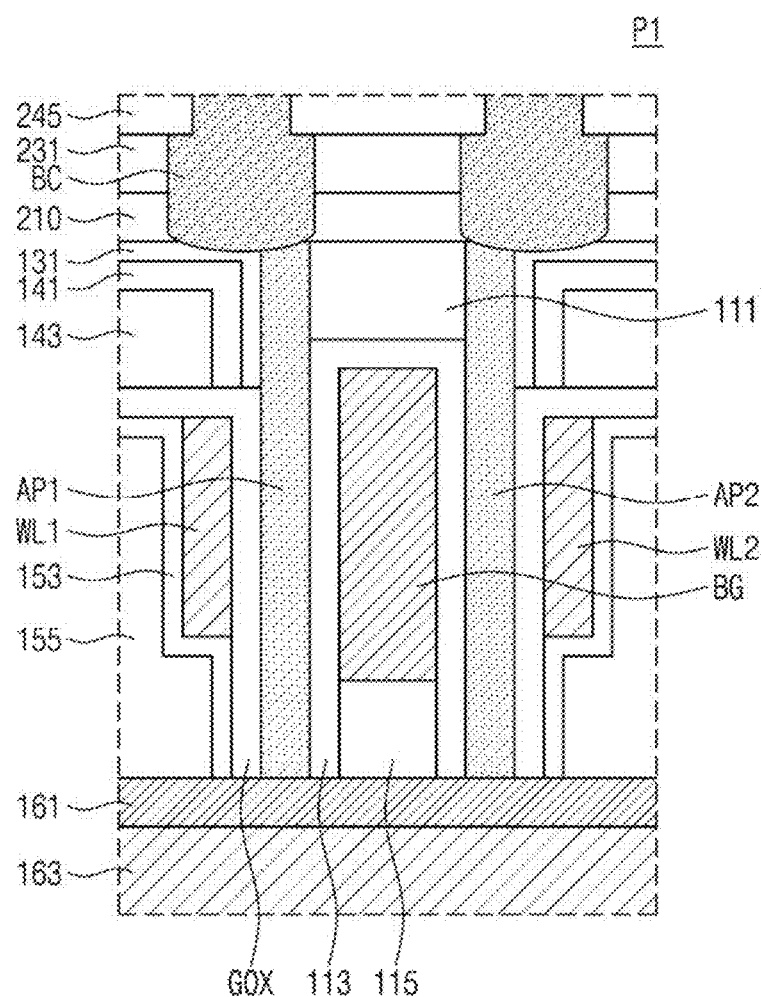

Referring to FIG. 2G, the height of the first and second word lines WL1 and WL2 may be smaller than the height of the back-gate electrodes BG, when measured in the vertical direction. The first surface of the back-gate electrode BG may be closer to the bit line BL than the first surfaces of the first and second word lines WL1 and WL2, and the second surface of the back-gate electrode BG may be closer to the contact pattern BC than the second surfaces of the first and second word lines WL1 and WL2.

Figure 2H:
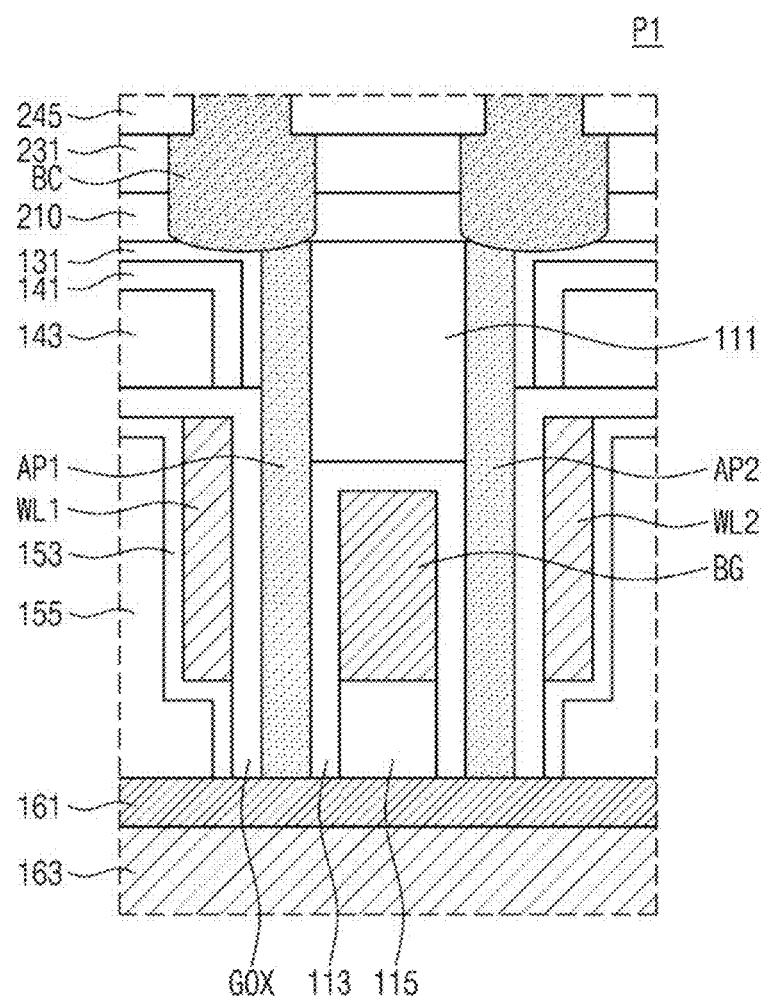

Referring to FIG. 2H, the height of the first and second word lines WL1 and WL2 may be larger than the height of the back-gate electrodes BG, when measured in the vertical direction. The second surfaces of the first and second word lines WL1 and WL2 may be closer to the contact pattern BC than the second surface of the back-gate electrode BG.

Figure 2I:
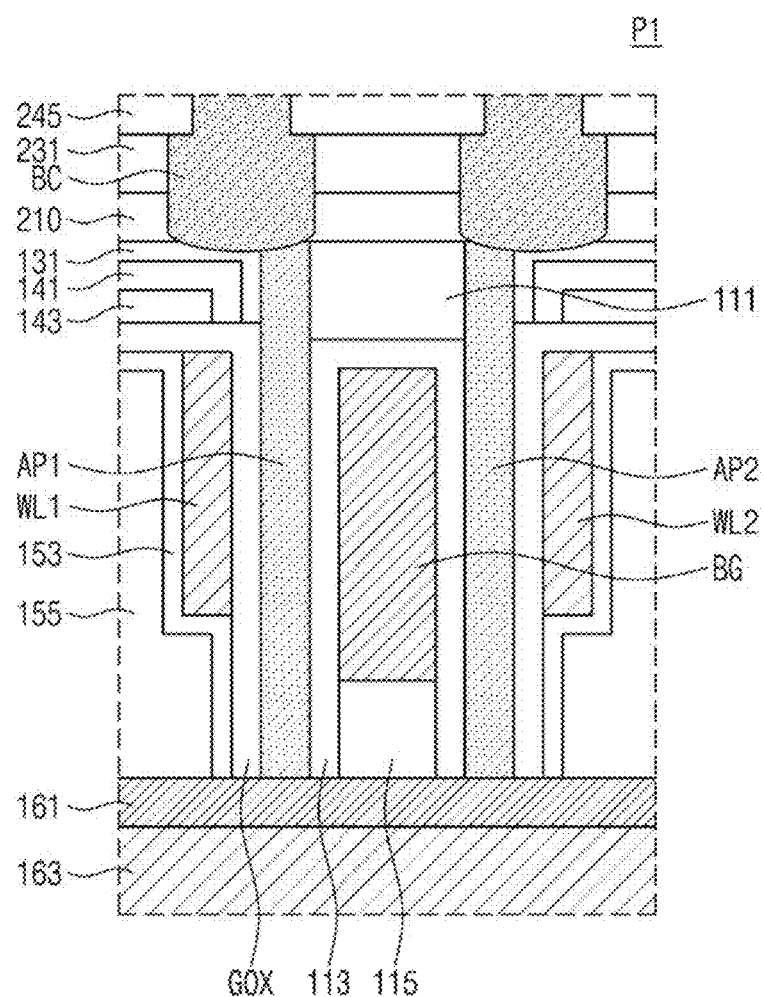

Referring to FIG. 2I, a distance from the bit line BL to the first and second word lines WL1 and WL2 may be larger than a distance from the bit line BL to the back-gate electrode BG.

Gate insulating patterns GOX may be disposed between the first and second word lines WL1 and WL2 and the first and second active patterns AP1 and AP2. The gate insulating patterns GOX may be extended in the first direction D1 to be parallel to the first and second word lines WL1 and WL2.

The gate insulating pattern GOX may be formed of or include at least one of silicon oxide, silicon oxynitride, high-k dielectric materials having dielectric constants higher than silicon oxide, or combinations thereof. The high-k dielectric materials may include metal oxide materials or metal oxynitride materials. For example, the high-k dielectric materials for the gate insulating pattern GOX may include $HfO_2$, HfSiO, HfSiON, HfTaO, HfTiO, HfZrO, $ZrO_2$, $Al_2O_3$, or combinations thereof, but the inventive concepts are not limited to these examples.

Referring to FIG. 2A, the gate insulating pattern GOX may be provided to cover the first side surface of the first active pattern AP1 and the second side surface of the second active pattern AP2. The gate insulating pattern GOX may have a substantially uniform thickness. Each of the gate insulating patterns GOX may include a vertical portion VP, which is adjacent to the first and second active patterns AP1 and AP2 and which extends in a vertical direction that is perpendicular or substantially perpendicular to the first and second directions D1 and D2, and a horizontal portion HP, which protrudes from the vertical portion VP in the first direction D1.

In some example embodiments, a pair of the first and second word lines WL1 and WL2 may be disposed on the horizontal portion HP of each of the gate insulating patterns GOX.

In some example embodiments, as shown in FIG. 2D, each of the gate insulating patterns GOX may be provided to have substantially an L-shaped section. In this case, the gate insulating patterns GOX may be spaced apart from each other and may be disposed to have mirror symmetry.

A second insulating pattern 143 may be disposed between the horizontal portion HP of the gate insulating pattern GOX and the contact patterns BC. In some example embodiments, the second insulating pattern 143 may be formed of or include silicon oxide. First and second etch stop layers 131 and 141 may be disposed between the second dopant regions SDR2 of the first and second active patterns AP1 and AP2 and the second insulating pattern 143.

The first and second word lines WL1 and WL2 on the gate insulating pattern GOX may be spaced apart from each other by a third insulating pattern 155. The third insulating pattern 155 (also referred to herein as a third insulating layer) may be extended in the first direction D1, between the first and second word lines WL1 and WL2.

A first capping layer 153 may be disposed between the third insulating pattern 155 and the first and second word lines WL1 and WL2. The first capping layer 153 may have a substantially uniform thickness. Referring to FIG. 2E, the first and second word lines WL1 and WL2 may be at least partially spaced apart from the first capping layer 153 with an interposing insulating pattern 156 therebetween, said interposing insulating pattern 156 may have a same composition as any of the insulating layers or insulating patterns as described herein, including for example the third insulating pattern 155.

The contact patterns BC may be provided to penetrate an interlayer insulating layer 231 and an etch stop layer 210 and may be coupled to the first and second active patterns AP1 and AP2, respectively. In other words, the contact patterns BC may be coupled to the second dopant regions of the first and second active patterns AP1 and AP2, respectively. Restated, and as shown in at least FIG. 1B and FIGS. 2A to 2I, the contact patterns BC may be coupled to separate, respective active patterns of the first and second active patterns AP1 and AP2. A lower width of the contact pattern BC may be larger than an upper width thereof. Adjacent ones of the contact patterns BC may be spaced apart from each other by isolation insulating patterns 245. Each of the contact patterns BC may have one of various shapes (e.g., circular, elliptical, rectangular, square, diamond, and hexagonal shapes), when viewed in a plan view.

The contact patterns BC may be formed of or include at least one of doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concepts is not limited to this example.

Landing pads LP may be disposed on the contact patterns BC. Each of the landing pads LP may have one of various shapes (e.g., circular, elliptical, rectangular, square, diamond, and hexagonal shapes), when viewed in a plan view.

The isolation insulating patterns 245 may be disposed between the landing pads LP. The landing pads LP may be arranged in the first and second directions D1 and D2 to form a matrix-shaped arrangement, when viewed in a plan view. The landing pads LP may be provided to have top surfaces that are substantially coplanar with top surfaces of the isolation insulating patterns 245.

The landing pads LP may be formed of or include at least one of doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concepts is not limited to this example.

In some example embodiments, data storage patterns DSP may be disposed on the landing pads LP, respectively. The data storage patterns DSP may be electrically connected to the first and second active patterns AP1 and AP2, respectively. The data storage patterns DSP may be arranged in the first and second directions D1 and D2 to form a matrix-shaped arrangement, as shown in FIG. 1A. The data storage patterns DSP may be fully or partially overlapped with the landing pads LP. Each of the data storage patterns DSP may be in contact with the entire or partial region of the top surface of a corresponding one of the landing pads LP.

In some example embodiments, the data storage pattern DSP may be a capacitor and may include a storage electrode 251, a plate electrode 255, and a capacitor dielectric layer 253 therebetween. In this case, the storage electrode 251 may be in contact with the landing pad LP and may have one of various shapes (e.g., circular, elliptical, rectangular, square, diamond, and hexagonal shapes), when viewed in a plan view. The data storage patterns DSP may be fully or partially overlapped with the landing pads LP. Each of the data storage patterns DSP may be in contact with the entire or partial region of the top surface of a corresponding one of the landing pads LP.

In some example embodiments, the data storage pattern DSP may be a variable resistance pattern whose resistance can be switched to one of at least two states by an electric pulse applied thereto. For example, the data storage pattern DSP may be formed of or include at least one of phase-change materials whose crystal state can be changed depending on an amount of a current applied thereto, perovskite compounds, transition metal oxides, magnetic materials, ferromagnetic materials, or antiferromagnetic materials.

An upper insulating layer 270 may be disposed on the data storage patterns DSP, and cell contact plugs PLG may be provided to penetrate the upper insulating layer 270 and may be coupled to the plate electrode 255.

Furthermore, in some example embodiments, an active layer 110 may be disposed on the substrate 200 of the peripheral circuit region PCR. The active layer 110 may be formed of or include the same single-crystalline semiconductor material as the first and second active patterns AP1 and AP2 of the cell array region CAR. The active layer 110 may have a first surface, which is in contact with the substrate 200, and a second surface, which is opposite to the first surface. The first surface of the active layer 110 may be substantially coplanar with the first surfaces of the first and second active patterns AP1 and AP2.

Peripheral circuit transistors may be provided on the second surface of the active layer 110. In other words, a peripheral gate insulating layer 215 may be disposed on the second surface of the active layer 110, and a peripheral gate electrode PG may be disposed on the peripheral gate insulating layer 215. The peripheral gate electrode PG may include a peripheral conductive pattern 221, a peripheral metal pattern 223, and a peripheral hard mask pattern 225.

A device isolation layer STI may be disposed on the substrate 200 of the peripheral circuit region PCR to penetrate the active layer 110 and to be in contact with the substrate 200.

First peripheral contact plugs PCPa, PCPb, and PCPc may be provided to penetrate the device isolation layer STI and may be respectively coupled to the end portion of the bit line BL, an end portion of the gap structure 173, and the peripheral circuit transistors. The first peripheral contact plugs PCPa, PCPb, and PCPc may be connected to the peripheral circuit lines 241a, 241b, and 241c, respectively.

A peripheral circuit insulating layer 263 and the upper insulating layer 270 may be disposed on the peripheral circuit lines 241a, 241b, and 241c, for example as shown in at least FIG. 1C.

Second peripheral contact plugs PPLG may be provided to penetrate the peripheral circuit insulating layer 263 and the upper insulating layer 270 and may be coupled to the peripheral circuit lines 241a, 241b, and 241c, for example as shown in at least FIG. 1C.

Hereinafter, semiconductor memory devices according to some example embodiments of the inventive concepts will be described. In the following description, a previously described element may be identified by the same reference number without repeating an overlapping description thereof, for the sake of brevity.

Figure 4:
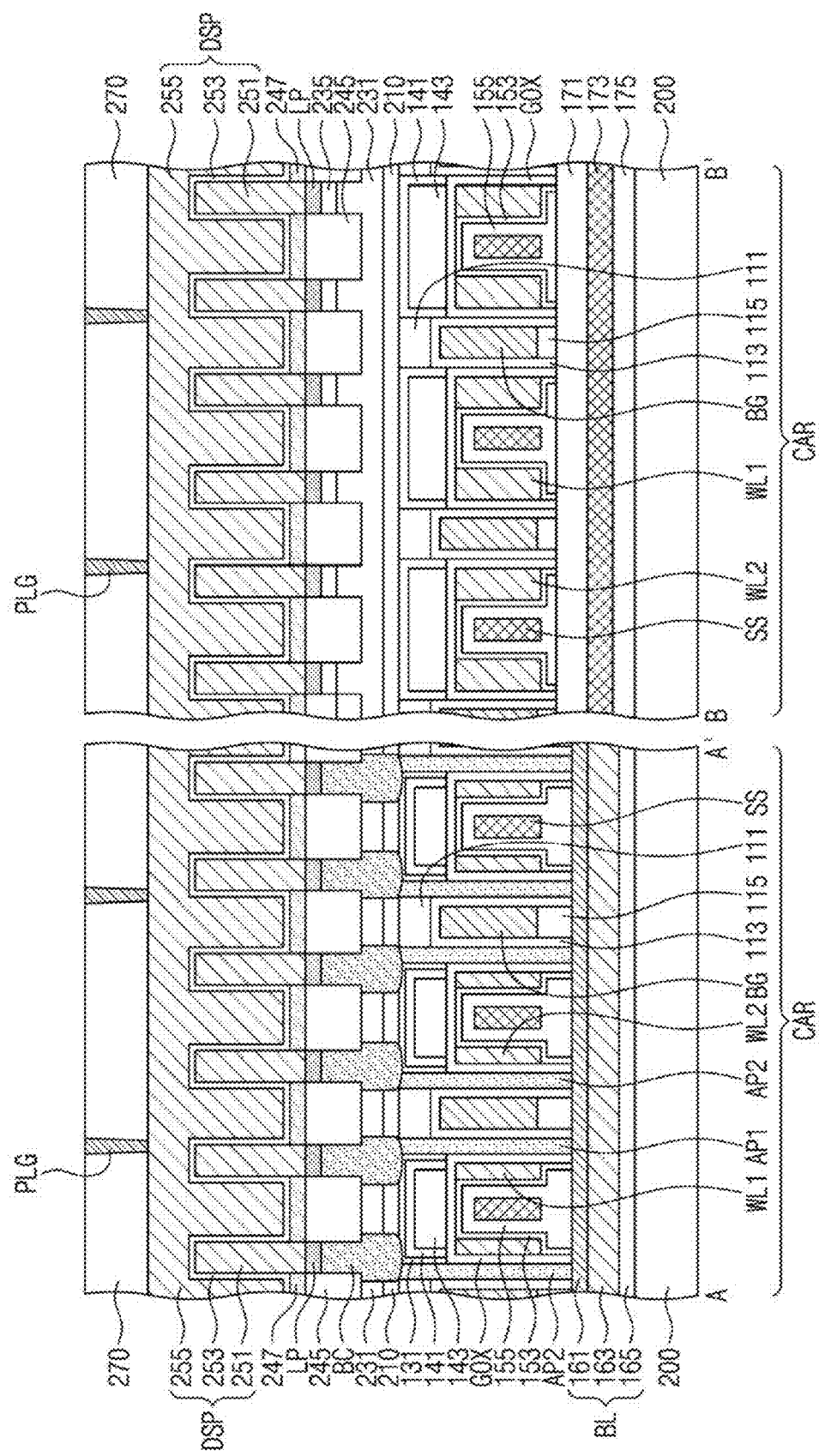
FIG. 4 is a sectional view, which is taken along the lines A-A' and B-B' of FIG. 1A to illustrate a semiconductor memory device according to some example embodiments of the inventive concepts.

FIG. 4 is a sectional view, which is taken along the lines A-A' and B-B' of FIG. 1A to illustrate a semiconductor memory device according to some example embodiments of the inventive concepts.

Referring to FIG. 4, a semiconductor memory device may include an intermediate structure SS, which is provided between the first and second word lines WL1 and WL2 that are adjacent to each other. The intermediate structure SS may be extended in the first direction D1 to be parallel to the first and second word lines WL1 and WL2. The intermediate structure SS may reduce a coupling noise between the first and second word lines WL1 and WL2, which are adjacent to each other.

The intermediate structure SS may be an air gap, which is surrounded by the third insulating pattern 155. In some example embodiments, the intermediate structure SS may be a shielding line, which is formed of a conductive material.

FIGS. 5, 6A, 6B, 6C, and 7 are plan views illustrating a semiconductor memory device according to some example embodiments of the inventive concepts.

Figure 5:
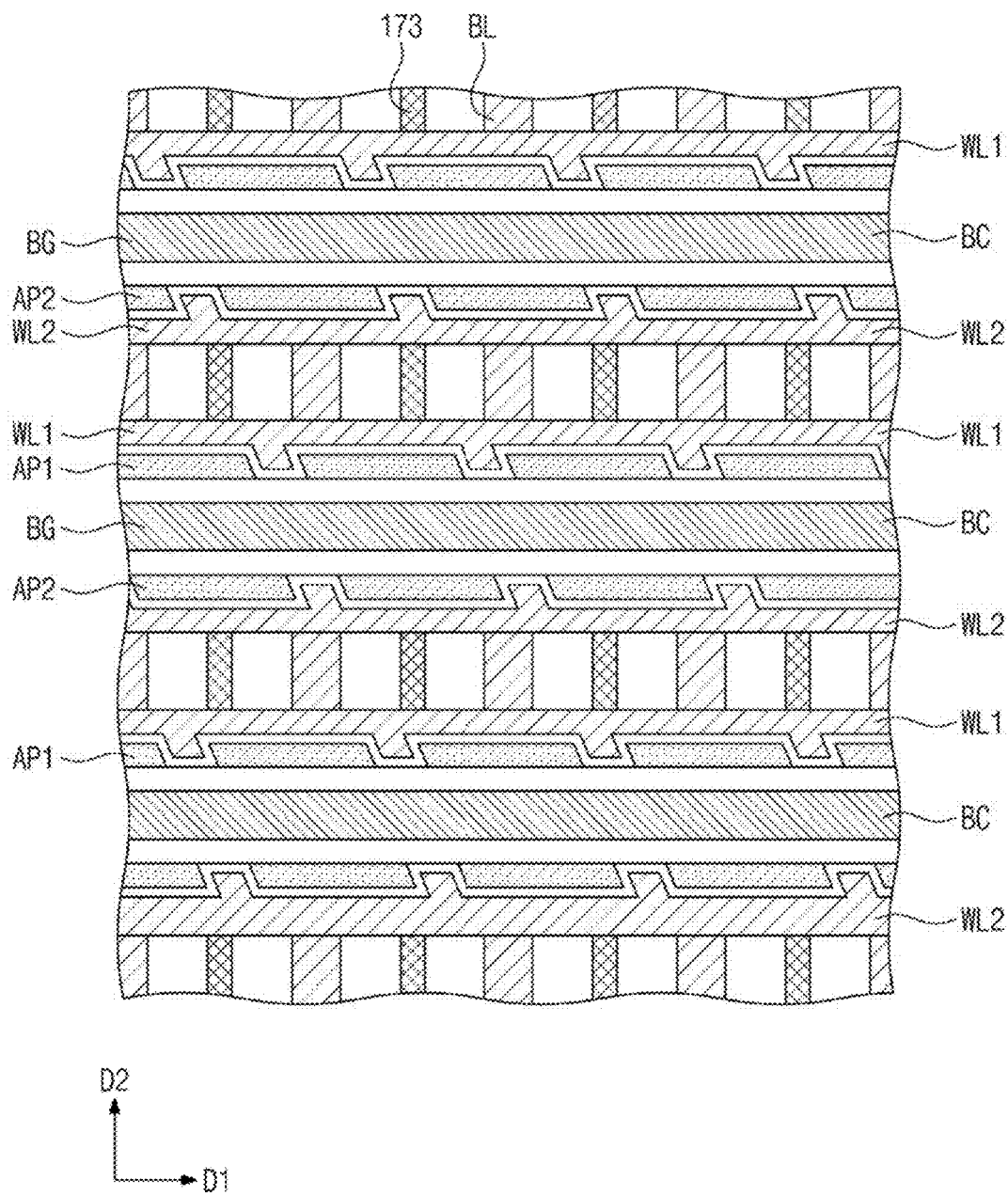
FIGS. 5, 6A, 6B, 6C, and 7 are plan views illustrating a semiconductor memory device according to some example embodiments of the inventive concepts.

In some example embodiments, including the example embodiments shown in FIG. 5, the first and second active patterns AP1 and AP2 may be alternately arranged in a direction diagonal to the first and second directions D1 and D2. Here, the diagonal direction may be parallel to a top surface of the substrate 200.

Each of the first and second active patterns AP1 and AP2 may have a parallelogram shape or a lozenge shape, when viewed in a plan view. Since the first and second active patterns AP1 and AP2 are disposed in the diagonal direction, it may be possible to reduce a coupling between the first and second active patterns AP1 and AP2 facing each other in the second direction D2.

Figure 6A:
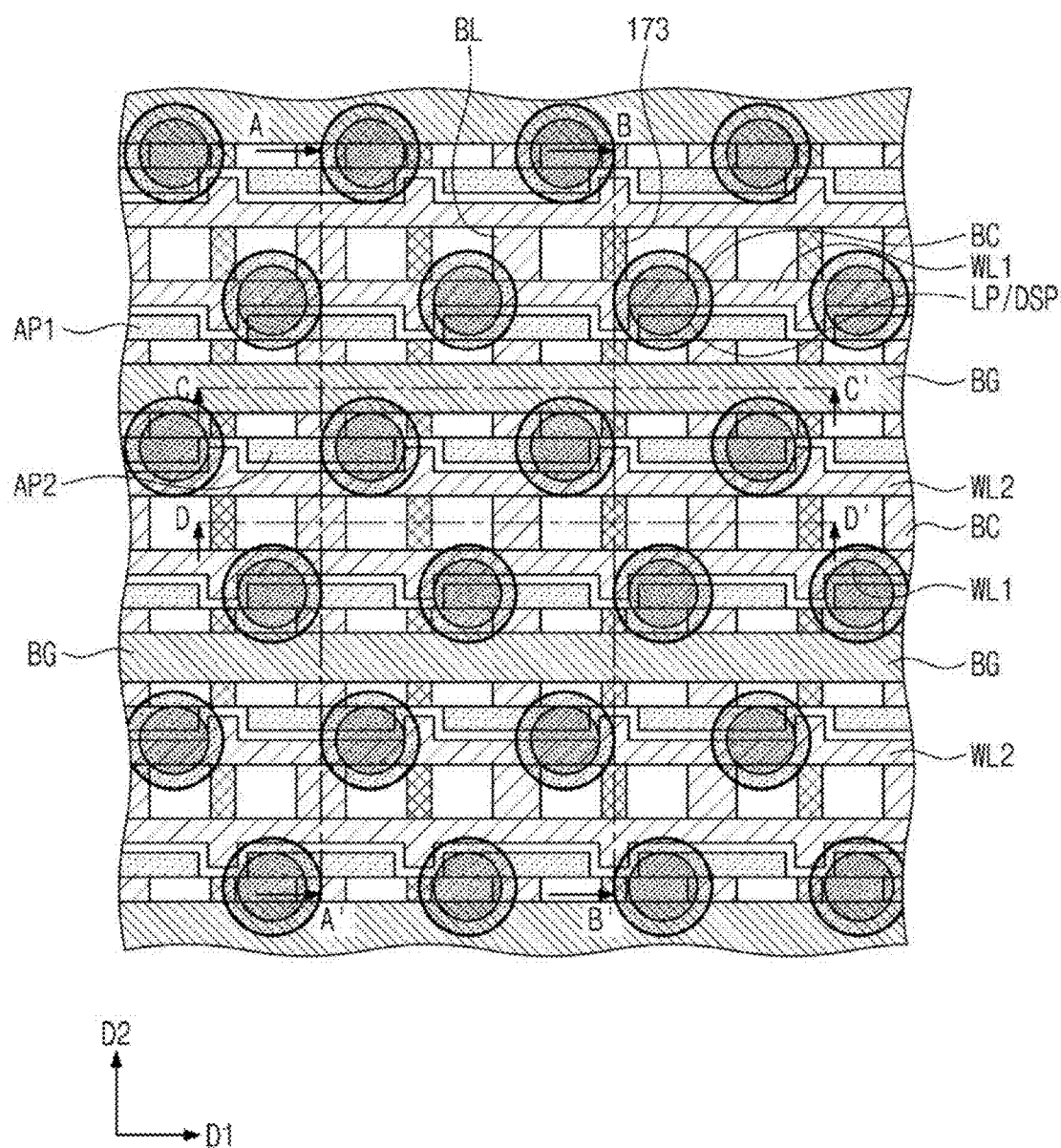

In some example embodiments, including the example embodiments shown in FIG. 6A, the landing pads LP and the data storage patterns DSP may be arranged in a zigzag or honeycomb shape, when viewed in a plan view.

Figure 6B:
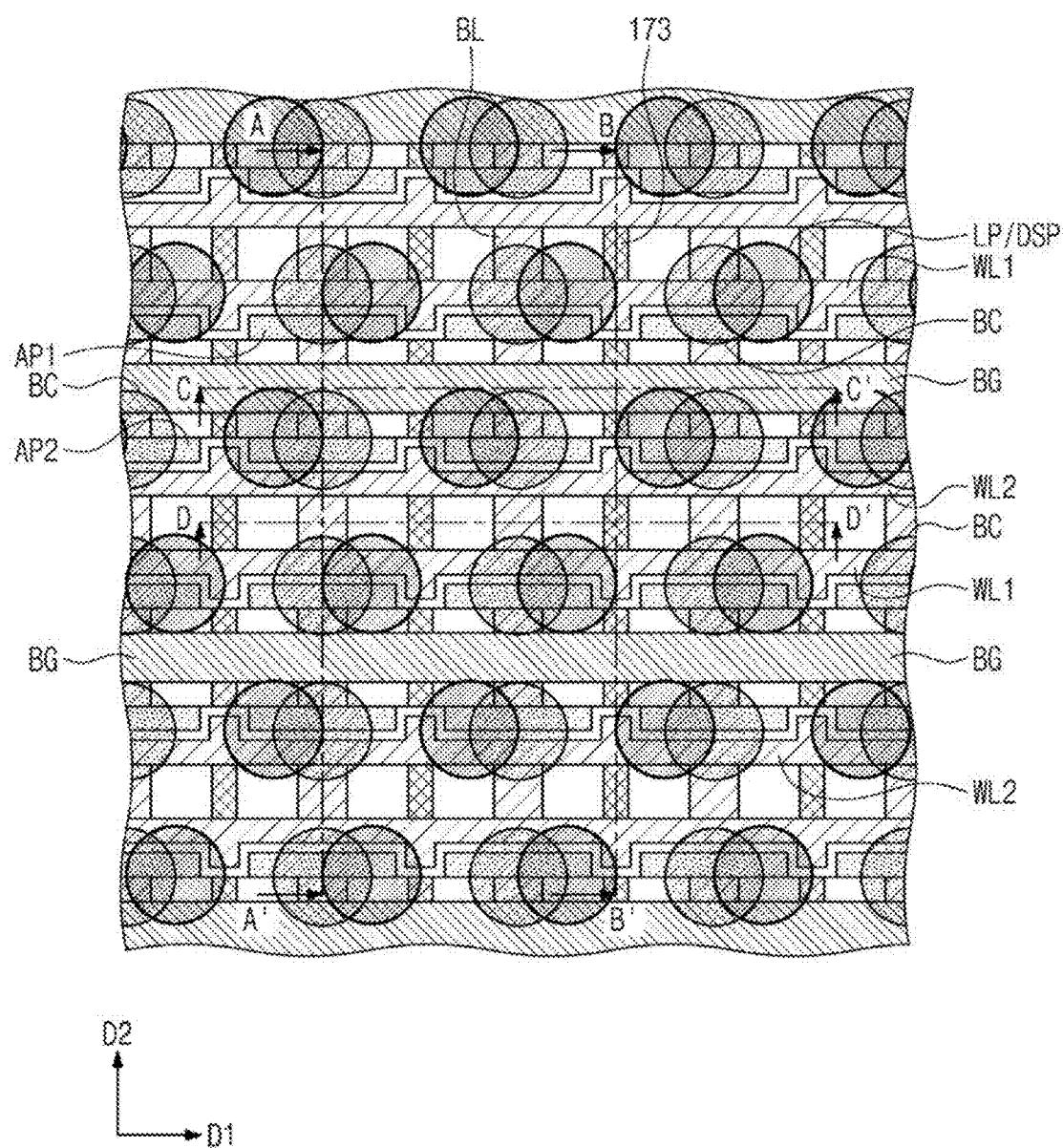

In some example embodiments, including the example embodiments shown in FIG. 6B, the data storage patterns DSP may be disposed to be offset from the landing pads LP, when viewed in a plan view (e.g., offset in the first direction D1 and/or the second direction D2). Each of the data storage patterns DSP may be in contact with a portion of the landing pad LP.

Figure 6C:
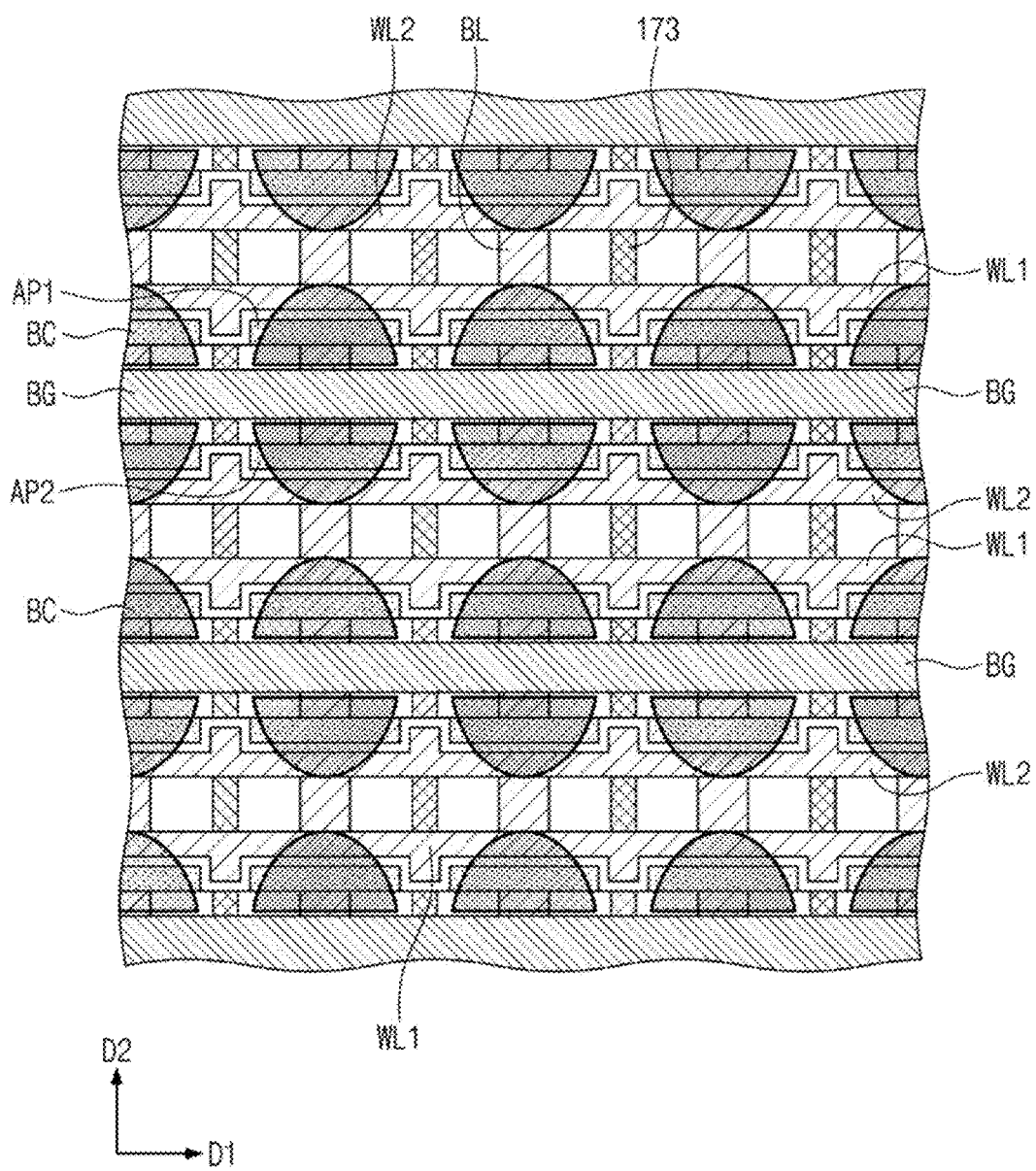

In some example embodiments, including the example embodiments shown in FIG. 6C, each of the contact patterns BC, which are disposed on the first and second active patterns AP1 and AP2, may have a semicircular shape, when viewed in a plan view. The contact patterns BC may be disposed to have mirror symmetry with the back-gate electrode interposed therebetween, when viewed in a plan view.

Figure 7:
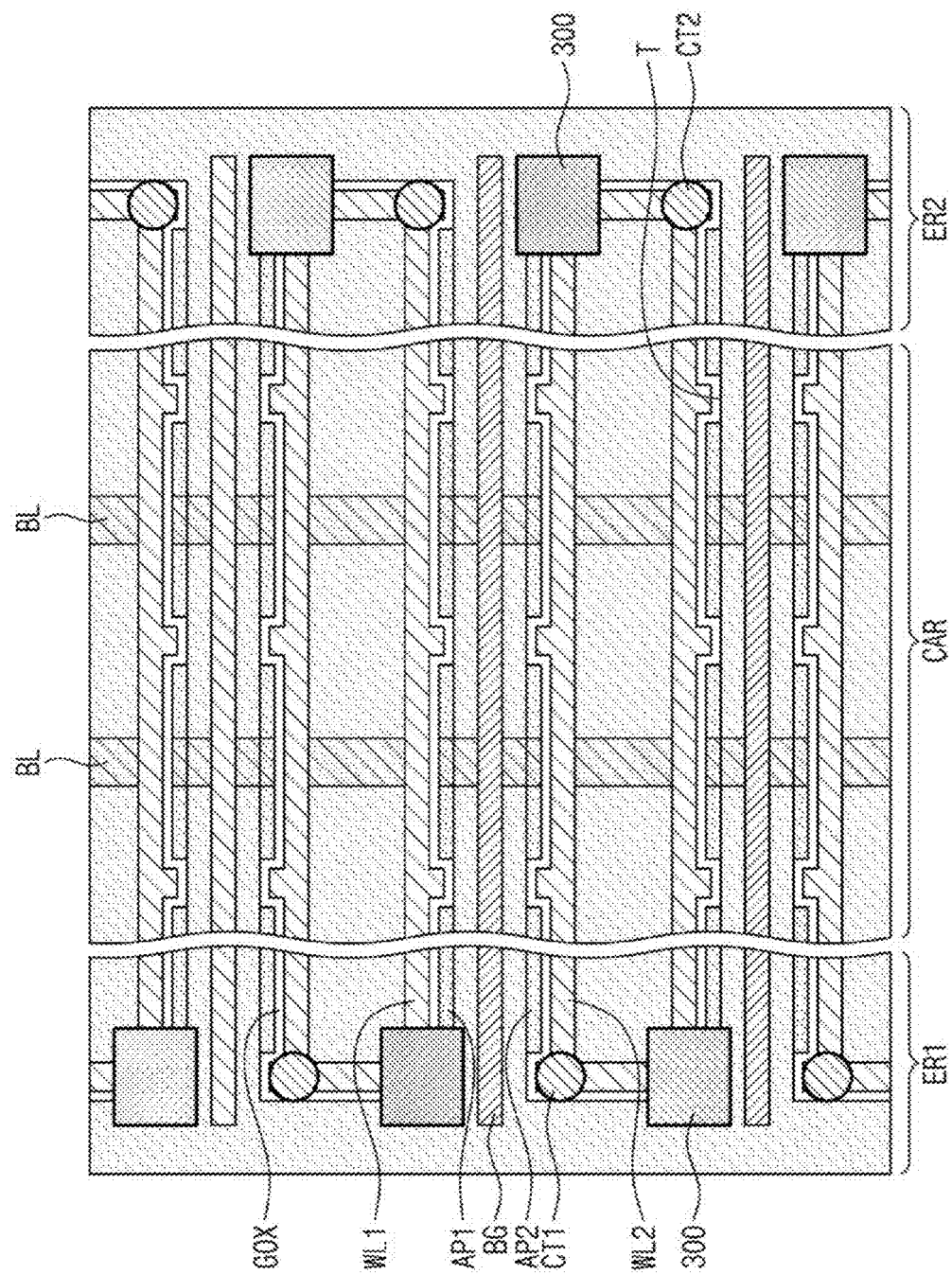

In some example embodiments, including the example embodiments shown in FIG. 7, a semiconductor memory device may include first and second edge regions ER1 and ER2 and the cell array region CAR therebetween.

The first and second word lines WL1 and WL2 and the back-gate electrodes BG may be extended from the cell array region CAR to the first and second edge regions ER1 and ER2.

Each of the first and second word lines WL1 and WL2 may include a line portion, which is extended in the first direction D1, and a protruding portion, which is extended in the second direction D2 and is connected to the line portion. As an example, the protruding portion of the first word line WL1 may be disposed in the second edge region ER2, and the protruding portion of the second word line WL2 may be disposed in the first edge region ER1.

Furthermore, isolation insulating patterns 300 may be provided in the first and second edge regions ER1 and ER2, respectively. In each of the first and second edge regions ER1 and ER2, the isolation insulating pattern 300 may be provided to vertically penetrate the first and second word lines WL1 and WL2. In the first and second edge regions ER1 and ER2, the first and second word lines WL1 and WL2 may be electrically disconnected from each other by the isolation insulating patterns 300.

In the second edge region ER2, a first word line contact plug CT1 may be coupled to the first word line WL1, and in the second edge region ER2, a second word line contact plug CT2 may be coupled to the second word line WL2.

Figure 8:
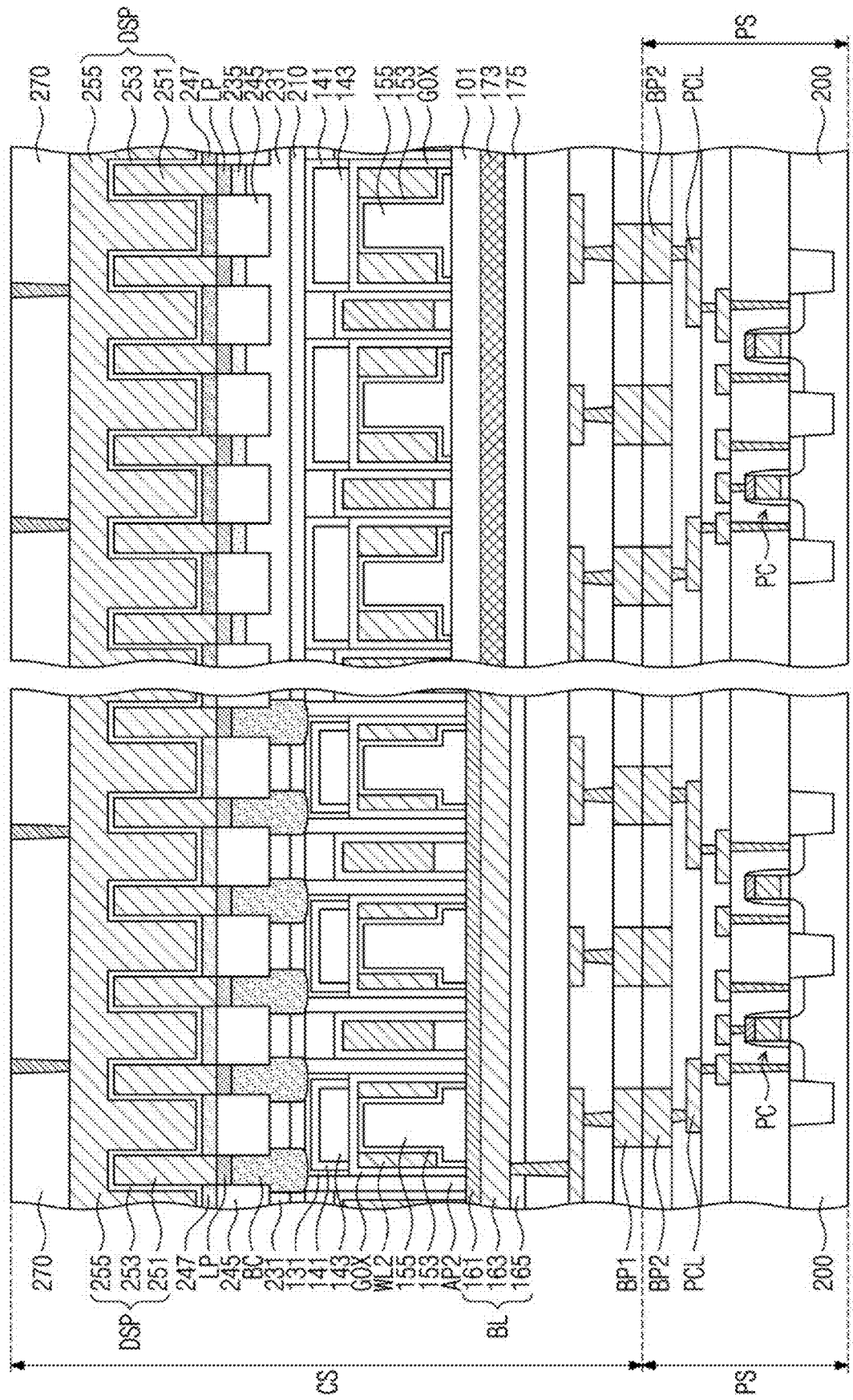
FIG. 8 is a sectional view illustrating a semiconductor memory device according to some example embodiments of the inventive concepts.

FIG. 8 is a sectional view illustrating a semiconductor memory device according to some example embodiments of the inventive concepts.

In some example embodiments, including the example embodiments shown in FIG. 8, a semiconductor memory device may include a peripheral circuit structure PS and a cell array structure CS, which is connected to the peripheral circuit structure PS.

The semiconductor memory device may have a chip-to-chip (C2C) structure. For the C2C structure, an upper chip including the cell array structure CS may be fabricated on a first wafer, a lower chip including the peripheral circuit structure PS may be fabricated on a second wafer, and the upper chip and the lower chip may be connected to each other through a bonding method. The bonding method may mean a way of electrically connecting a bonding pad formed in the uppermost metal layer of the upper chip to a bonding pad formed in the uppermost metal layer of the lower chip. For example, in the case where the bonding pad is formed of copper (Cu), the bonding method may be a Cu-to-Cu bonding method, but in some example embodiments, aluminum (Al) or tungsten (W) may be used as the bonding pad.

In detail, the cell array structure CS may be provided on the peripheral circuit structure PS. In the cell array structure CS, a vertical channel transistor (VCT) may be used as a cell transistor of each memory cell, and a capacitor DSP may be used as a data storage device of each memory cell, as previously described with reference to FIGS. 1A, 1B, and 1C.

First bonding pads BP1 may be provided in the uppermost layer of the cell array structure CS. The first bonding pads BP1 may be electrically connected to the word lines WL1 and WL2 and the bit lines BL. The first bonding pads BP1 may be in direct contact with and bonded to second bonding pads BP2 of the peripheral circuit structure PS.

The peripheral circuit structure PS may include core and peripheral circuits PC, which are formed on the substrate 200. The core and peripheral circuits PC may include row and column decoders, a sense amplifier, and control logics.

The second bonding pads BP2 may be provided in the uppermost layer of the peripheral circuit structure PS. The second bonding pads BP2 may be electrically connected to the core and peripheral circuits PC of the semiconductor memory device through peripheral circuit lines PCL and contact plugs.

Figure 9:
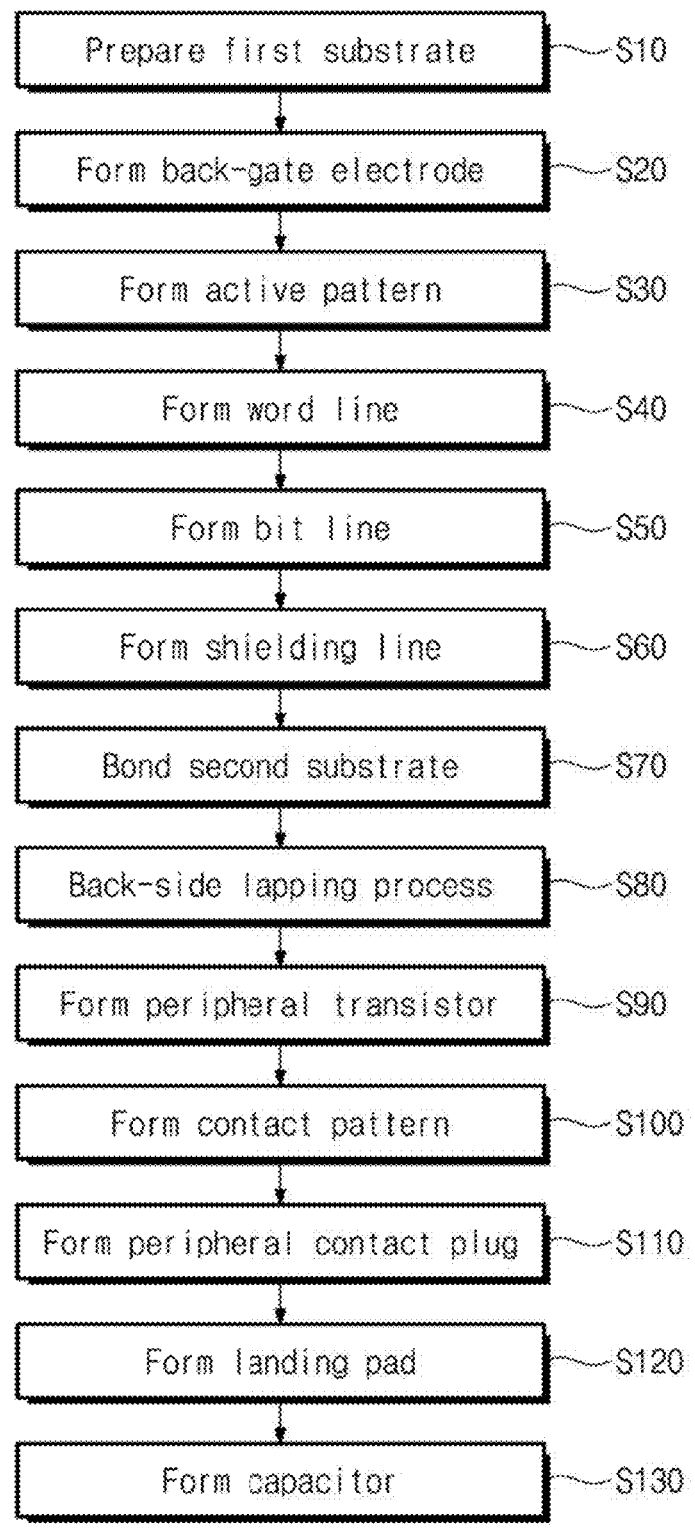
FIG. 9 is a flow chart illustrating a method of fabricating a semiconductor memory device according to some example embodiments of the inventive concepts.
Figure 10A:
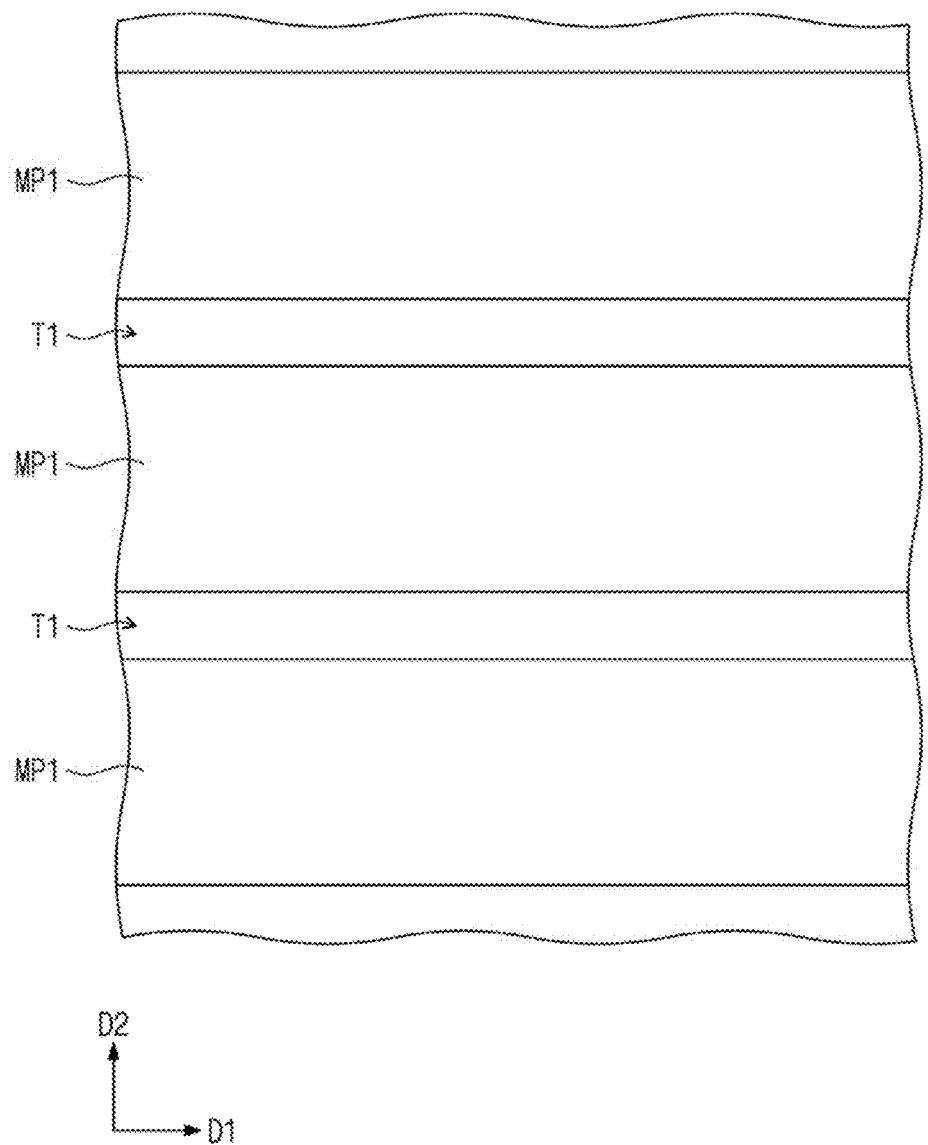
FIGS. 10A, 11A, 12A, 13A, 14A, 15A, 16A, 17A, 18A, 19A, 20A, 21A, 22A, 23A, 24A, 25A, 26A, 27A, 28A, 29A, 30A, and 31A are plan views illustrating a method of fabricating a semiconductor memory device according to some example embodiments of the inventive concepts.
Figure 10B:
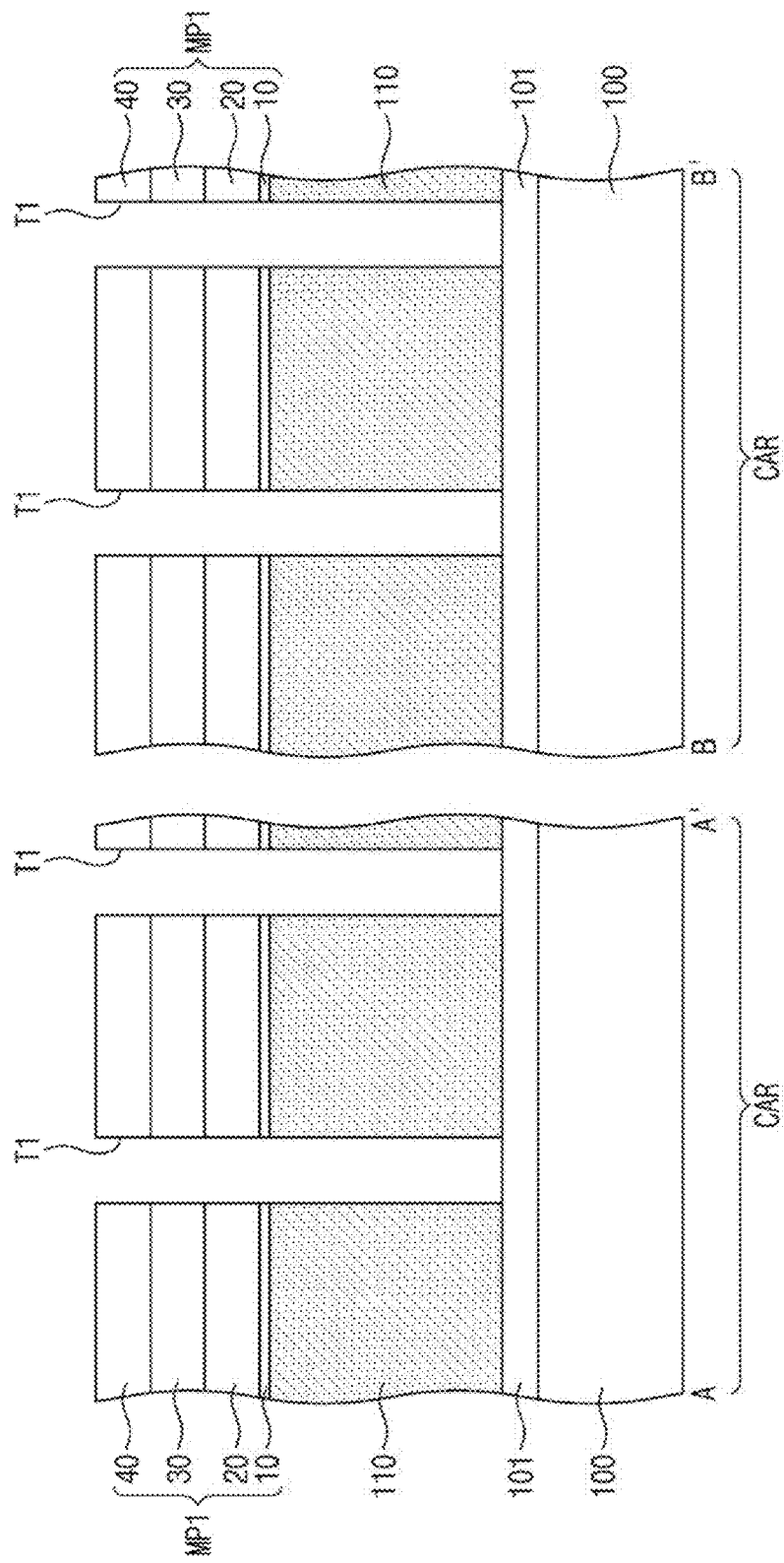
Figure 10C:
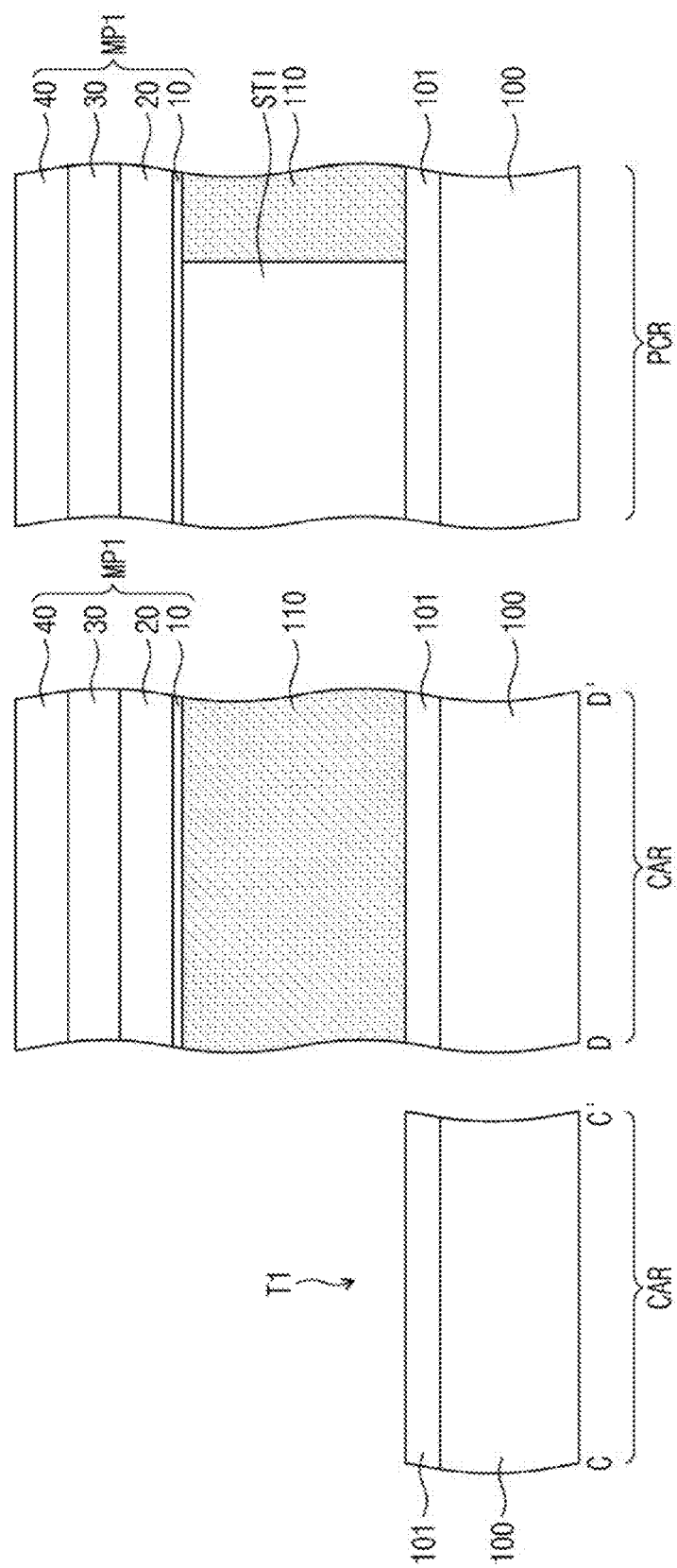

FIG. 9 is a flow chart illustrating a method of fabricating a semiconductor memory device according to some example embodiments of the inventive concepts.

FIGS. 10A, 11A, 12A, 13A, 14A, 15A, 16A, 17A, 18A, 19A, 20A, 21A, 22A, 23A, 24A, 25A, 26A, 27A, 28A, 29A, 30A, and 31A are plan views illustrating a method of fabricating a semiconductor memory device according to some example embodiments of the inventive concepts. FIGS. 10B, 11B, 12B, 13B, 14B, 15B, 16B, 17B, 18B, 19B, 20B, 21B, 22B, 23B, 24B, 25B, 26B, 27B, 28B, 29B, 30B, and 31B and 10C, 11C, 12C, 13C, 14C, 15C, 16C, 17C, 18C, 19C, 20C, 21C, 22C, 23C, 24C, 25C, 26C, 27C, 28C, 29C, 30C, and 31C are sectional views, which are taken along lines A-A', B-B', C-C', and D-D' of FIGS. 10A, 11A, 12A, 13A, 14A, 15A, 16A, 17A, 18A, 19A, 20A, 21A, 22A, 23A, 24A, 25A, 26A, 27A, 28A, 29A, 30A, and 31A to illustrate a method of fabricating a semiconductor memory device, according to some example embodiments of the inventive concepts.

Referring to FIGS. 9, 10A, 10B, and 10C, a first substrate structure including a first substrate 100, a gapfill insulating layer 101, and an active layer 110 may be prepared (in S10).

The gapfill insulating layer 101 and the active layer 110 may be provided on the first substrate 100. The first substrate 100 may include a cell array region CAR and a peripheral circuit region PCR. The first substrate 100, the gapfill insulating layer 101, and the active layer 110 may be a silicon-on-insulator substrate (i.e., SOI substrate).

In some example embodiments, the first substrate 100 may be a silicon substrate, a germanium substrate, and/or a silicon-germanium substrate.

The gapfill insulating layer 101 may be a buried oxide (BOX) layer, which is formed by a separation-by-implanted oxygen (SIMOX) method or by a bonding and layer-transfer method. In some example embodiments, the gapfill insulating layer 101 may be an insulating layer, which is formed by a chemical vapor deposition method. In some example embodiments, the gapfill insulating layer 101 may include a silicon oxide layer, a silicon nitride layer, a silicon oxynitride layer, and/or a low-k dielectric layer.

The active layer 110 may be a single-crystalline semiconductor layer. For example, the active layer 110 may be a single-crystalline silicon substrate, a single-crystalline germanium substrate, and/or a single-crystalline silicon-germanium substrate. The active layer 110 may have a first surface and a second surface, which are opposite to each other, and here, the second surface may be in contact with the gapfill insulating layer 101.

A device isolation layer STI may be formed in the active layer 110 of the peripheral circuit region PCR. The device isolation layer STI may be formed by patterning the active layer 110 of the peripheral circuit region PCR to form a device isolation trench exposing the gapfill insulating layer 101 and filling the device isolation trench with an insulating material. A top surface of the device isolation layer STI may be substantially coplanar with the first surface of the active layer 110.

After the formation of the device isolation layer STI, a first mask pattern MP1 may be formed on the first surface of the active layer 110. The first mask pattern MP1 may have line-shaped openings, which are provided on the cell array region CAR and are extended in a first direction D1.

The first mask pattern MP1 may include a buffer layer 10, a first mask layer 20, a second mask layer 30, and a third mask layer 40, which are sequentially stacked. Here, the third mask layer 40 may be formed of a material having an etch selectivity with respect to the second mask layer 30. The first mask layer 20 may be formed of a material having an etch selectivity with respect to the buffer layer 10 and the second mask layer 30. As an example, the buffer layer 10 and the second mask layer 30 may be formed of or include silicon oxide, and the first and third mask layers 20 and 40 may be formed of or include silicon nitride.

Thereafter, the active layer 110 of the cell array region CAR may be anisotropically etched using the first mask pattern MP1 as an etch mask. Accordingly, first trenches T1, which are extended in the first direction D1, may be formed in the active layer 110 of the cell array region CAR. The first trenches T1 may be formed to expose the gapfill insulating layer 101 and may be spaced apart from each other in a second direction D2 by a specific distance.

Figure 11A:
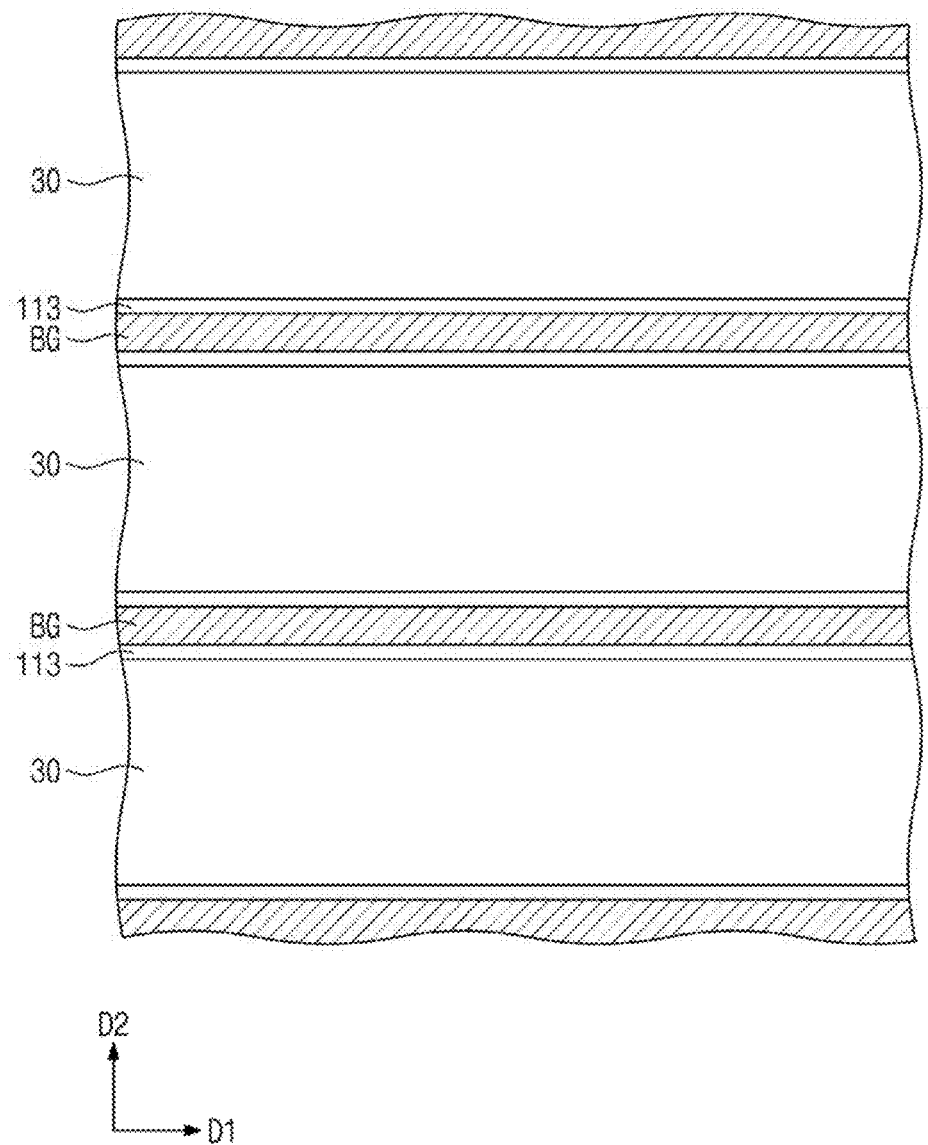
Figure 11B:
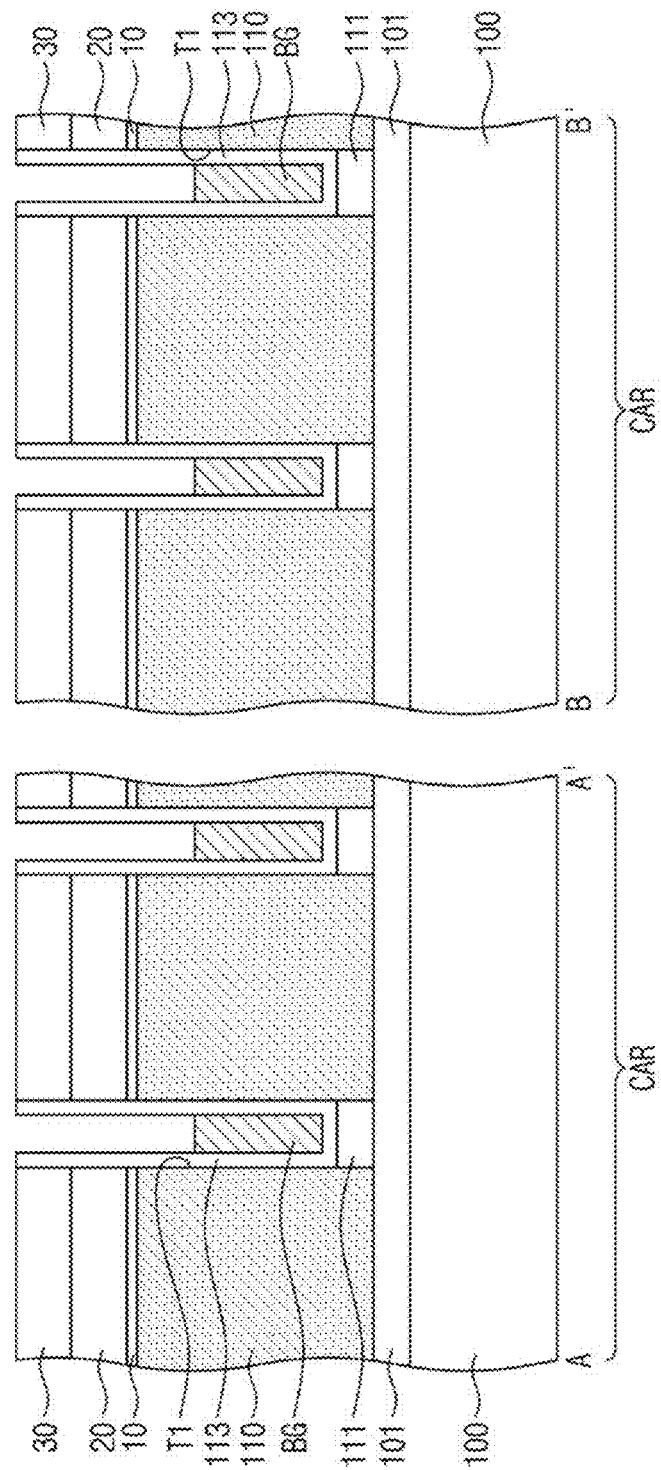
Figure 11C:
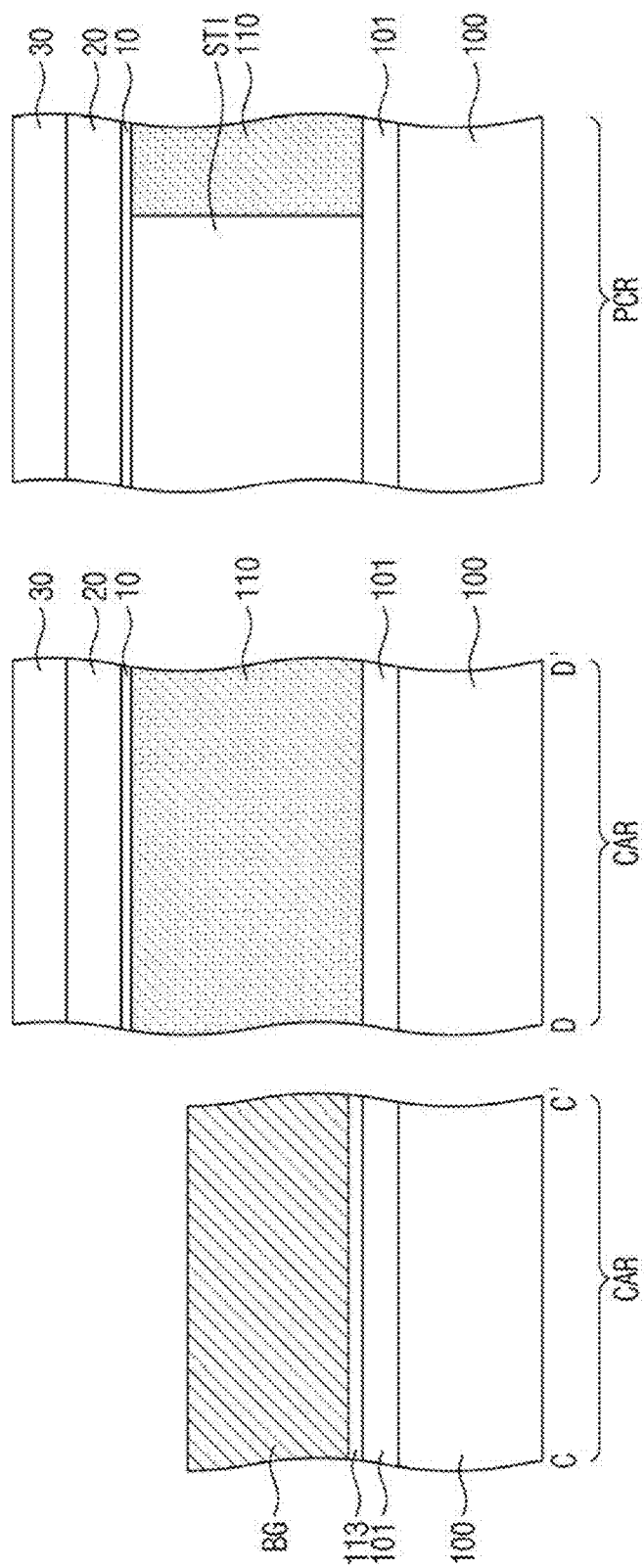

Referring to FIGS. 11A, 11B, and 11C, first insulating patterns 111 may be formed to fill lower portions of the first trenches T1. The first insulating patterns 111 may be formed by depositing an insulating material to fill the first trenches T1 and isotropically etching the insulating material. The first insulating patterns 111 may be formed to partially expose side surfaces of the first trenches T1.

After the formation of the first insulating pattern 111, back-gate insulating patterns 113 and back-gate electrodes BG may be formed in the first trenches T1 (in S20 of FIG. 9).

In detail, after the formation of the first insulating pattern 111, a gate insulating layer may be deposited to conformally cover inner surfaces of the first trenches T1, and then, a gate conductive layer may be deposited to fill the first trenches T1 provided with the gate insulating layer. Thereafter, the gate conductive layer may be isotropically etched to form the back-gate electrodes BG in the first trenches T1, respectively. The third mask layer 40 may be removed during the formation of the back-gate electrode BG.

In some example embodiments, before the formation of the back-gate insulating patterns 113, a gas-phase doping (GPD) process or a plasma doping (PLAD) process may be performed to dope the active layers 110, which are exposed through inner side surfaces of the first trenches T1, with impurities.

Figure 12A:
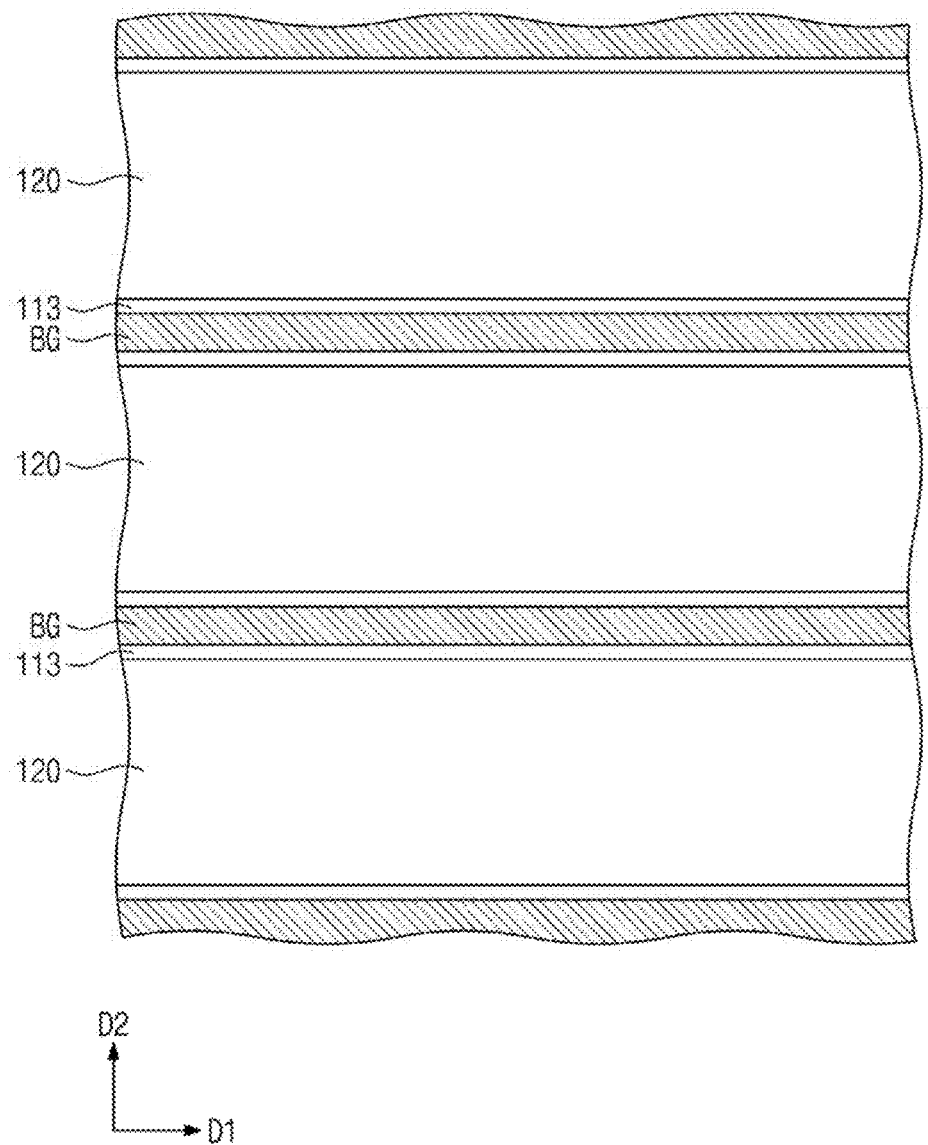
Figure 12B:
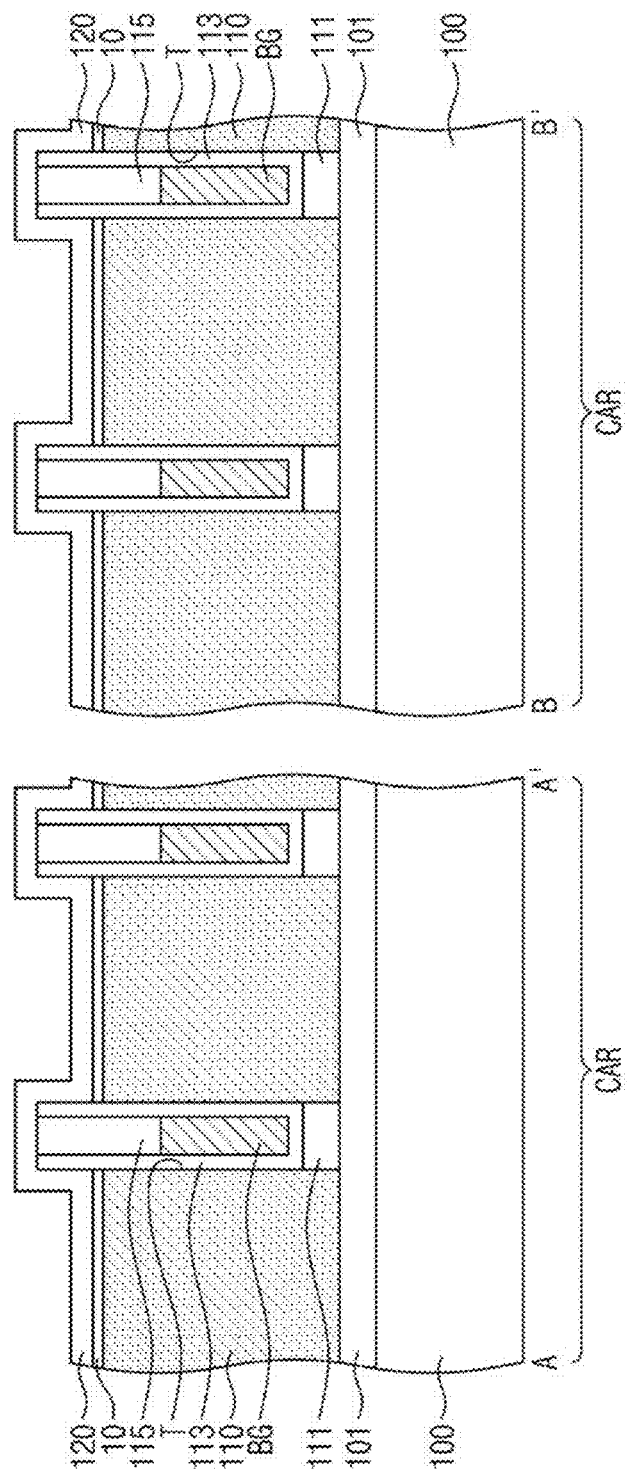
Figure 12C:
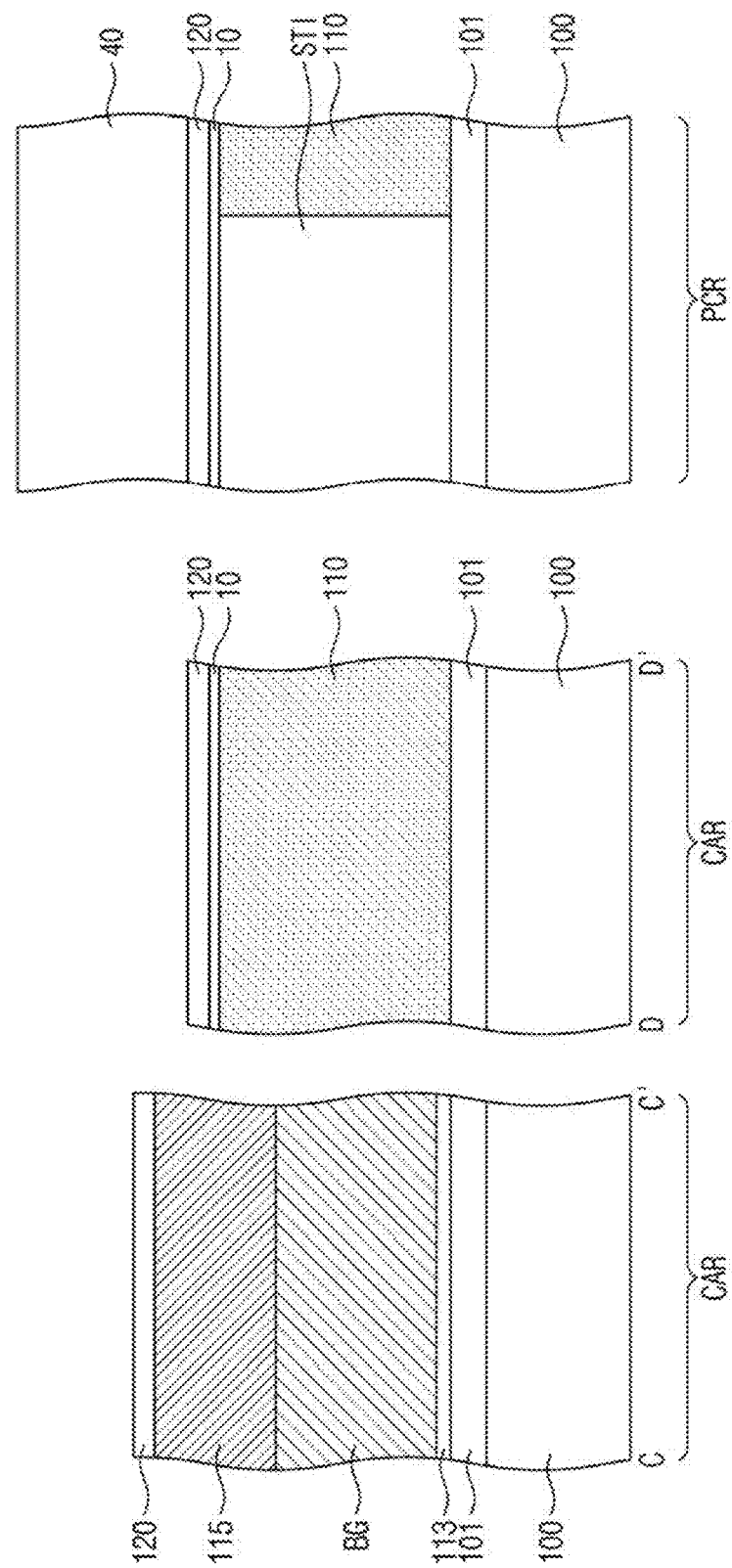

Referring to FIGS. 12A, 12B, and 12C, back-gate capping patterns 115 may be formed in the first trenches T1 provided with the back-gate electrodes BG. The back-gate capping patterns 115 may be formed by depositing an insulating layer to fill the first trenches T1 provided with the back-gate electrodes BG and planarizing the insulating layer to expose a top surface of the first mask layer 20. In the case where the back-gate capping patterns 115 are formed of the same material (e.g., silicon oxide) as the second mask layer 30, the second mask layer 30 may be removed by the planarization process, which is performed to form the back-gate capping patterns 115.

Meanwhile, before the formation of the back-gate capping patterns 115, a gas-phase doping (GPD) process or a plasma doping (PLAD) process may be performed to inject impurities into the active layers 110 through the first trench provided with the back-gate electrode BG.

After the formation of the back-gate capping patterns 115, the first mask layer 20 may be removed, and the back-gate capping patterns 115 may have a shape protruding above a top surface of the buffer layer 10.

Thereafter, a spacer layer 120 may be formed to conformally cover the top surface of the buffer layer 10, side surfaces of the back-gate insulating patterns 113, and top surfaces of the back-gate capping patterns 115. Active patterns of the vertical channel transistors may have a width that is determined by a deposition thickness of the spacer layer 120. The spacer layer 120 may be formed of an insulating material. For example, the spacer layer 120 may be formed of or include at least one of silicon oxide, silicon oxynitride, silicon nitride, silicon carbide (SiC), silicon carbon nitride (SiCN), or combinations thereof.

Next, a peripheral mask pattern 40 (also referred to herein as a third mask layer) may be formed on the spacer layer 120 of the peripheral circuit region PCR to expose the cell array region CAR.

Figure 13A:
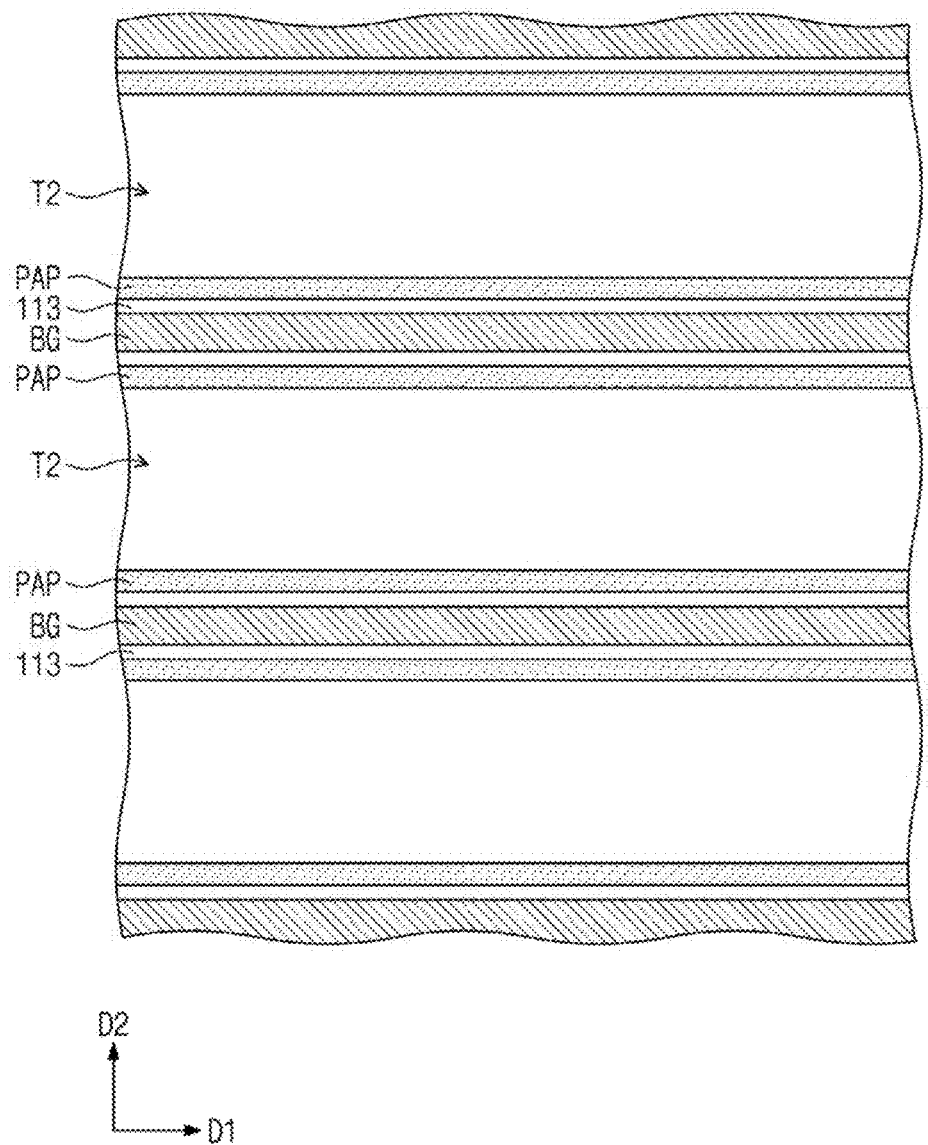
Figure 13B:
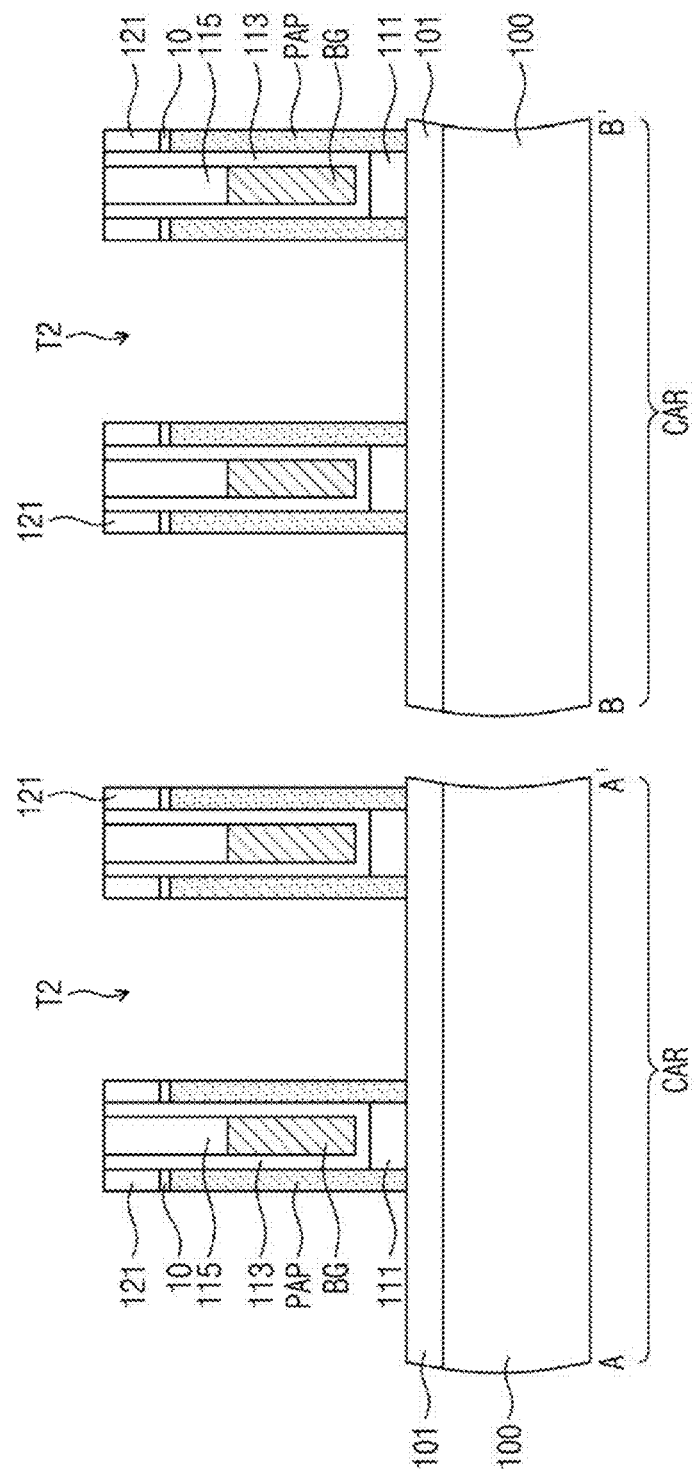

Thereafter, referring to FIGS. 13A, 13B, and 13C, an anisotropic etching process may be performed on the spacer layer 120, and thus, a pair of spacers 121 may be formed on side surfaces of each of the back-gate insulating patterns 113.

Next, an anisotropic etching process using the spacers 121 as an etch mask may be performed on the active layer 110. Accordingly, a pair of preliminary active patterns PAP, which are separated from each other, may be formed at both sides (e.g., opposite sides) of each of the back-gate insulating patterns 113. As a result of the formation of the preliminary active patterns PAP, the gapfill insulating layer 101 may be exposed. The preliminary active patterns PAP may be line-shaped patterns, which are extended in the first direction D1 and parallel to the back-gate electrode BG, and a second trench T2 may be formed between the preliminary active patterns PAP, which are adjacent to each other in the second direction D2.

After the formation of the spacers 121, the peripheral mask pattern 40 may be removed, and a portion of the spacer layer 120 may be left on the buffer layer 10 of the peripheral circuit region PCR.

Figure 14A:
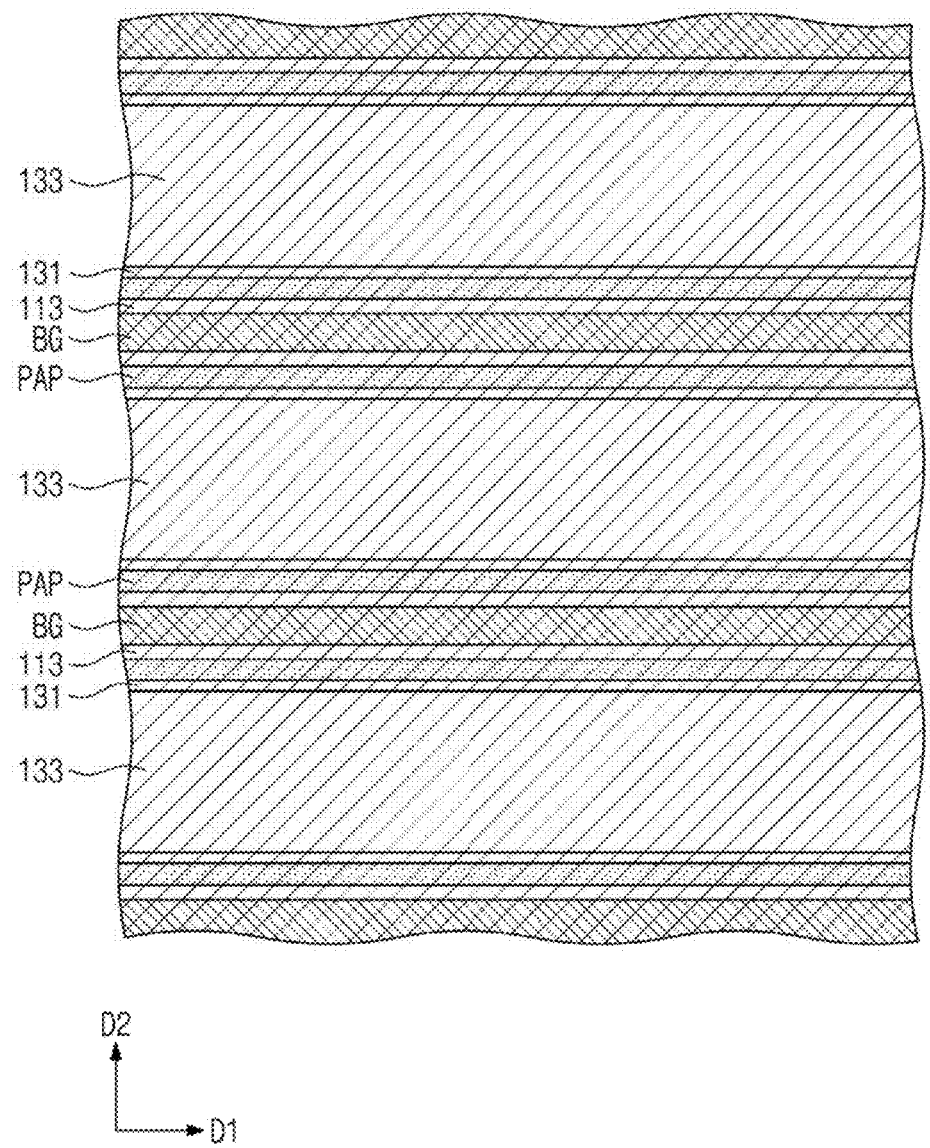
Figure 14B:
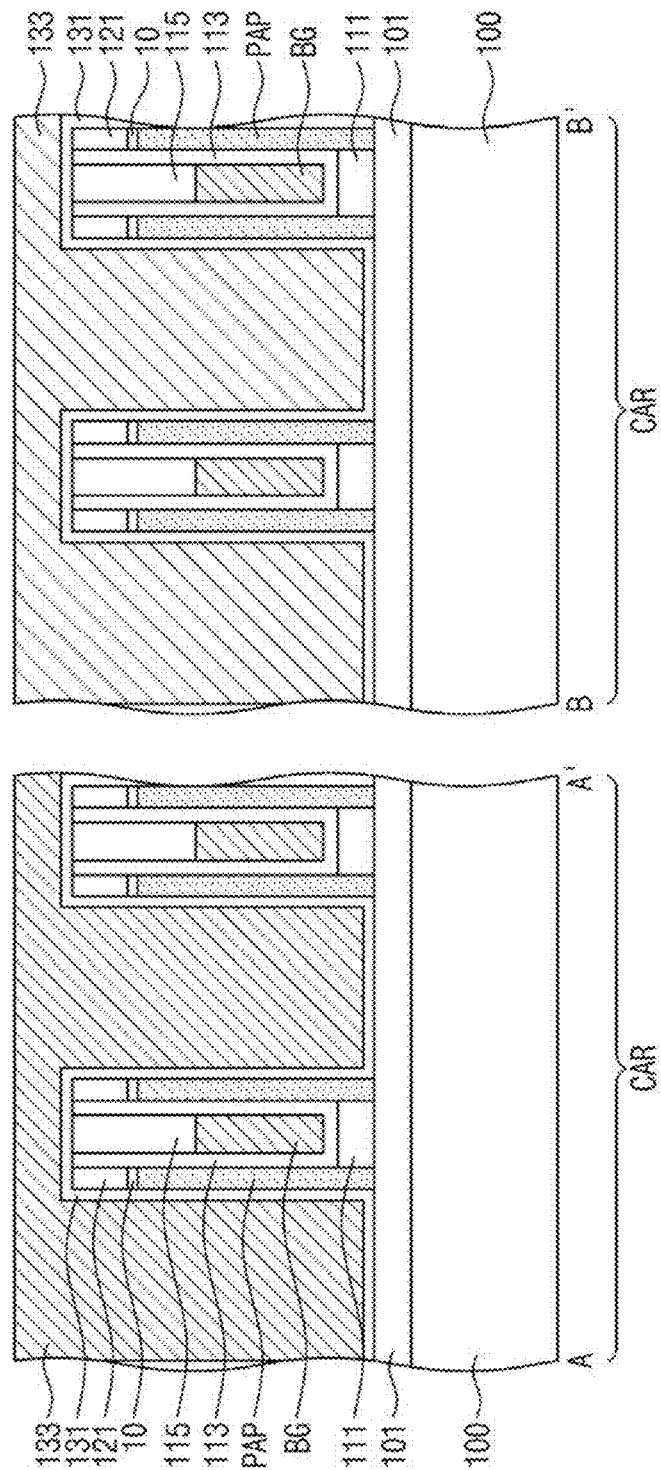
Figure 14C:
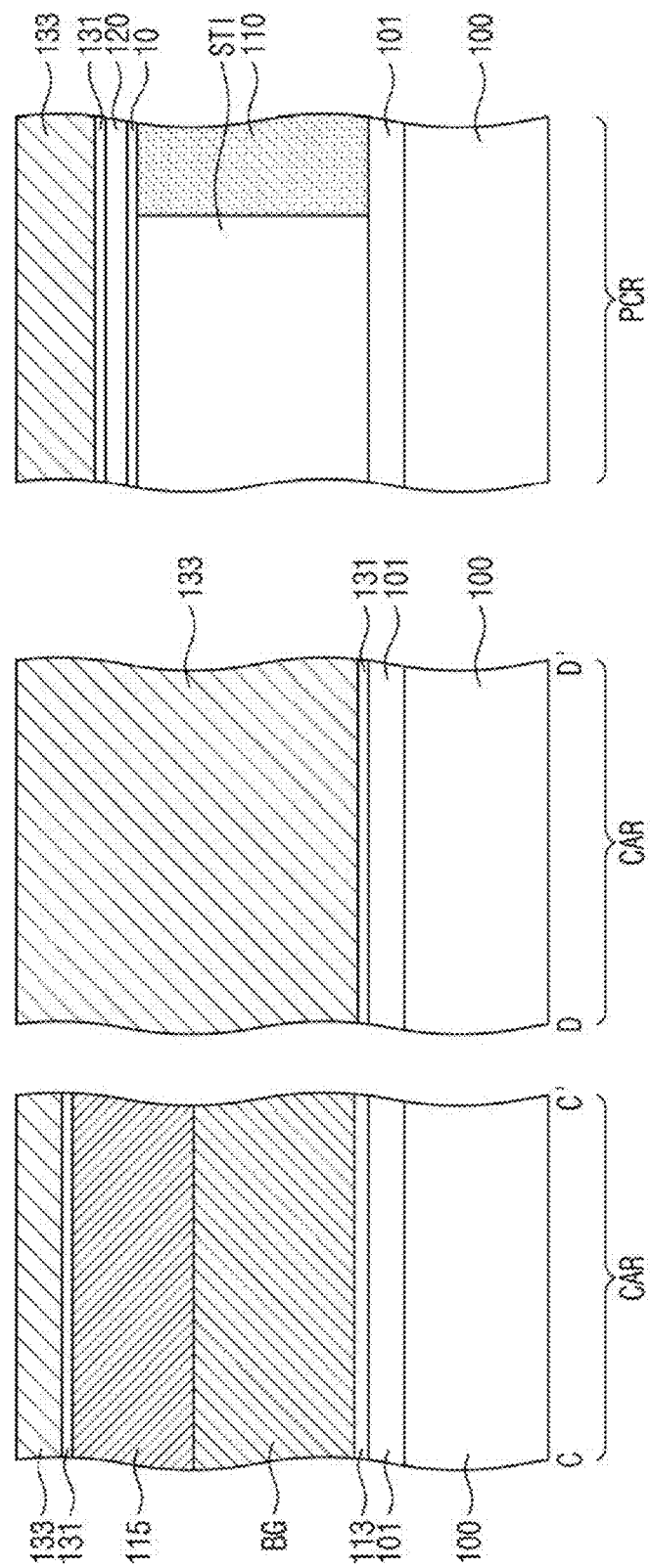

Referring to FIGS. 14A, 14B, and 14C, a first etch stop layer 131 may be formed to conformally cover an inner surface of the second trench T2, and a first sacrificial layer 133 may be formed to fill the second trench T2 provided with the first etch stop layer 131. The first sacrificial layer 133 may be formed to fill the second trench T2 and may have a substantially flat top surface.

The first etch stop layer 131 may be formed by depositing an insulating material (e.g., silicon oxide). The first sacrificial layer 133 may be formed of an insulating material having an etch selectivity with respect to the first etch stop layer 131. For example, the first sacrificial layer 133 may be one of insulating layers, which are formed by a spin-on-glass (SOG) technique, or a silicon oxide layer.

The first etch stop layer 131 and the first sacrificial layer 133 may be sequentially stacked on the spacer layer 120 of the peripheral circuit region PCR.

Figure 15A:
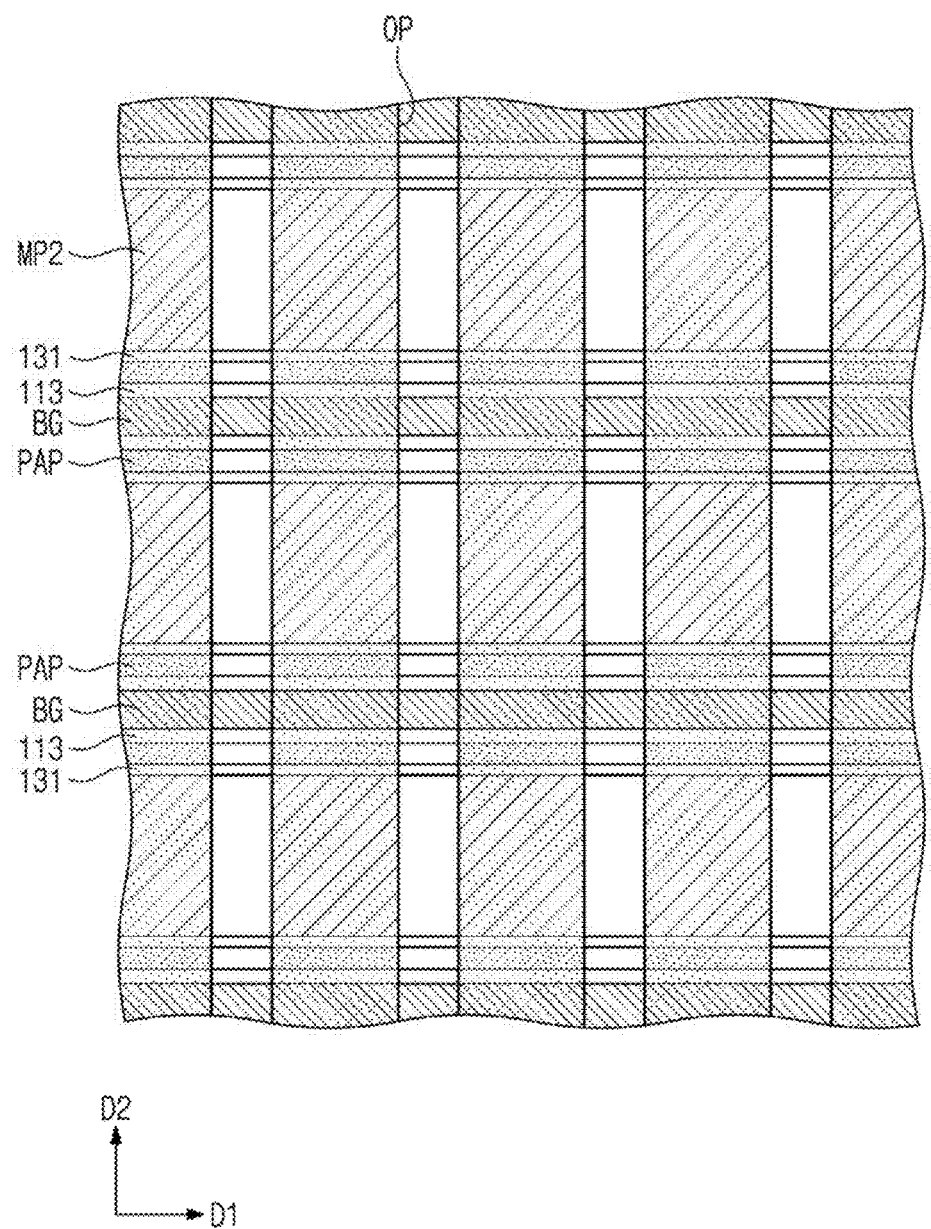
Figure 15B:
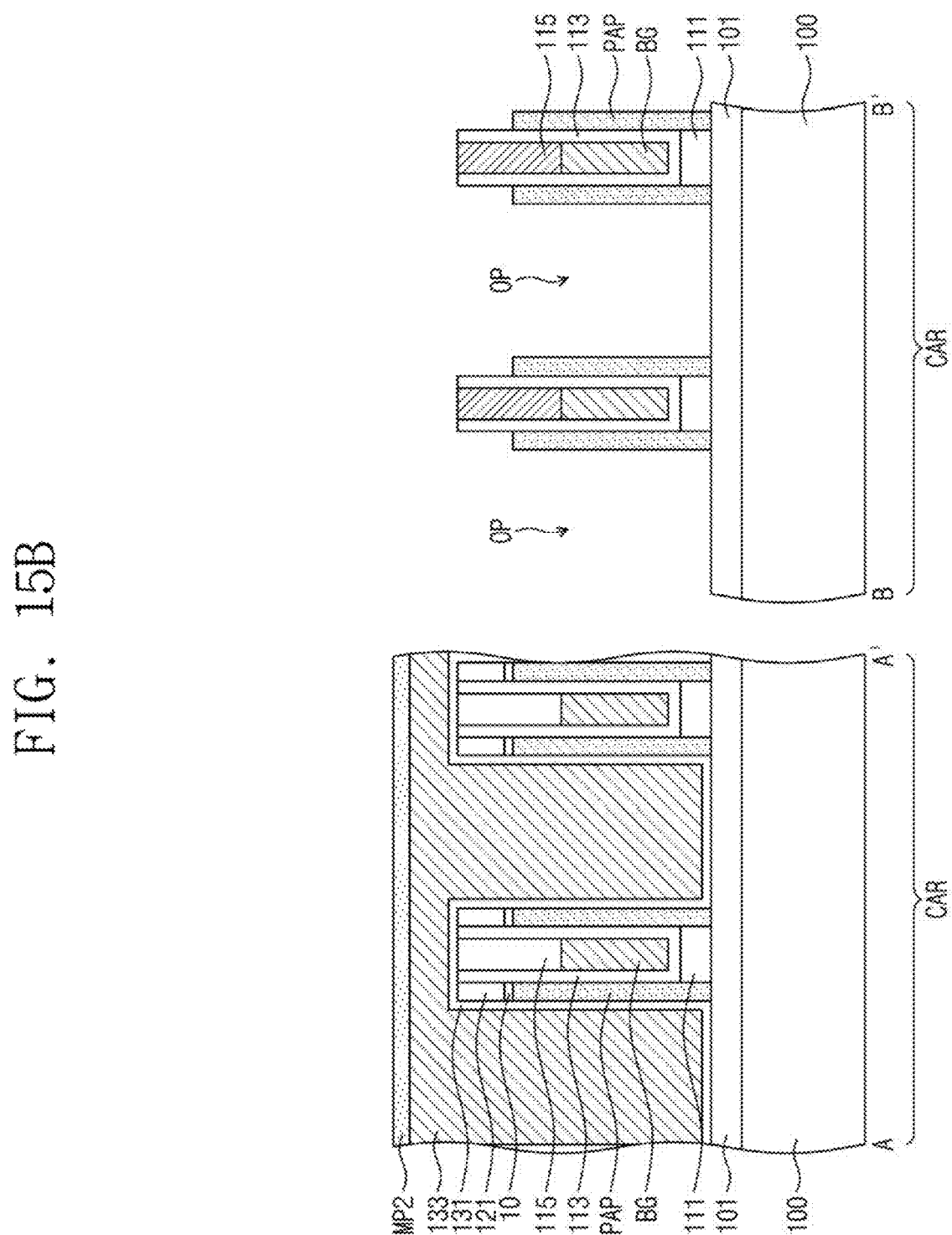
Figure 15C:
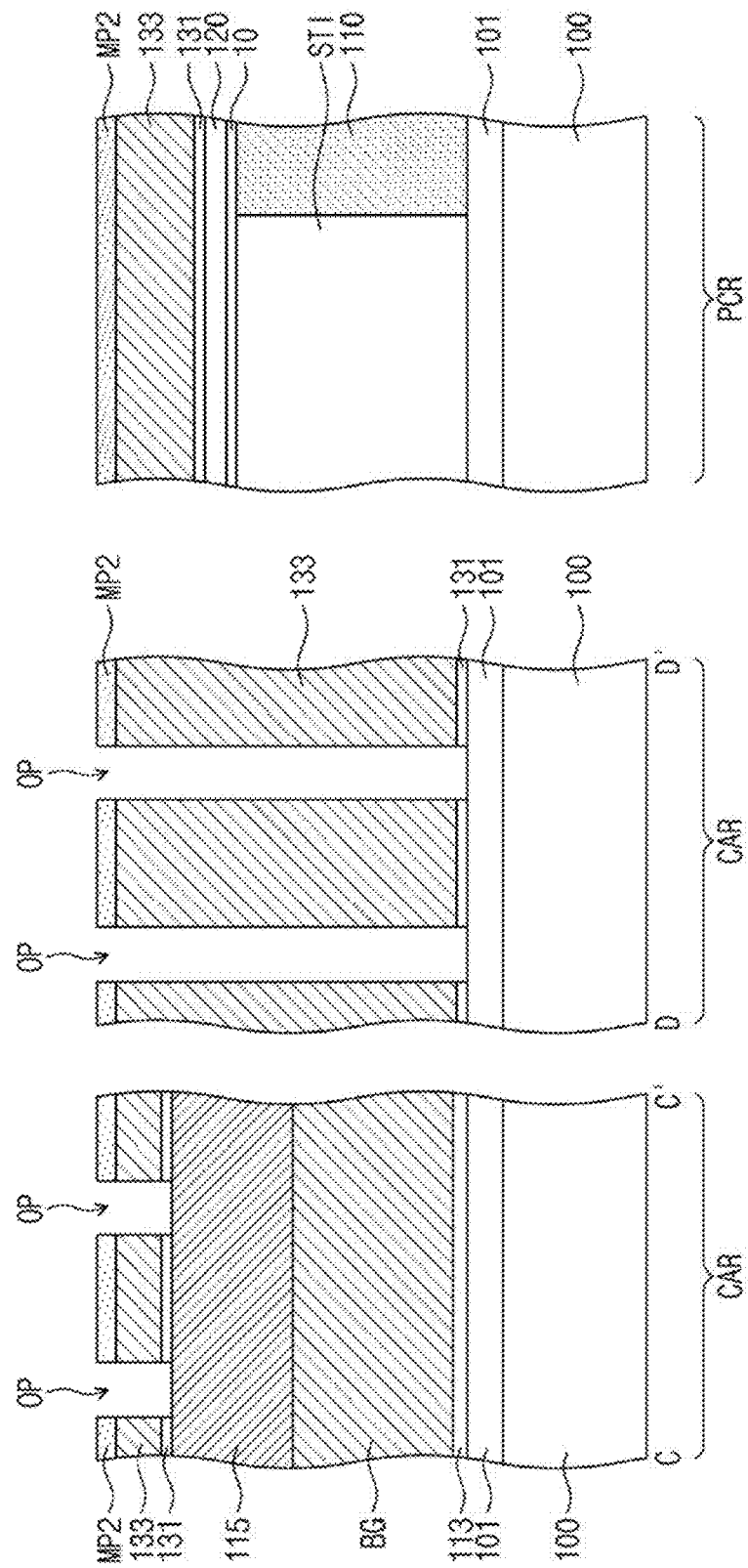

Referring to FIGS. 15A, 15B, and 15C, a second mask pattern MP2 may be formed on the first sacrificial layer 133. The second mask pattern MP2 may be formed of a material having an etch selectivity with respect to the first sacrificial layer 133 and may be a line-shaped pattern, which is extended in the second direction D2. In some example embodiments, the second mask pattern MP2 may be a line-shaped pattern, which is extended in a direction diagonal to the first and second directions D1 and D2.

Thereafter, openings OP partially exposing the preliminary active patterns PAP may be formed by sequentially etching the first sacrificial layer 133 and the first etch stop layer 131 using the second mask pattern MP2 as an etch mask. The openings OP may be formed to expose a top surface of the gapfill insulating layer 101.

In some example embodiments, the spacers 121 exposed by the second mask pattern MP2 may be removed during the etching process on the first sacrificial layer 133 and the first etch stop layer 131.

Figure 16A:
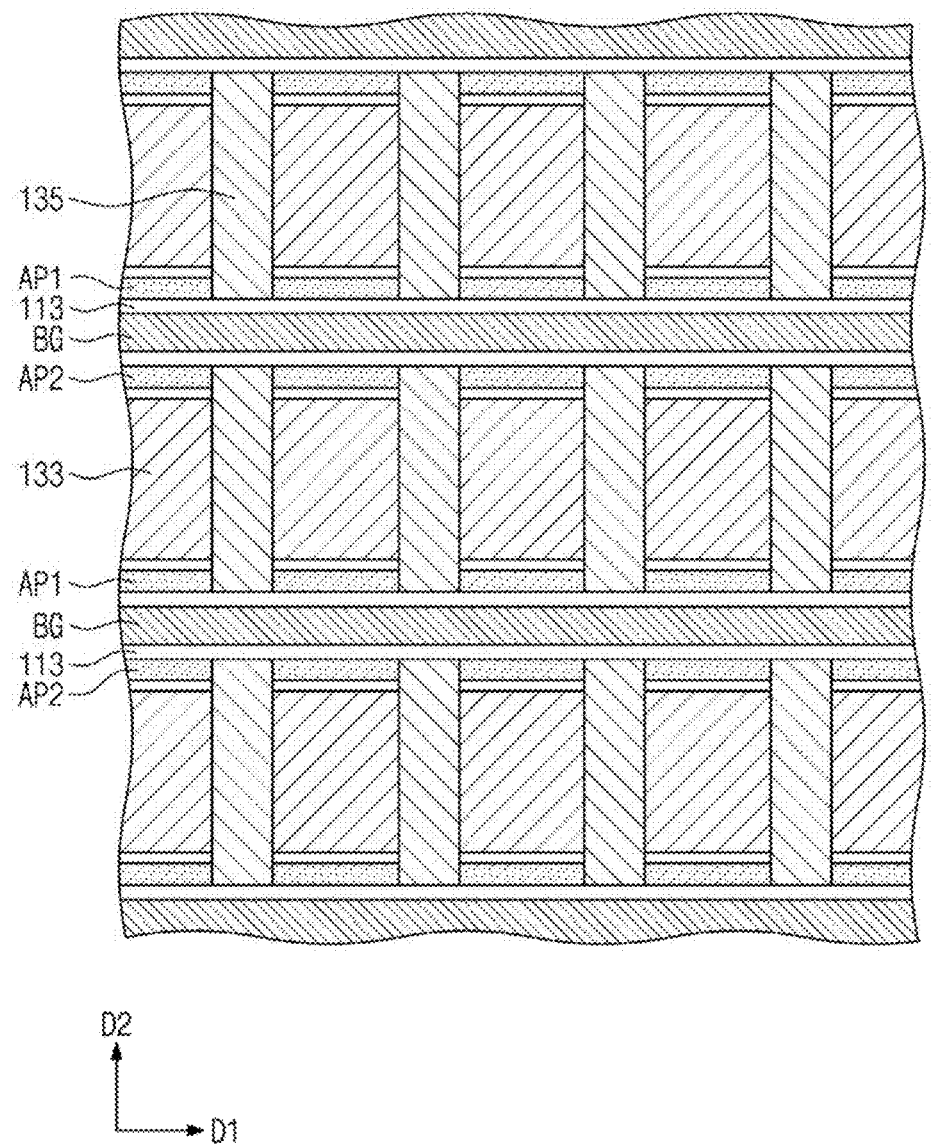
Figure 16B:
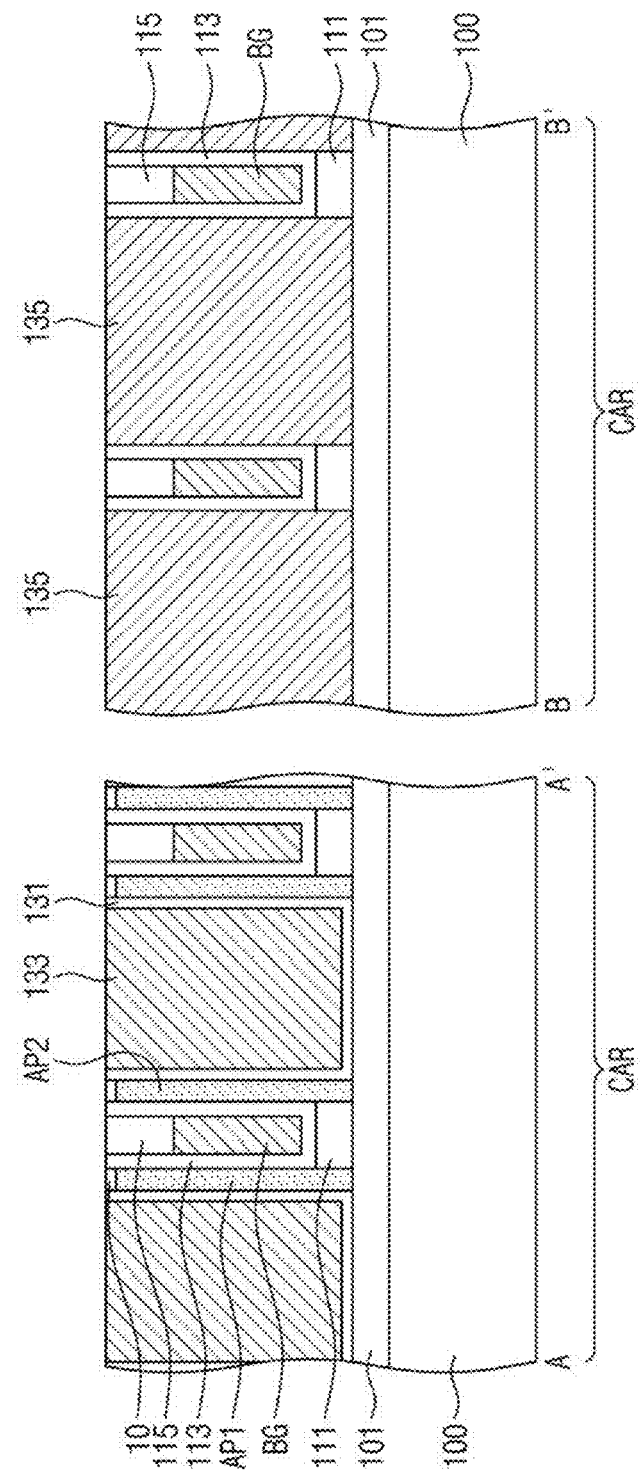
Figure 16C:
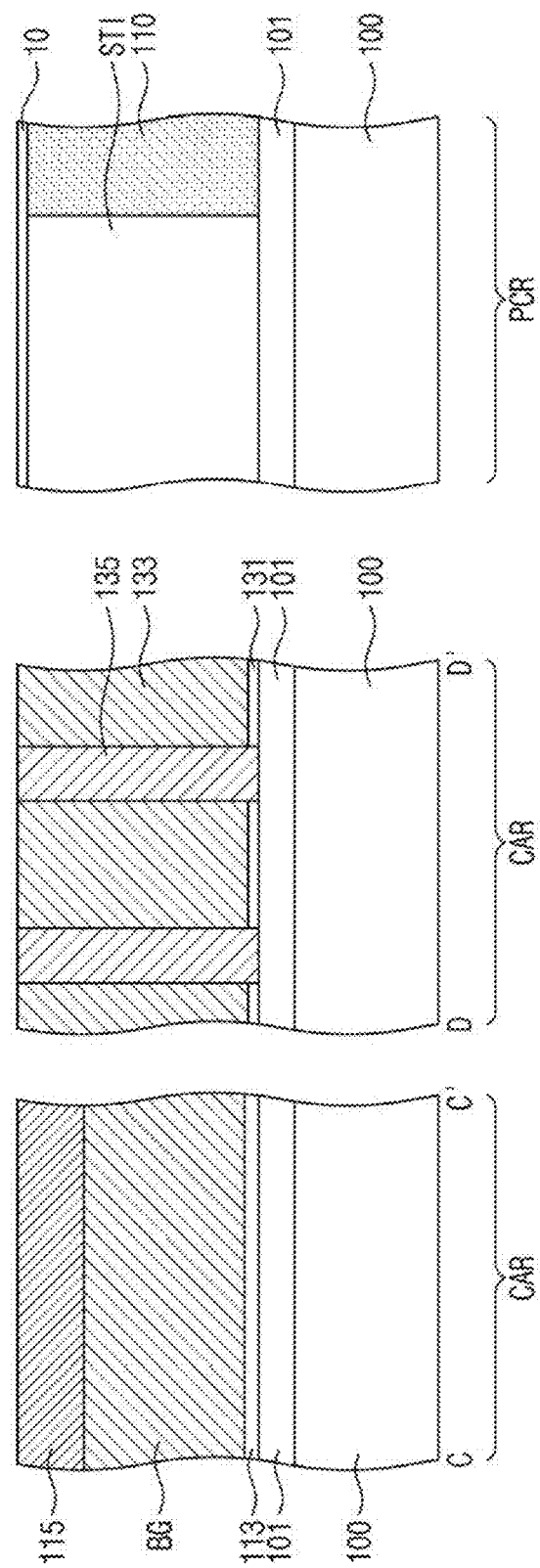

Referring to FIGS. 16A, 16B, and 16C, the preliminary active patterns PAP, which are exposed to the openings OP, may be anisotropically etched to form first and second active patterns AP1 and AP2 at both sides of the back-gate insulating pattern 113 (in S30 of FIG. 9). That is, the first active patterns AP1 on a first side surface of the back-gate electrode BG may be formed to be spaced apart from each other in the first direction D1, and the second active patterns AP2 on a second side surface of the back-gate electrode BG may be formed to be spaced apart from each other in the first direction D1. In the case where the second mask pattern MP2 is extended in the diagonal direction, the first and second active patterns AP1 and AP2 may be disposed to face each other in the diagonal direction.

After the formation of the first and second active patterns AP1 and AP2, a second sacrificial layer 135 may be formed to fill the openings OP. The second sacrificial layer 135 may be formed of an insulating material having an etch selectivity with respect to the first etch stop layer 131. As an example, the second sacrificial layer 135 may be formed of the same material as the first sacrificial layer 133.

After the formation of the second sacrificial layer 135, the second mask pattern MP2 may be removed, and a planarization process may be performed on the first and second sacrificial layers 133 and 135 to expose a top surface of the back-gate capping pattern 115. Due to the planarization process on the first and second sacrificial layers 133 and 135, the buffer layer 10 on the peripheral circuit region PCR may be exposed to the outside.

Figure 17A:
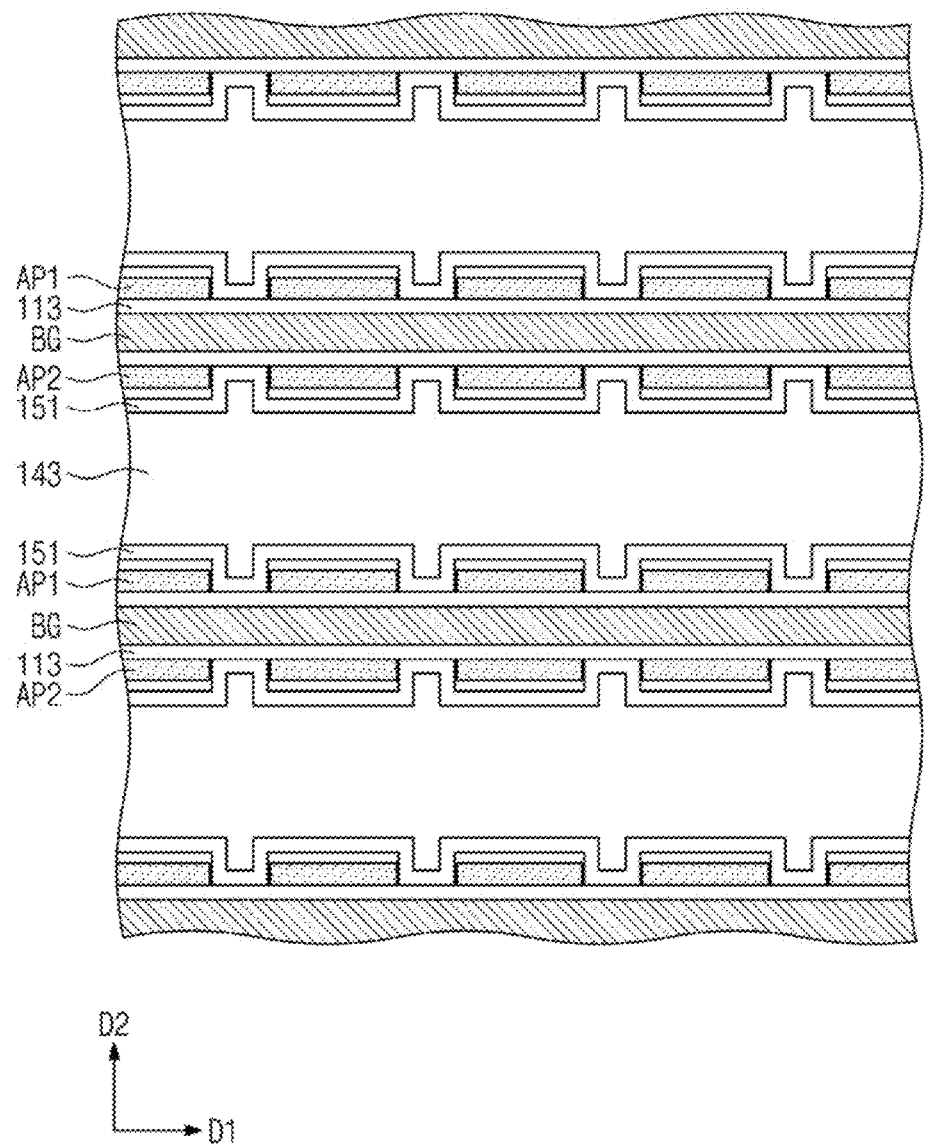
Figure 17B:
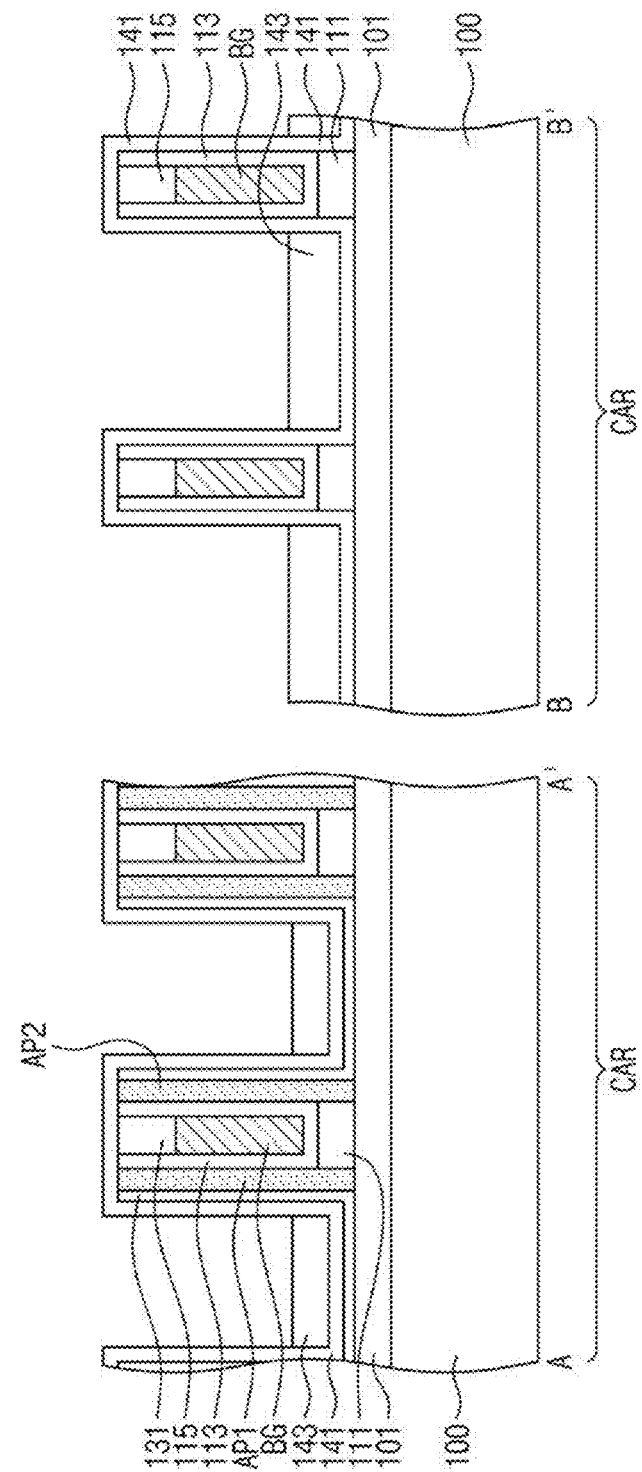
Figure 17C:
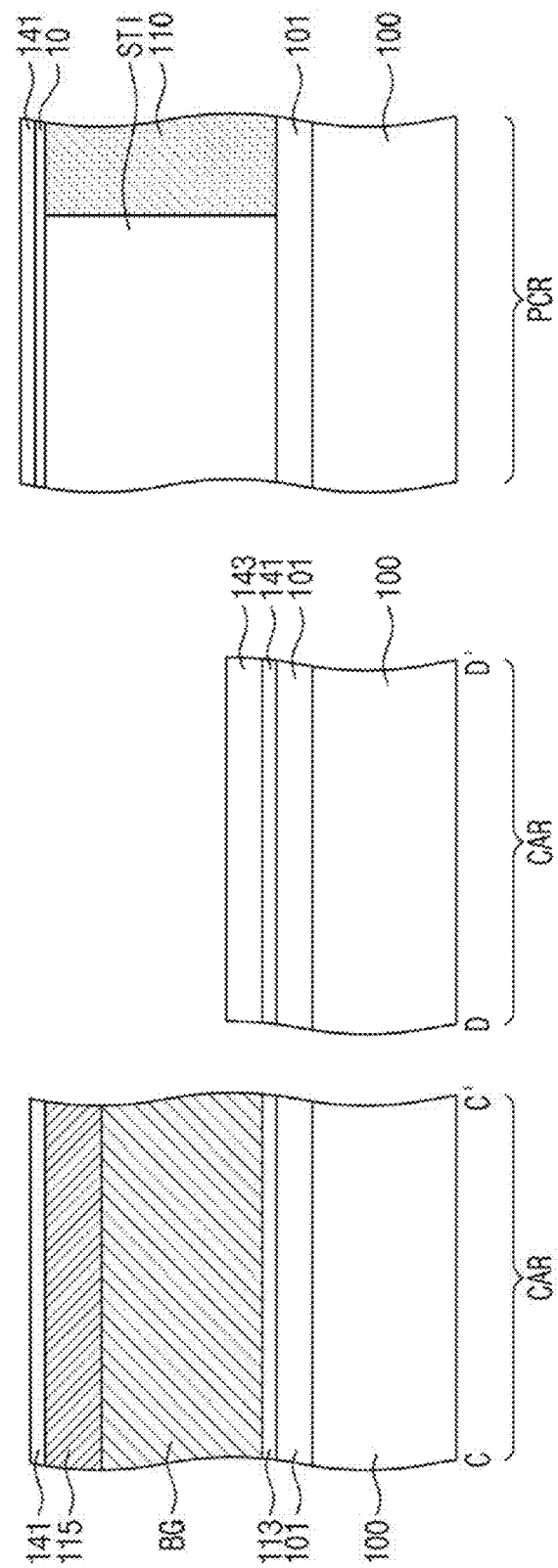

Referring to FIGS. 17A, 17B, and 17C, the first and second sacrificial layers 133 and 135 may be removed, and the first etch stop layer 131 may be exposed between the first and second active patterns AP1 and AP2, which are opposite to each other in the second direction D2.

Thereafter, a second etch stop layer 141 may be deposited to cover a second trench, in which the first etch stop layer 131 is formed, to a uniform thickness. In detail, the second etch stop layer 141 may be deposited on the first etch stop layer 131, the back-gate insulating patterns 113, the back-gate capping patterns 115, portions of the gapfill insulating layer 101, and the buffer layer 10 of the peripheral circuit region PCR. The second etch stop layer 141 may be formed of a material having an etch selectivity with respect to the first etch stop layer 131.

A second insulating pattern 143 may be formed to fill a portion of the second trench (T2 of FIGS. 13A and 13B) provided with the second etch stop layer 141.

The second insulating pattern 143 may be formed by forming an insulating layer using a spin-on-glass (SOG) technology to fill the second trench T2 and isotropically etching the insulating layer. The second insulating pattern 143 may be formed of or include at least one of fluoride silicate glass (FSG), spin-on-glass (SOG), tonen silazene (TOSZ).

A level of a top surface of the second insulating pattern 143 may be changed depending on the isotropic etching process. In some example embodiments, the top surface of the second insulating pattern 143 may be located at a level higher than a bottom surface of the back-gate electrode BG. In some example embodiments, the top surface of the second insulating pattern 143 may be located at a level lower than the bottom surface of the back-gate electrode BG.

Figure 18A:
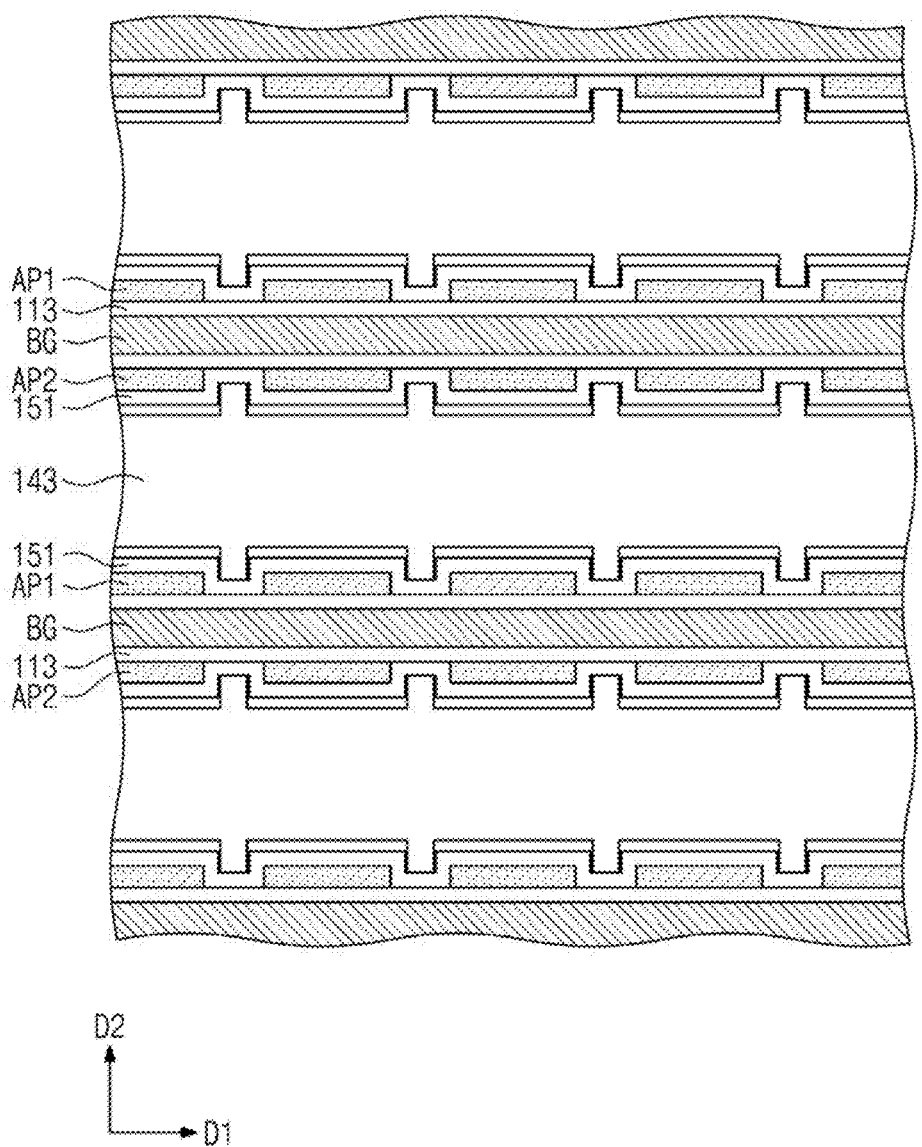
Figure 18B:
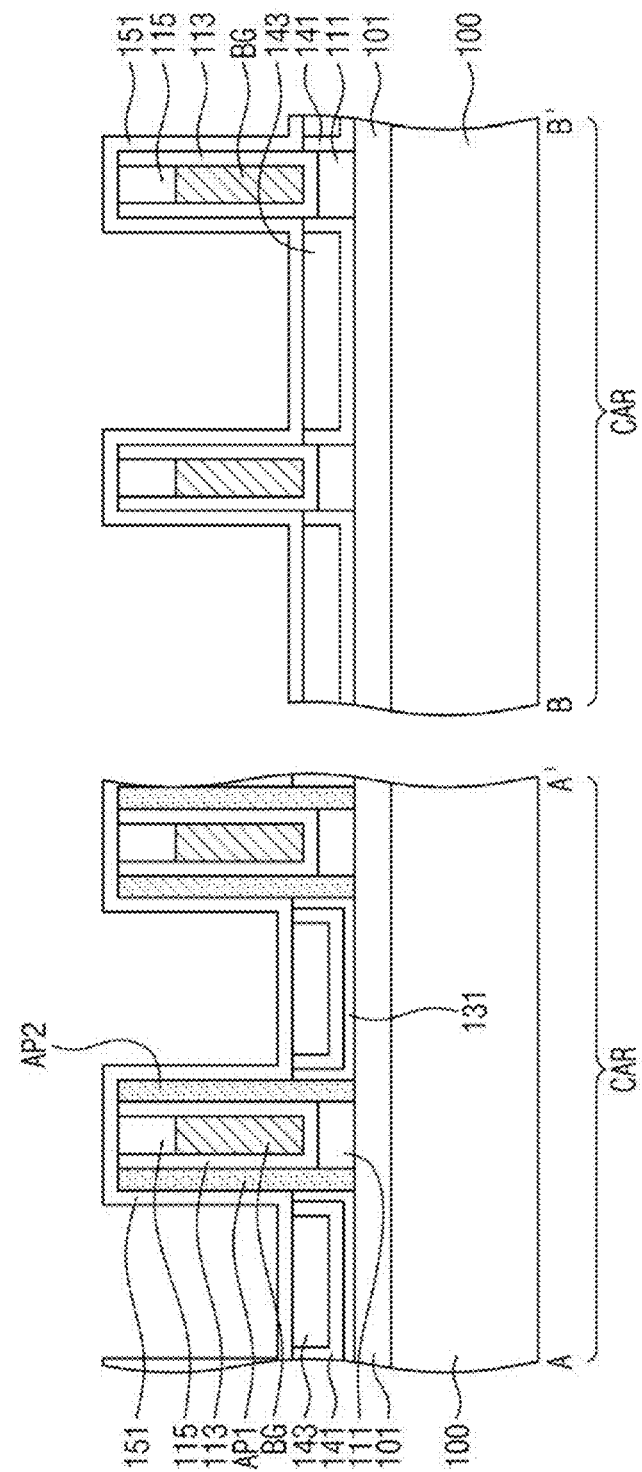
Figure 18C:
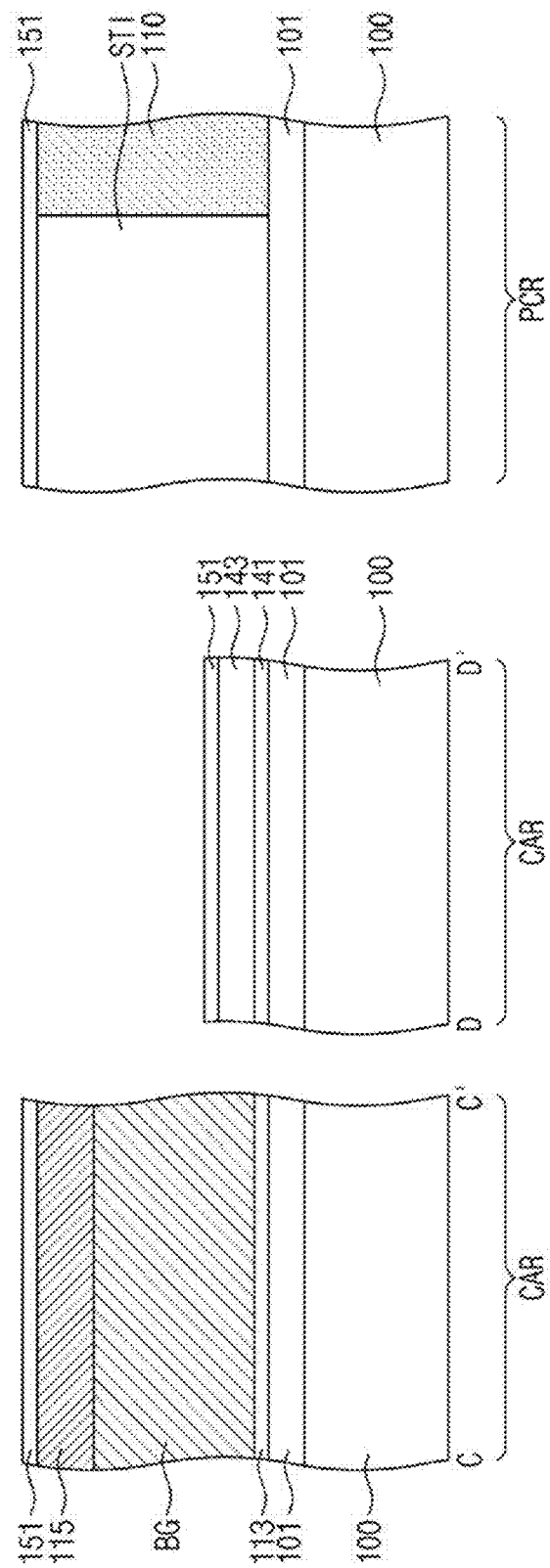

Thereafter, referring to FIGS. 18A, 18B, and 18C, the first and second etch stop layers 131 and 141, which are exposed by the second insulating pattern 143, may be isotropically etched to expose the first and second active patterns AP1 and AP2 in the second trench T2 (e.g., see FIGS. 13A and 13B). Furthermore, the active layer 110 and the device isolation layer STI on the peripheral circuit region PCR may be exposed to the outside.

Next, a gate insulating layer 151 may be deposited to conformally cover the side surfaces of the first and second active patterns AP1 and AP2, the top surfaces of the back-gate capping patterns 115, and the top surface of the second insulating pattern 143. The gate insulating layer 151 may be deposited to cover the active layer 110 and the device isolation layer STI on the peripheral circuit region PCR.

The gate insulating layer 151 may be formed using at least one of physical vapor deposition (PVD), thermal chemical vapor deposition (thermal CVD), low-pressure chemical vapor deposition (LP-CVD), plasma-enhanced chemical vapor deposition (PE-CVD), or atomic layer deposition (ALD) technologies.

Figure 19A:
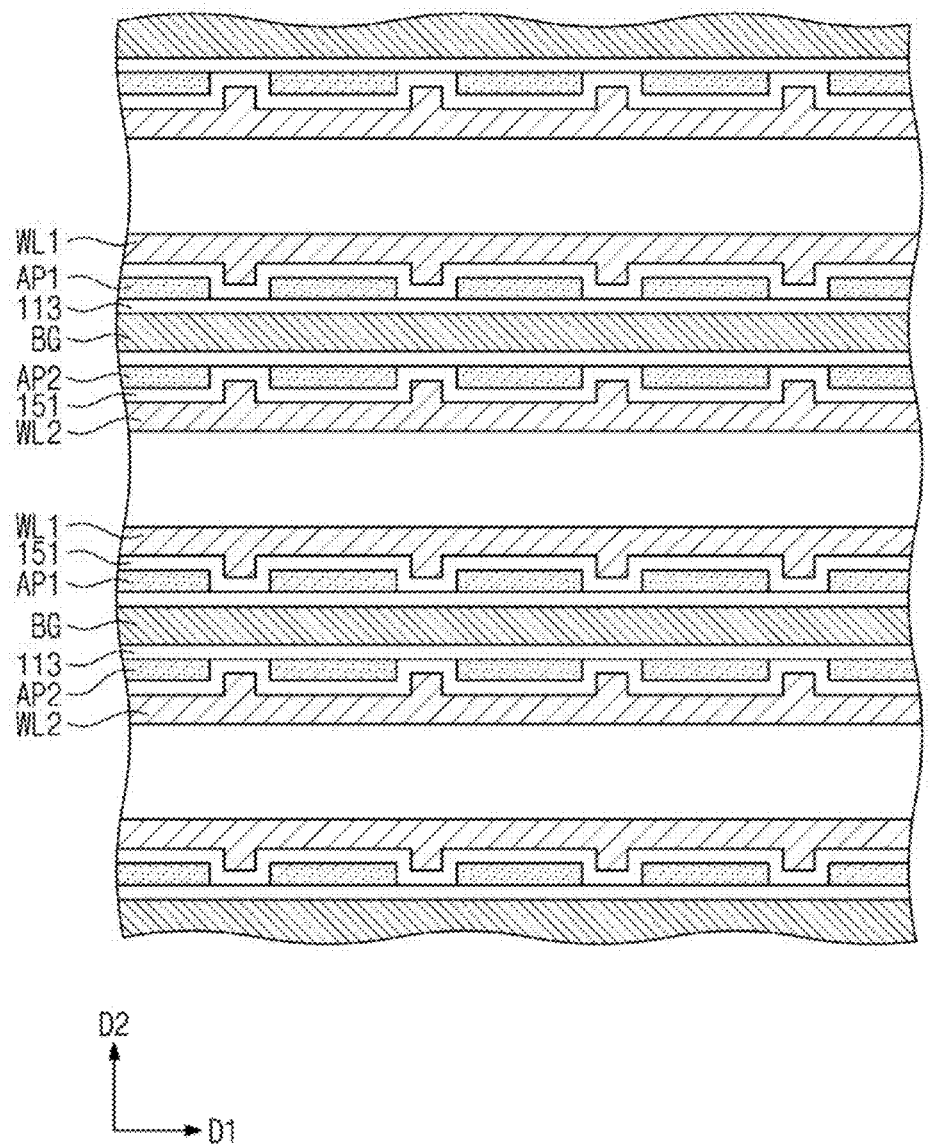
Figure 19B:
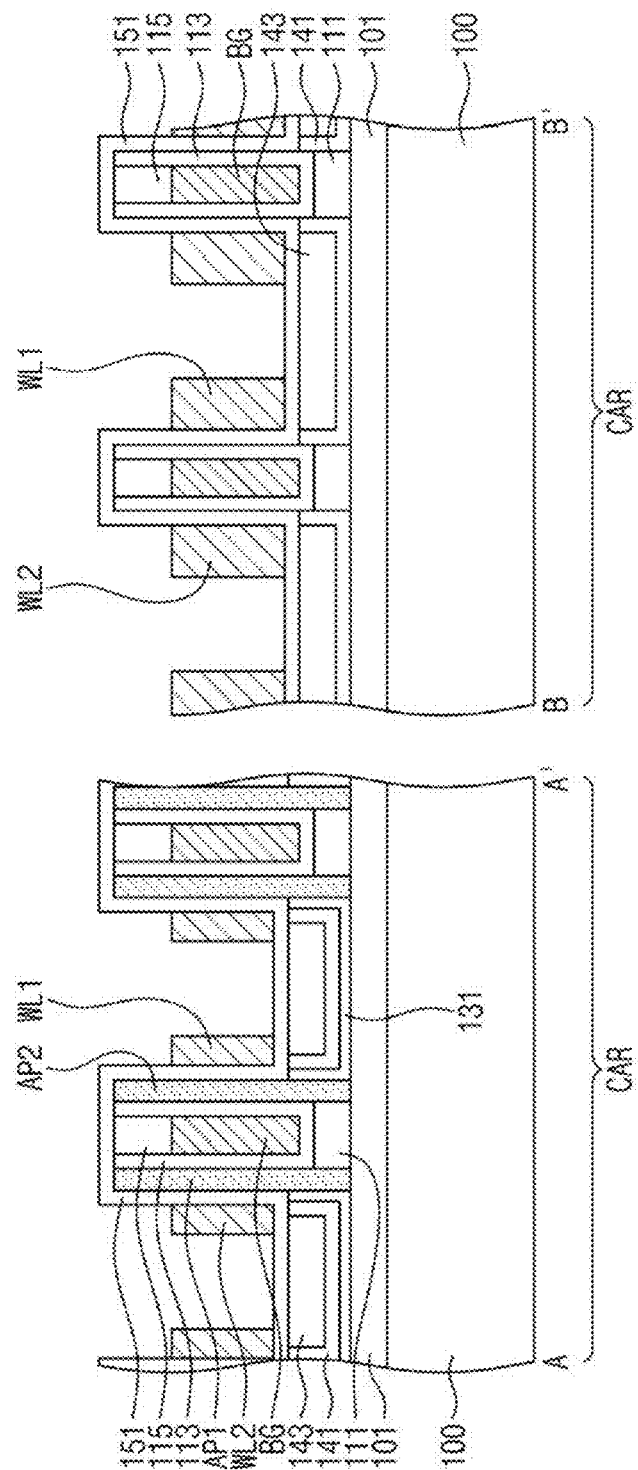
Figure 19C:
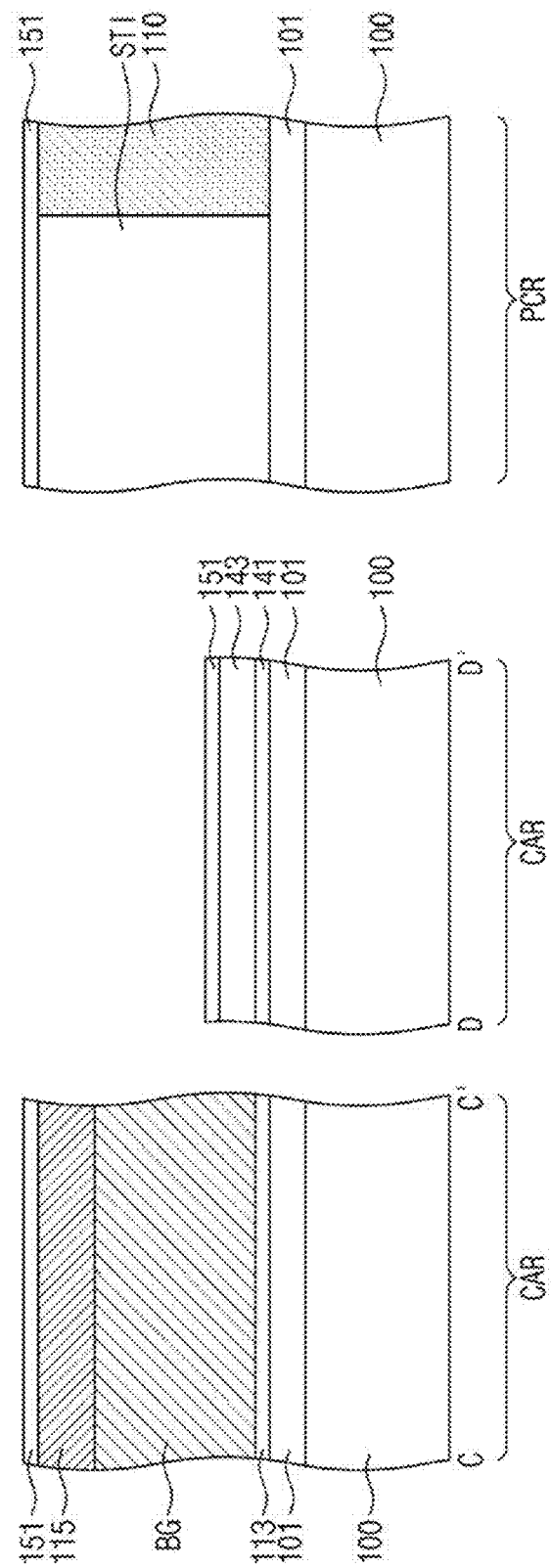

Referring to FIGS. 19A, 19B, and 19C, after the deposition of the gate insulating layer 151, first and second word lines WL1 and WL2 may be formed on the side surfaces of the first and second active patterns AP1 and AP2 (in S40 of FIG. 9), for example such that the first and second active patterns AP1 and AP2 are between the first and second word lines WL1 and WL2.

The formation of the first and second word lines WL1 and WL2 may include depositing a gate conductive layer to conformally cover the gate insulating layer 151 and performing an anisotropic etching process on the gate conductive layer. Here, a deposition thickness of the gate conductive layer may be smaller than half a width of the second trench. The gate conductive layer may be deposited on the gate insulating layer 151 to define a gap region in the second trench.

When the anisotropic etching process is performed on the gate conductive layer, the gate insulating layer 151 may be used as an etch stop layer or the gate insulating layer 151 may be over-etched to expose the second insulating pattern 143. The shapes of the first and second word lines WL1 and WL2 may be variously changed depending on the anisotropic etching process on the gate conductive layer.

Top surfaces of the first and second word lines WL1 and WL2 may be located at a level lower than top surfaces of the first and second active patterns AP1 and AP2.

After the formation of the first and second word lines WL1 and WL2, a gas-phase doping (GPD) process or a plasma doping (PLAD) process may be performed to inject impurities into the active layers 110 through the gate insulating layer 151 exposed by the first and second word lines WL1 and WL2.

Figure 20A:
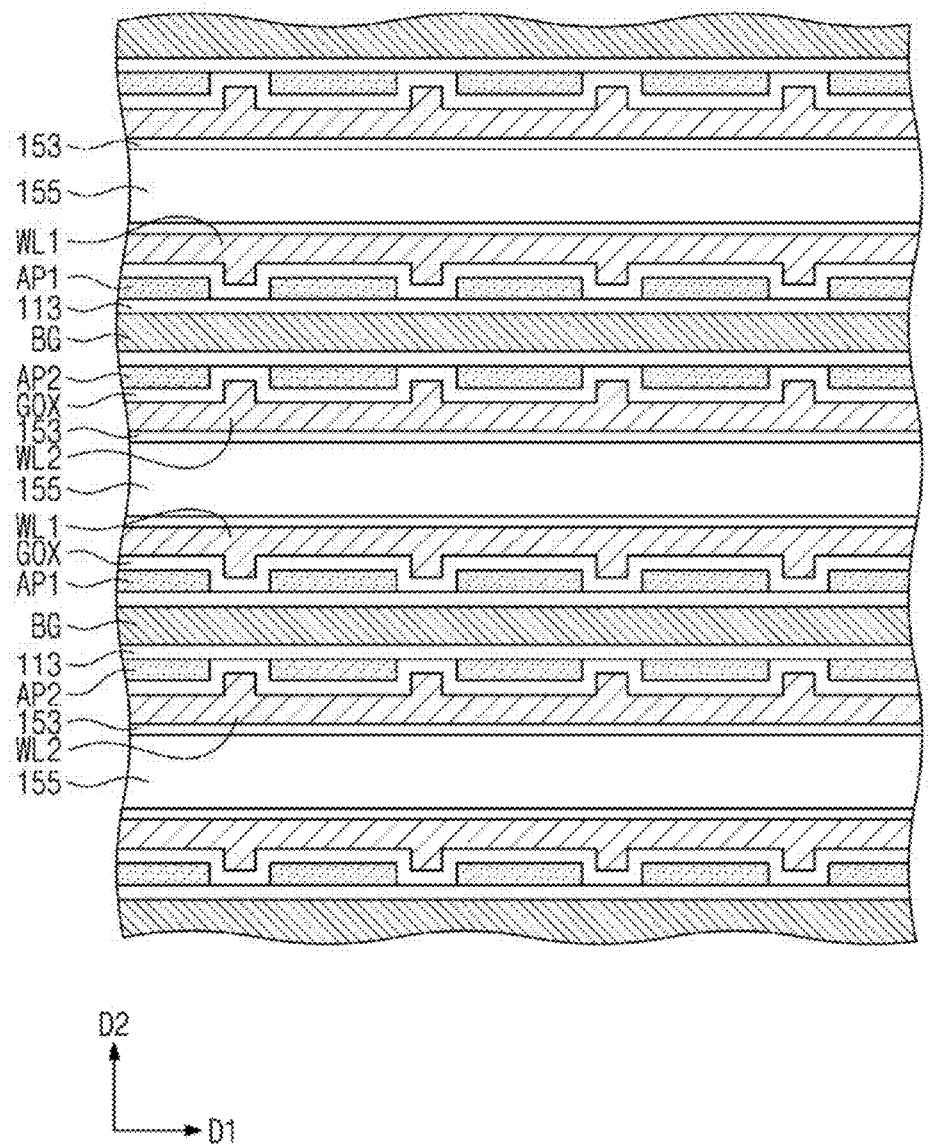
Figure 20B:
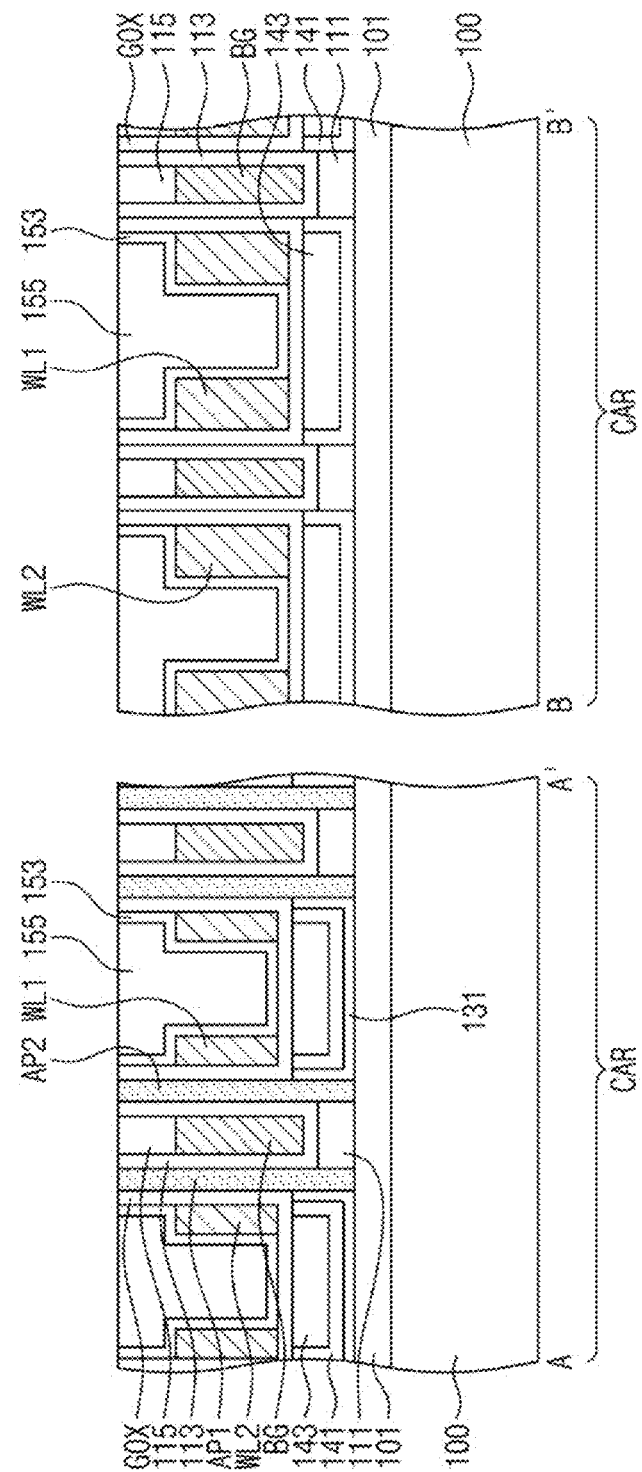
Figure 20C:
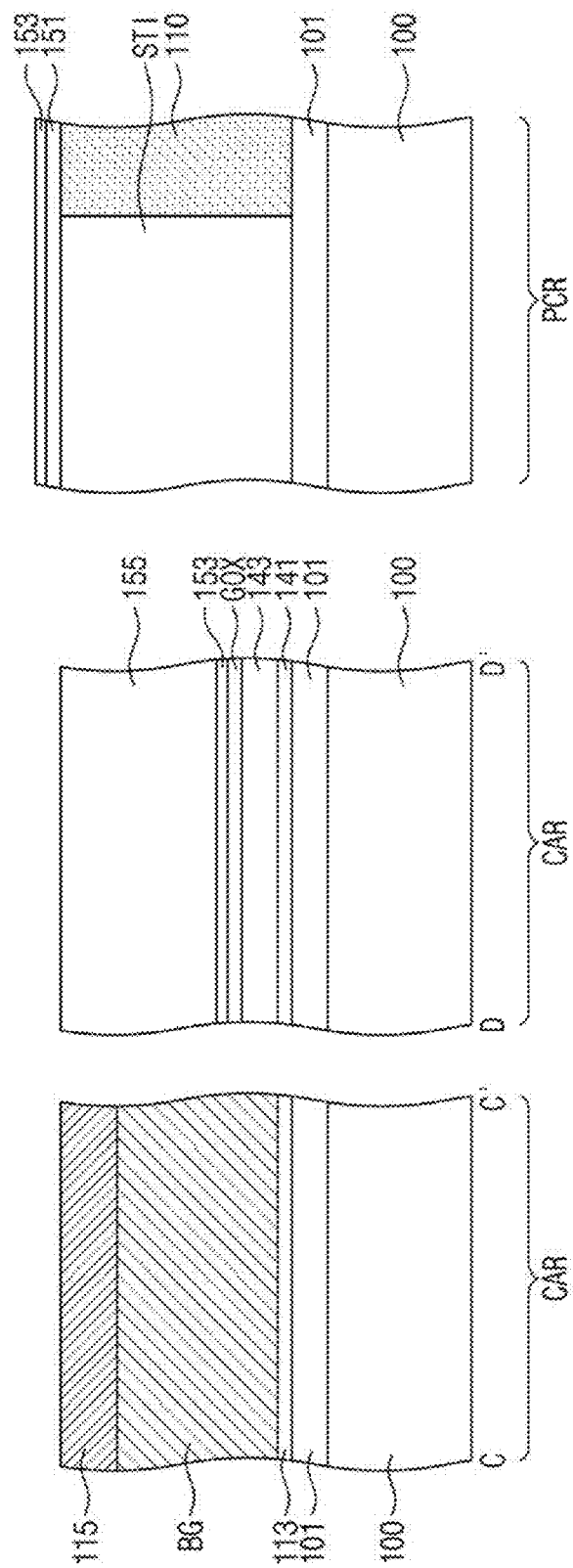

Referring to FIGS. 20A, 20B, and 20C, a first capping layer 153 and a third insulating layer 155 may be sequentially formed in the second trench T2 provided with the first and second word lines WL1 and WL2.

In detail, the first capping layer 153 may be conformally deposited on the first substrate 100. In some example embodiments, the first capping layer 153 may be formed of or include at least one of silicon nitride (SiN), silicon oxynitride (SiON), silicon carbide (SiC), silicon carbon nitride (SiCN), or combinations thereof. The first capping layer 153 may be disposed to cover surfaces of the word lines WL1 and WL2.

Thereafter, the third insulating layer 155 may be deposited to fill the second trench T2 provided with the first capping layer 153. Here, the third insulating layer 155 may be formed of an insulating material different from the first capping layer 153. Next, a planarization process may be performed on the third insulating layer 155 and the first capping layer 153 to expose the top surfaces of the back-gate capping patterns 115. Thus, the top surfaces of the first and second active patterns AP1 and AP2 may be exposed.

Meanwhile, before the formation of the third insulating layer 155, a mask pattern (not shown) exposing the cell array region CAR may be formed on the first capping layer 153 of the peripheral circuit region PCR, and in this case, the third insulating layer 155 may not be formed in the peripheral circuit region PCR.

Figure 21A:
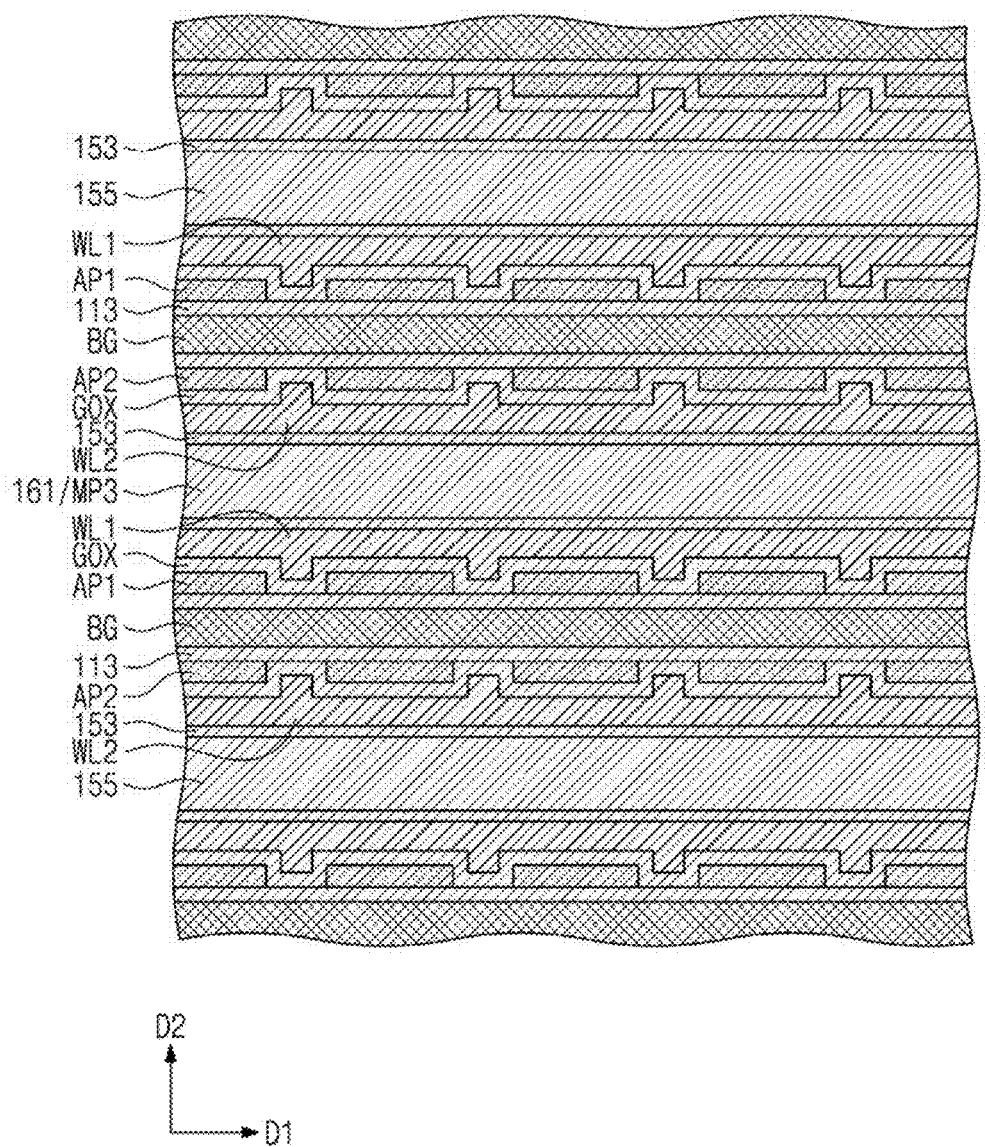
Figure 21B:
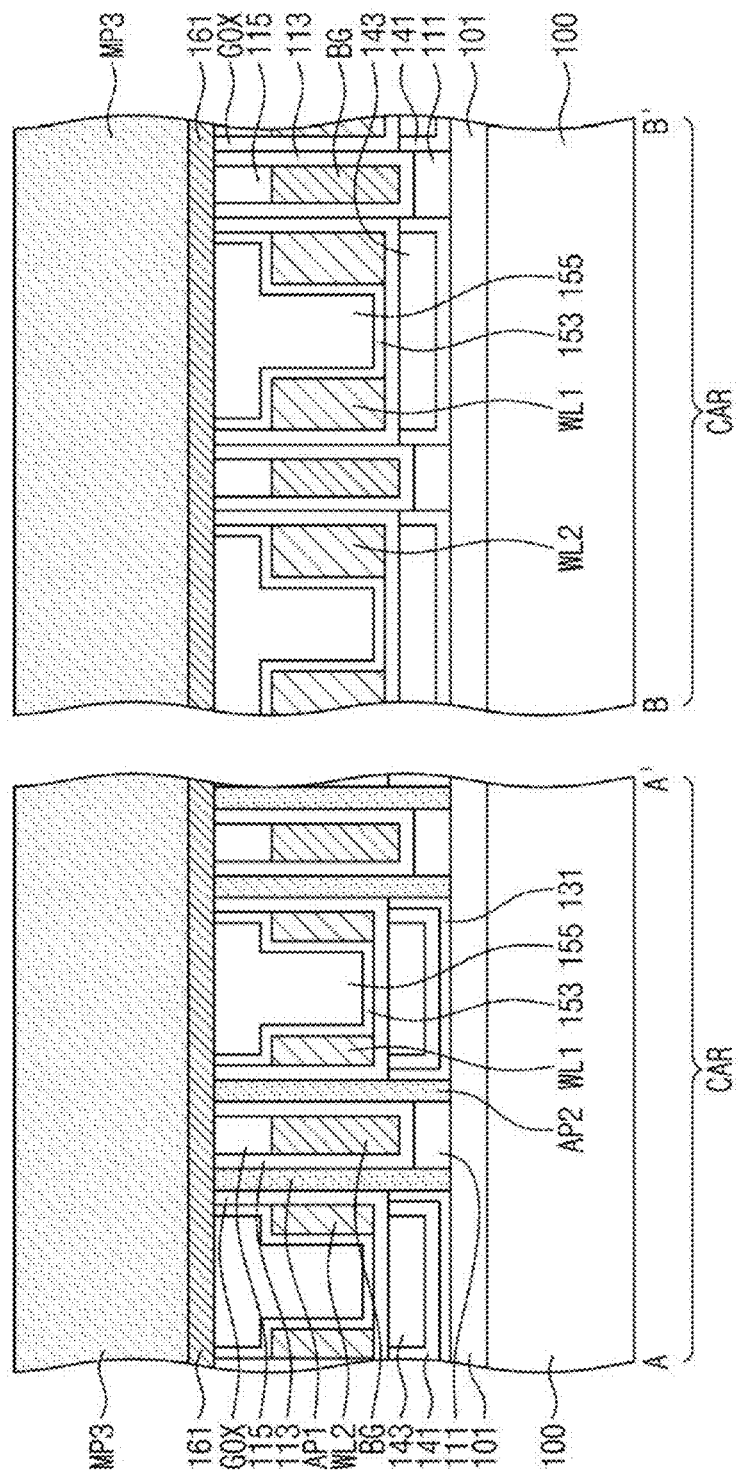
Figure 21C:
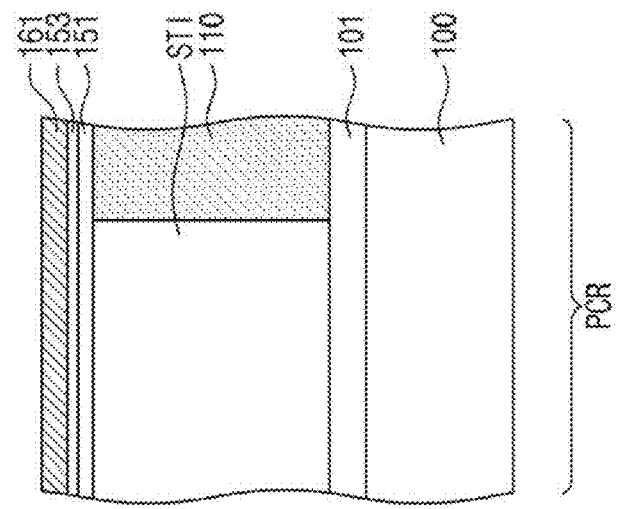
Figure 21C:
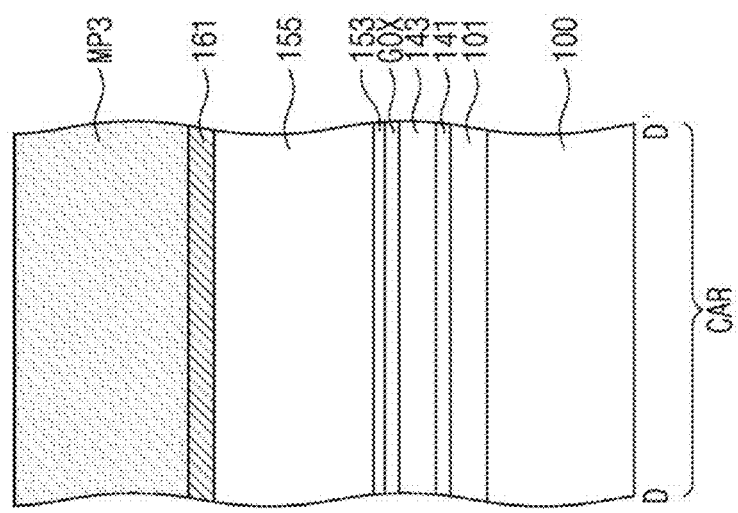
Figure 21C:
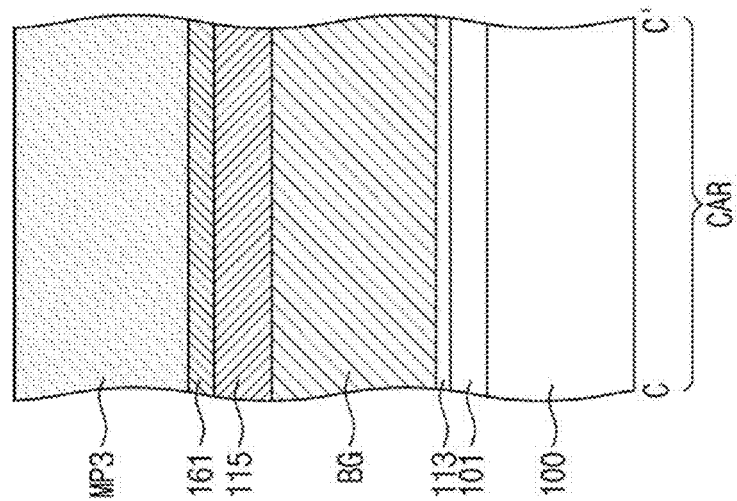

Referring to FIGS. 21A, 21B, and 21C, a poly-silicon layer 161 may be deposited on the first substrate 100. The poly-silicon layer 161 may be in contact with the top surfaces of the first and second active patterns AP1 and AP2 in the cell array region CAR and may be deposited on the first capping layer 153 in the peripheral circuit region PCR.

Thereafter, a third mask pattern MP3 exposing the peripheral circuit region PCR may be formed on the poly-silicon layer 161.

Figure 22A:
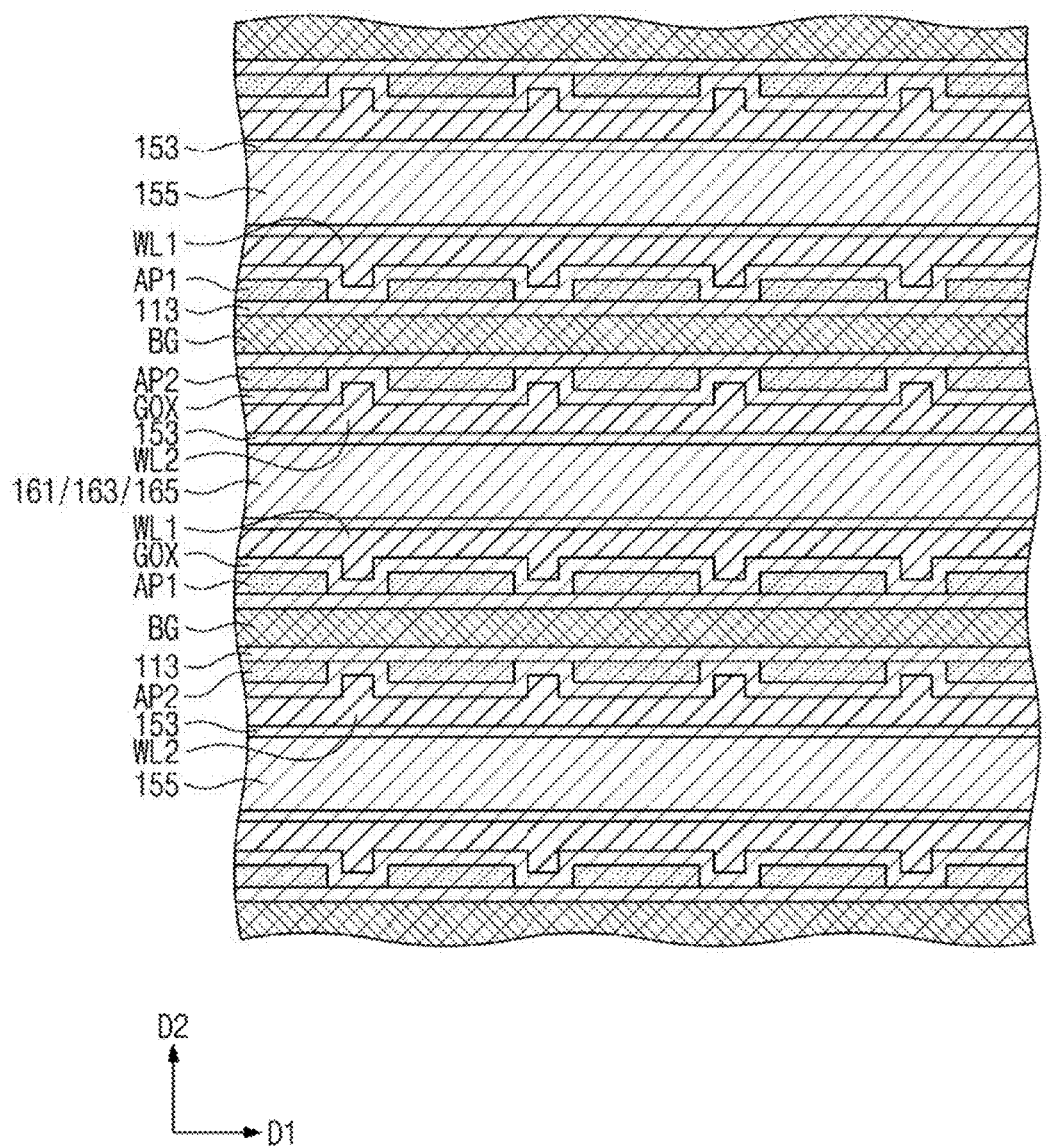
Figure 22B:
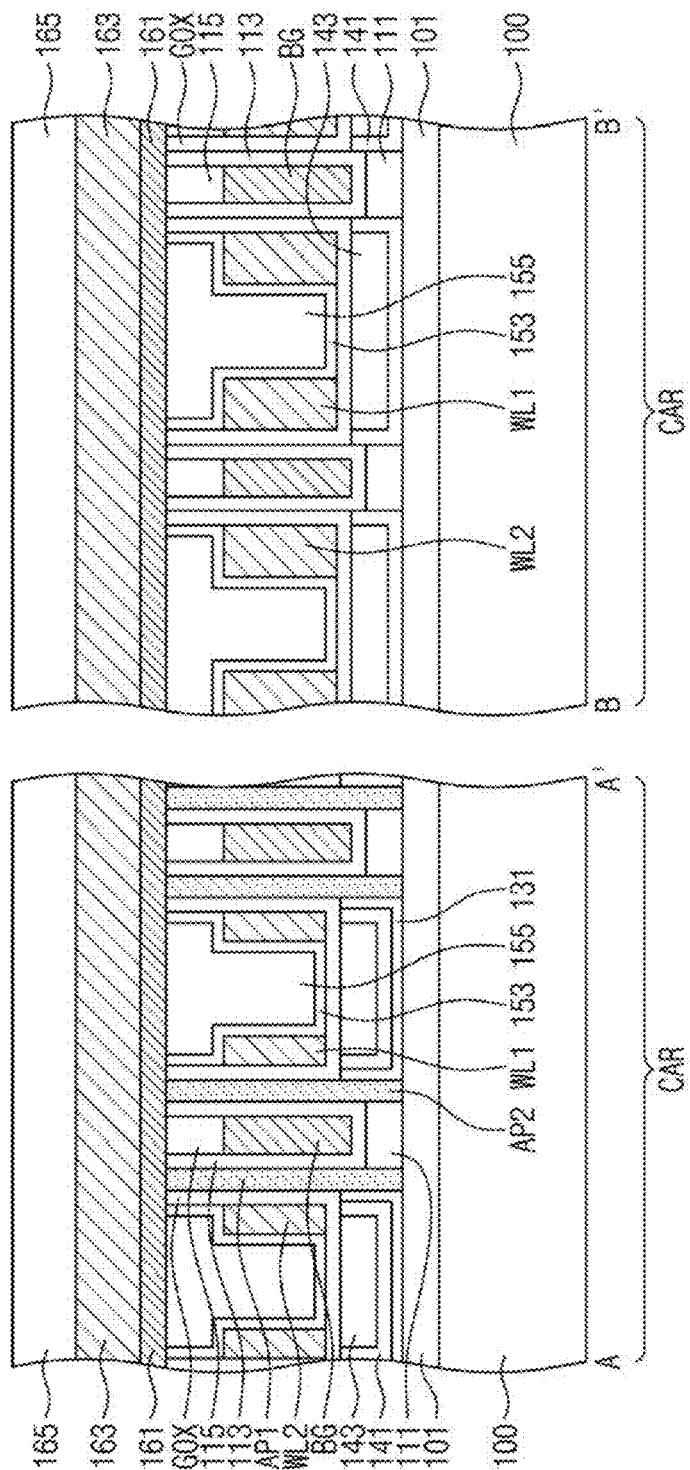
Figure 22C:
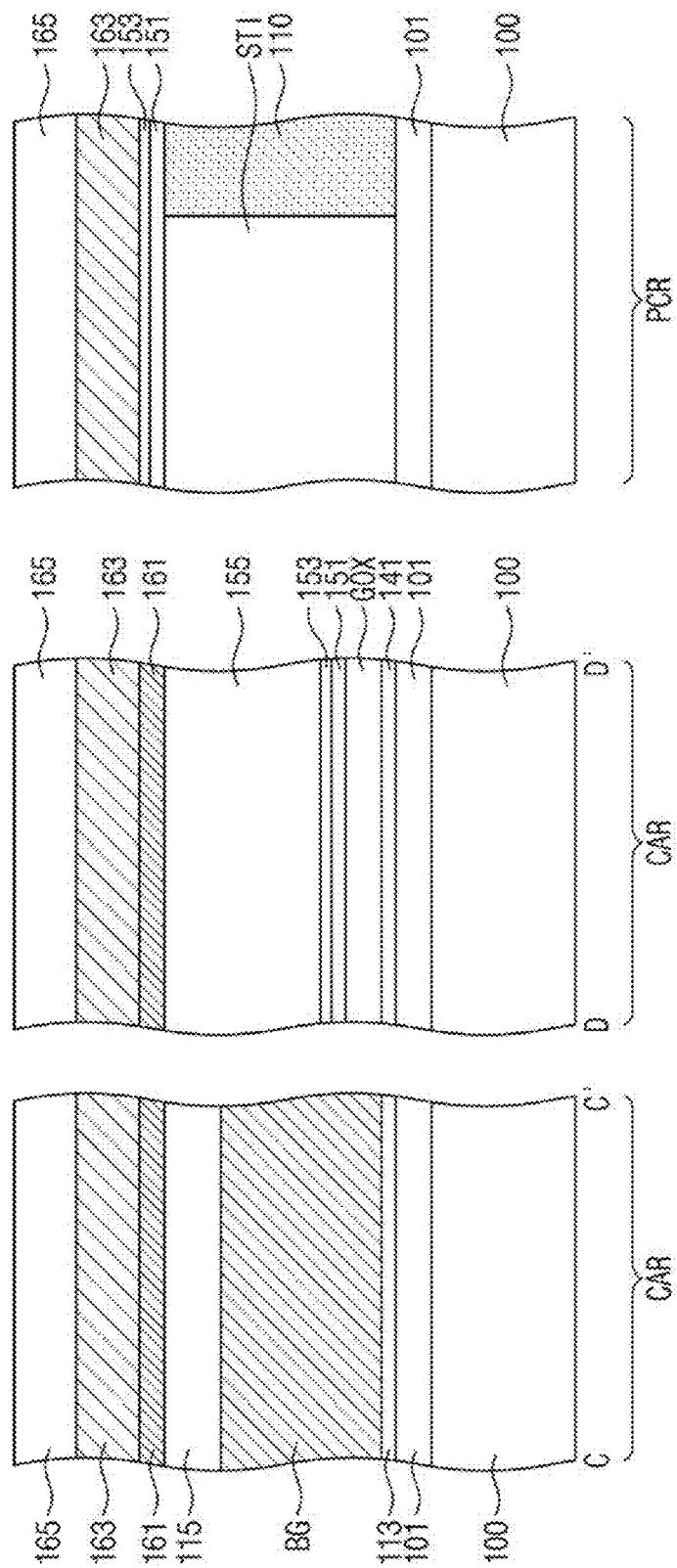

Referring to FIGS. 22A, 22B, and 22C, the first capping layer 153 may be exposed by anisotropically etching the poly-silicon layer 161 of the peripheral circuit region PCR using the third mask pattern MP3 as an etch mask.

Next, a metal layer 163 and a hard mask layer 165 may be sequentially formed on the poly-silicon layer 161 of the cell array region CAR and on the first capping layer 153 of the peripheral circuit region PCR.

The metal layer 163 may be formed by depositing at least one of conductive metal nitride materials (e.g., titanium nitride and tantalum nitride) or metallic materials (e.g., tungsten, titanium, and tantalum). The hard mask layer 165 may be formed by depositing an insulating material (e.g., silicon nitride or silicon oxynitride).

Figure 23A:
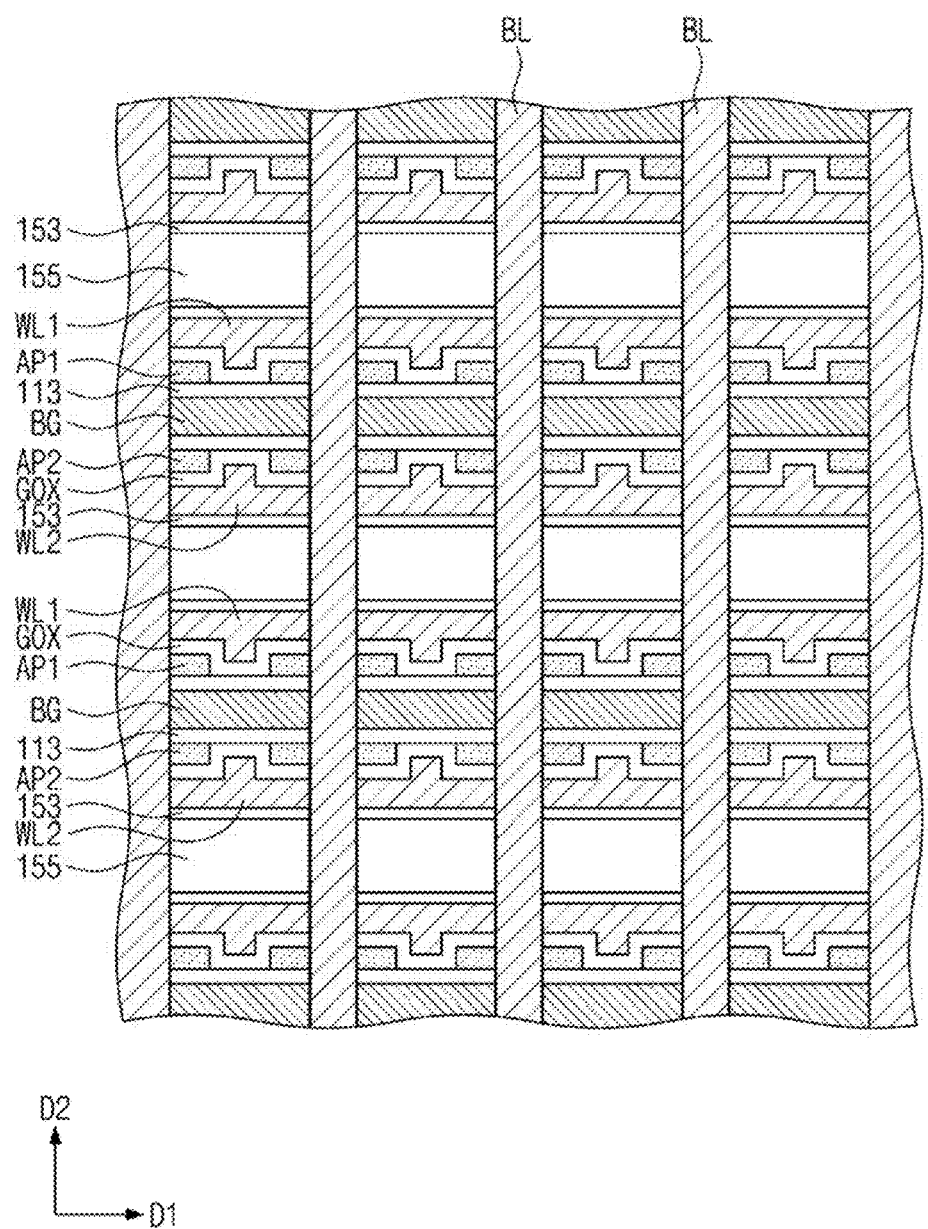
Figure 23B:
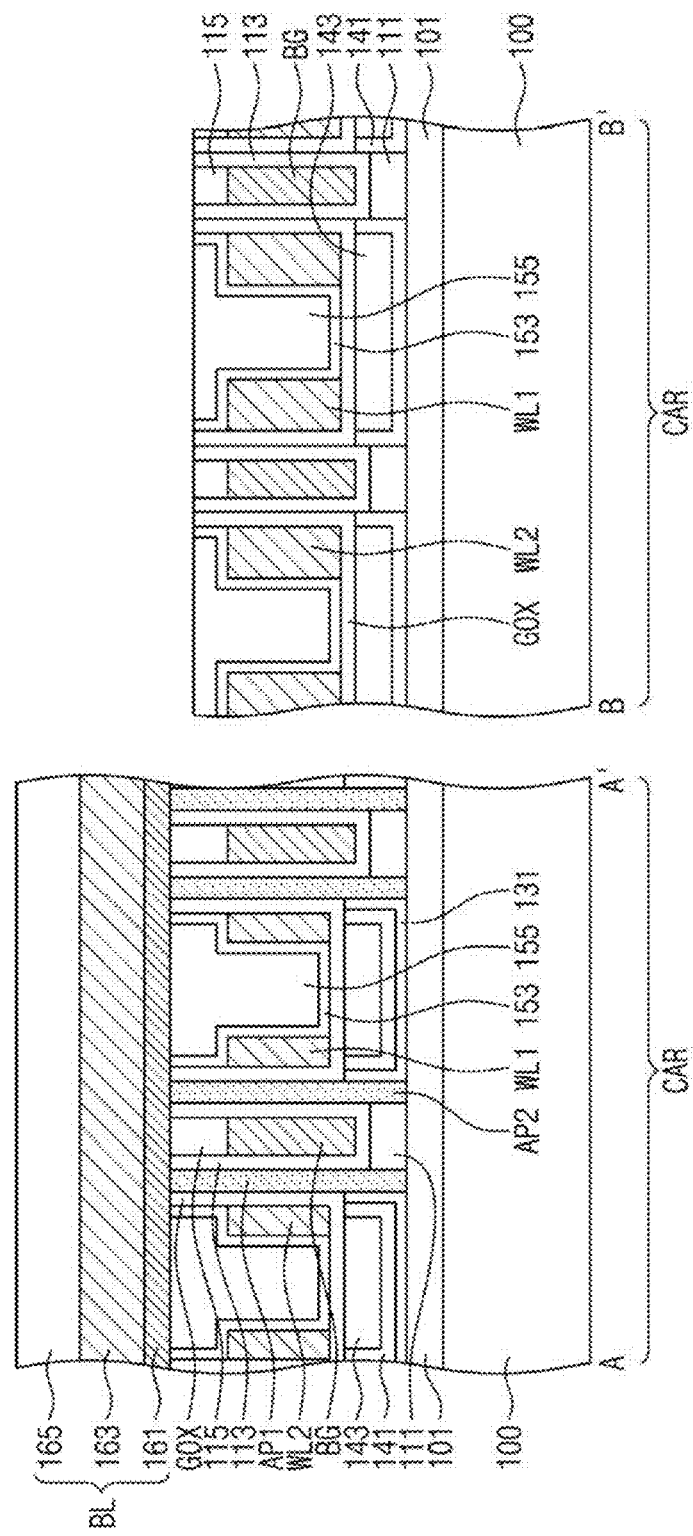
Figure 23C:
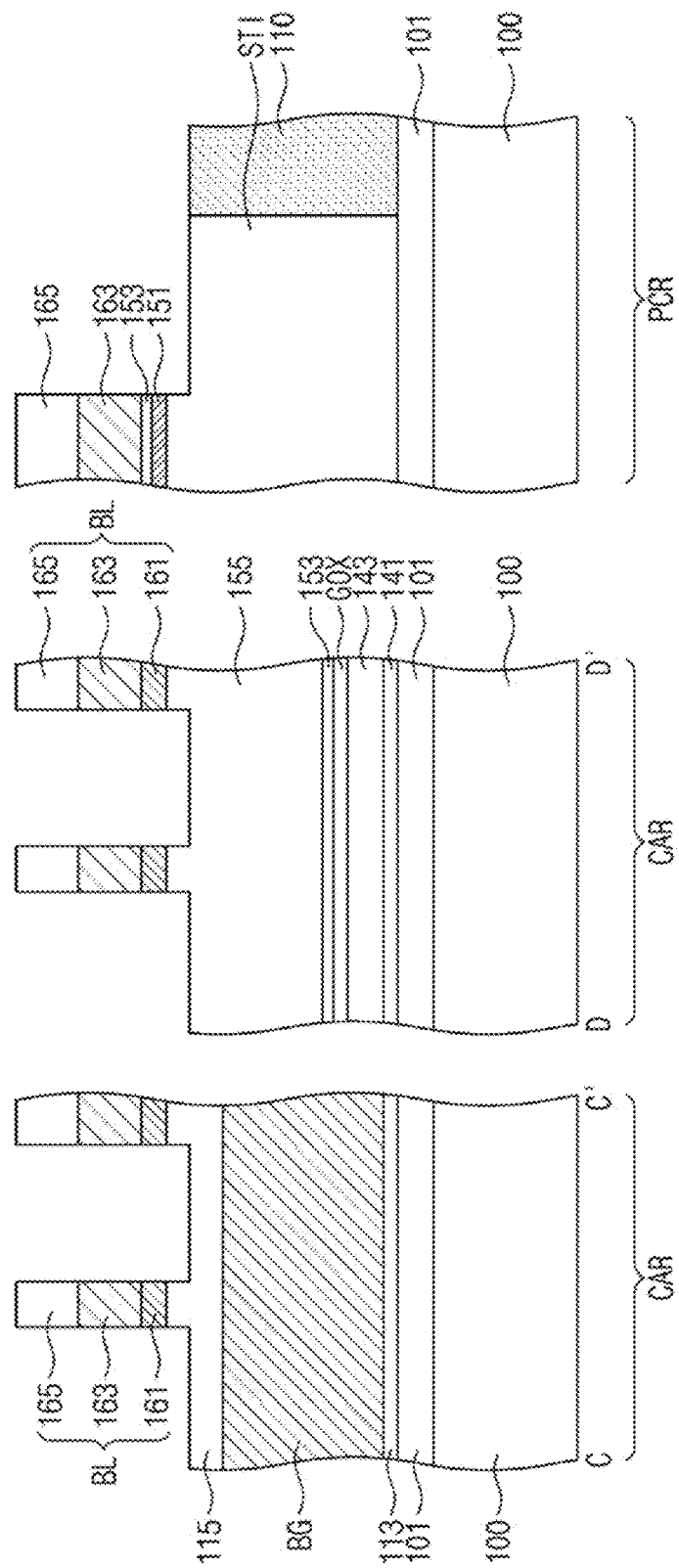

Referring to FIGS. 23A, 23B, and 23C, a mask pattern (not shown) may be formed on the hard mask layer 165 to have a line shape extending in the second direction D2, and then, the hard mask layer 165, the metal layer 163, and the poly-silicon layer 161 may be sequentially and anisotropically etched using the mask pattern. Thus, the bit lines BL, which are extended in the second direction D2, may be formed (in S50 of FIG. 9).

When the bit lines BL are formed, portions of the back-gate capping pattern 115 may be etched. In addition, when the bit lines BL are formed, the hard mask layer 165, the metal layer 163, the first capping layer 153, and the gate insulating layer 151 on the peripheral circuit region PCR may be etched to expose a portion of the device isolation layer STI and the active layer 110.

Figure 24A:
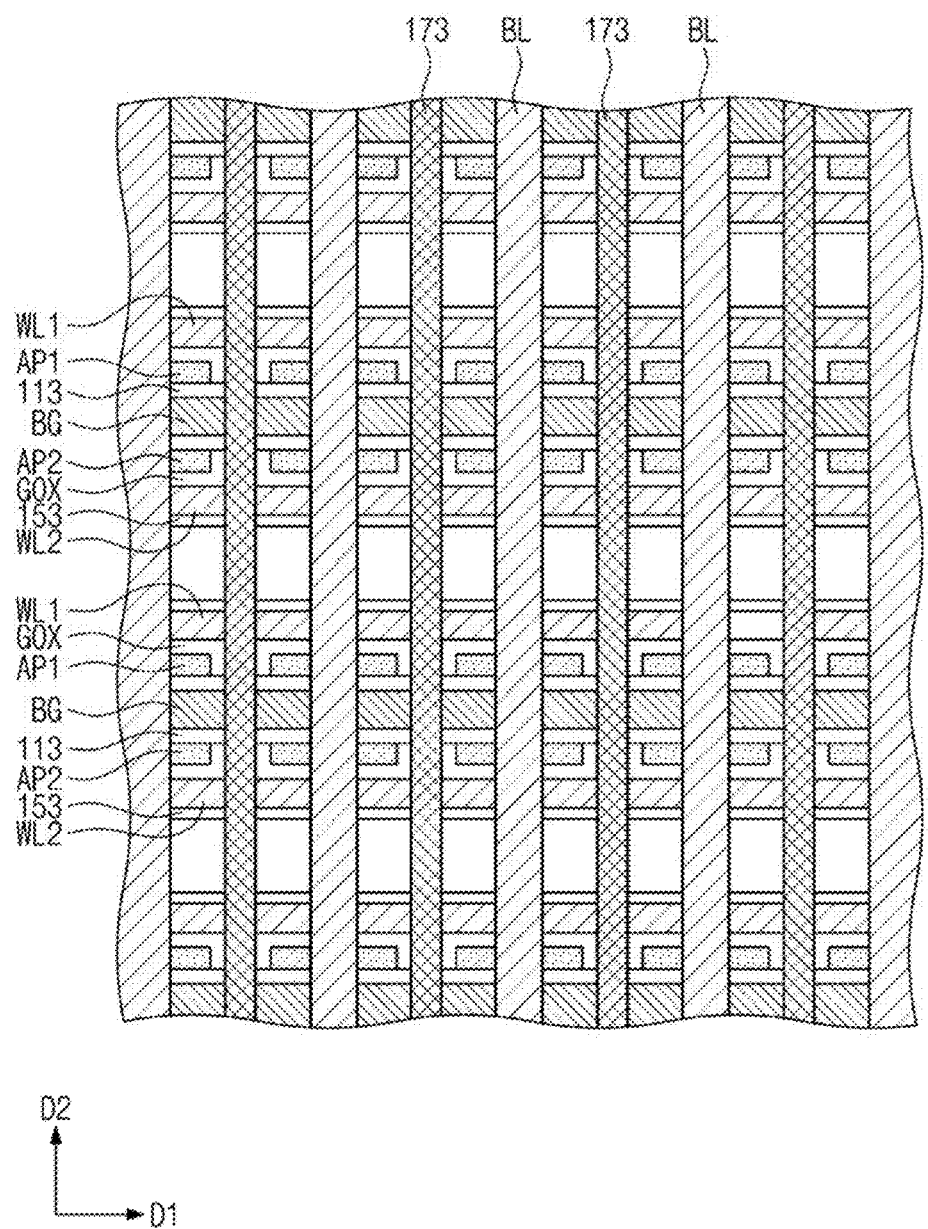
Figure 24B:
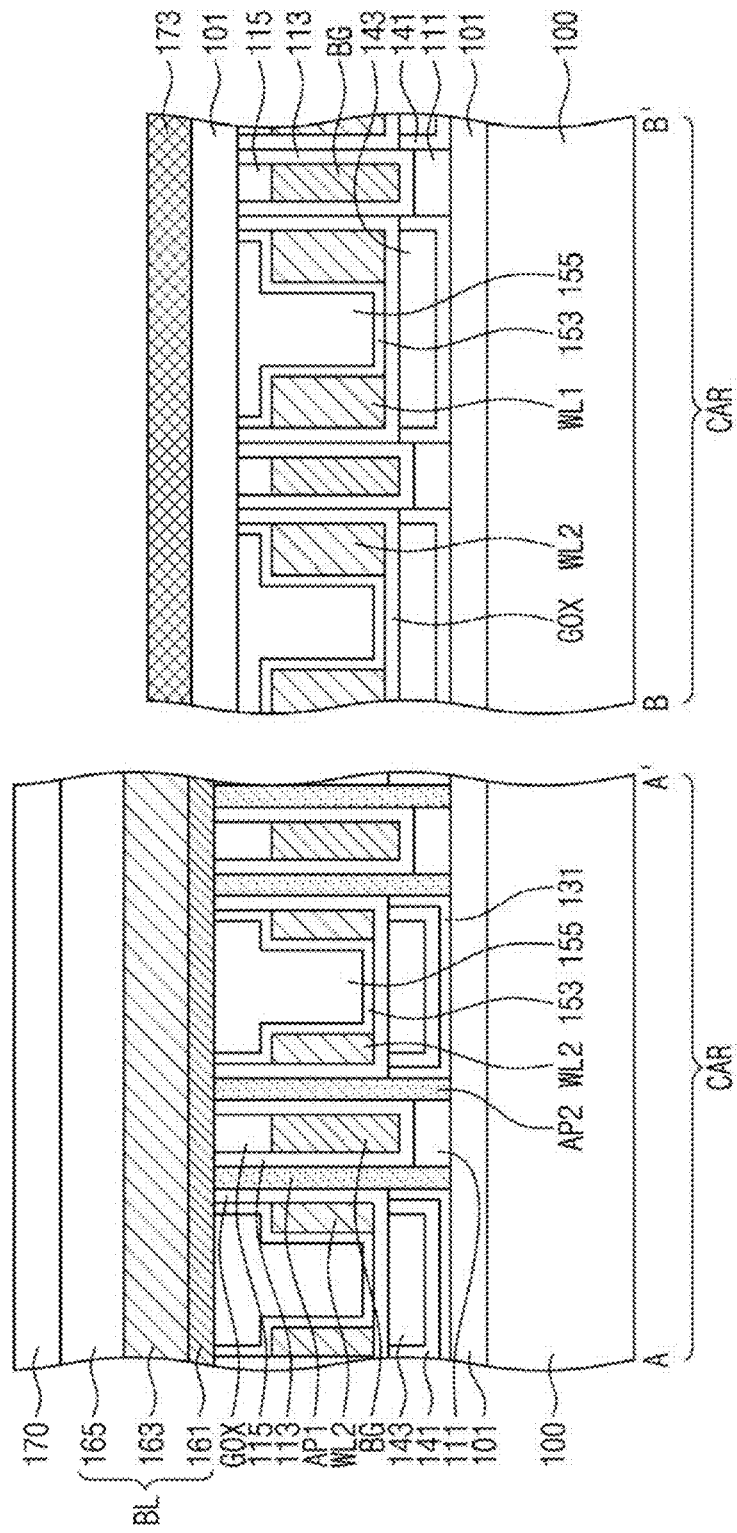
Figure 24C:
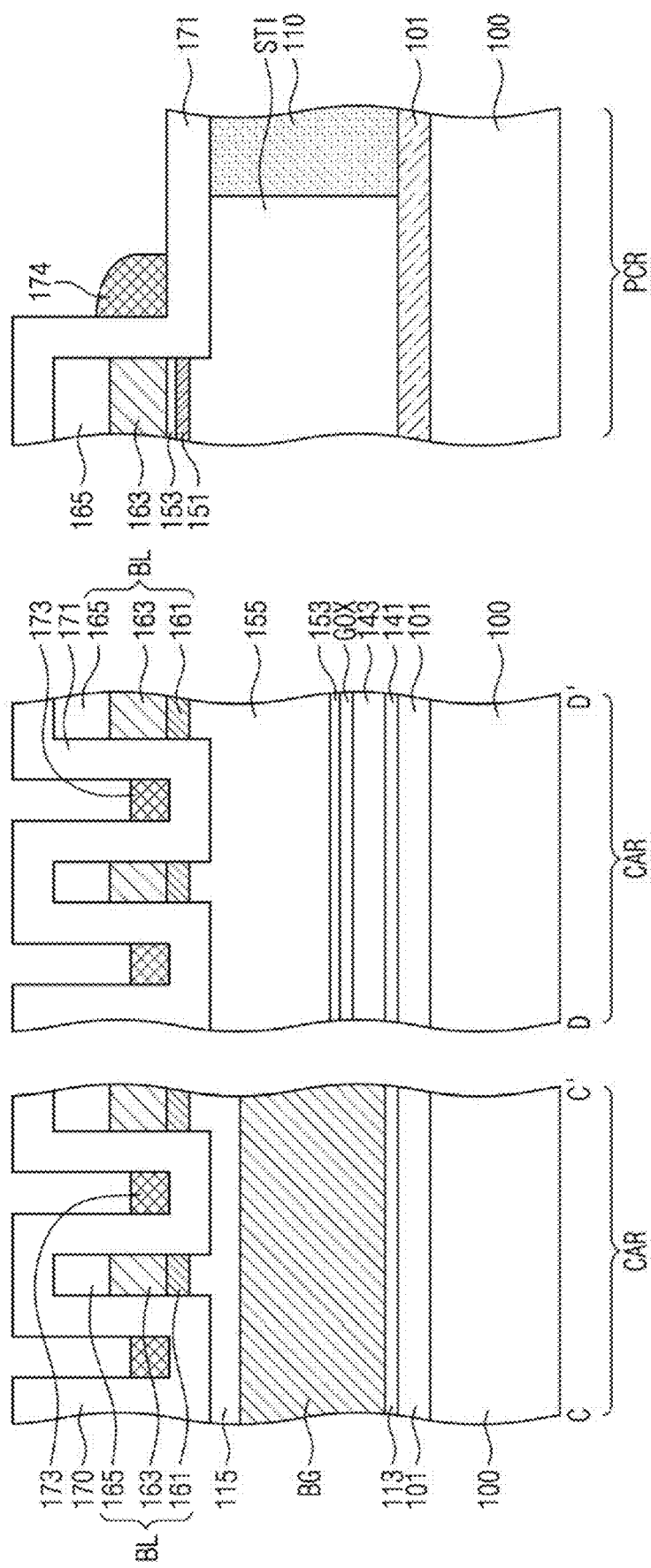

Referring to FIGS. 24A, 24B, and 24C, a third insulating layer 170 may be formed to define a gap region between the bit lines BL, after the formation of the bit lines BL.

The third insulating layer 170 may be deposited on the first substrate 100 to have a substantially uniform thickness. A deposition thickness of the third insulating layer 170 may be smaller than half a distance between the bit lines BL, which are adjacent to each other. In this case, a gap region, which is defined by the third insulating layer 170, may be formed between the bit lines BL. The gap region may be extended in the second direction D2 to be parallel to the bit lines BL.

After the formation of the third insulating layer 170, a shielding line, which is formed of a conductive material, or the gap structures 173, which include an insulating material, may be formed in the gap regions of the third insulating layer 170 (in S60 of FIG. 9).

The gap structures 173 may be formed between the bit lines BL, respectively. As an example, the formation of the gap structures 173 may include forming a shielding layer on the third insulating layer 170 to fill the gap region and recessing the top surface of the shielding layer. Top surfaces of the gap structures 173 may be located at a level lower than top surfaces of the bit lines BL. When the shielding layer is deposited on the third insulating layer 170 using a chemical vapor deposition (CVD) method, a discontinuous interface (e.g., seam) may be formed due to a step coverage property of the CVD process.

The gap structures 173 may be formed of or include a metallic material (e.g., tungsten (W), titanium (Ti), nickel (Ni), or cobalt (Co)). In some example embodiments, the gap structures 173 may be formed of or include a two-dimensional (2D) conductive material (e.g., graphene). The gap structures 173 may be formed of or include a low-k dielectric material whose dielectric constant is lower than that of the third insulating layer 170.

In some example embodiments, an end portion 174 of the gap structure 173 may be located on the peripheral circuit region PCR, when the gap structures 173 are formed.

Figure 25A:
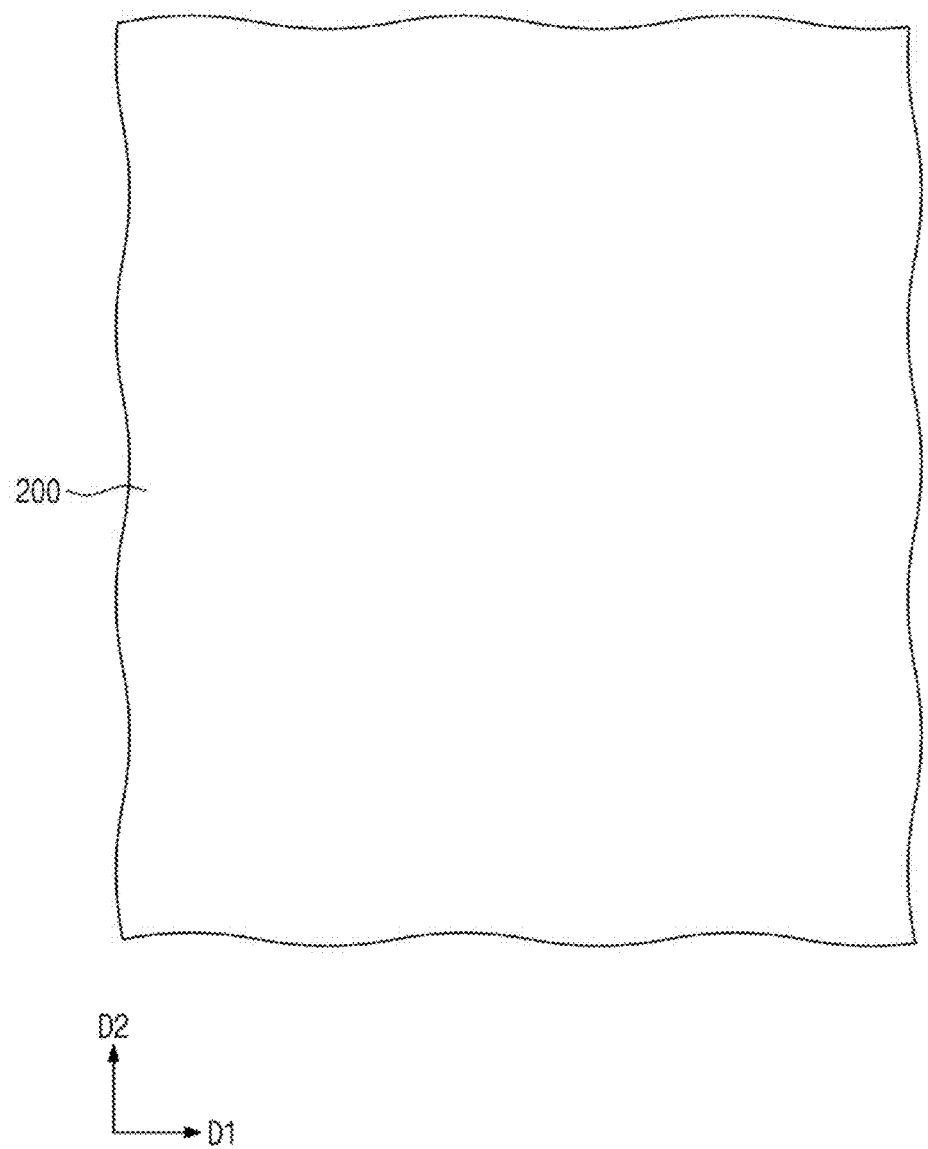
Figure 25B:
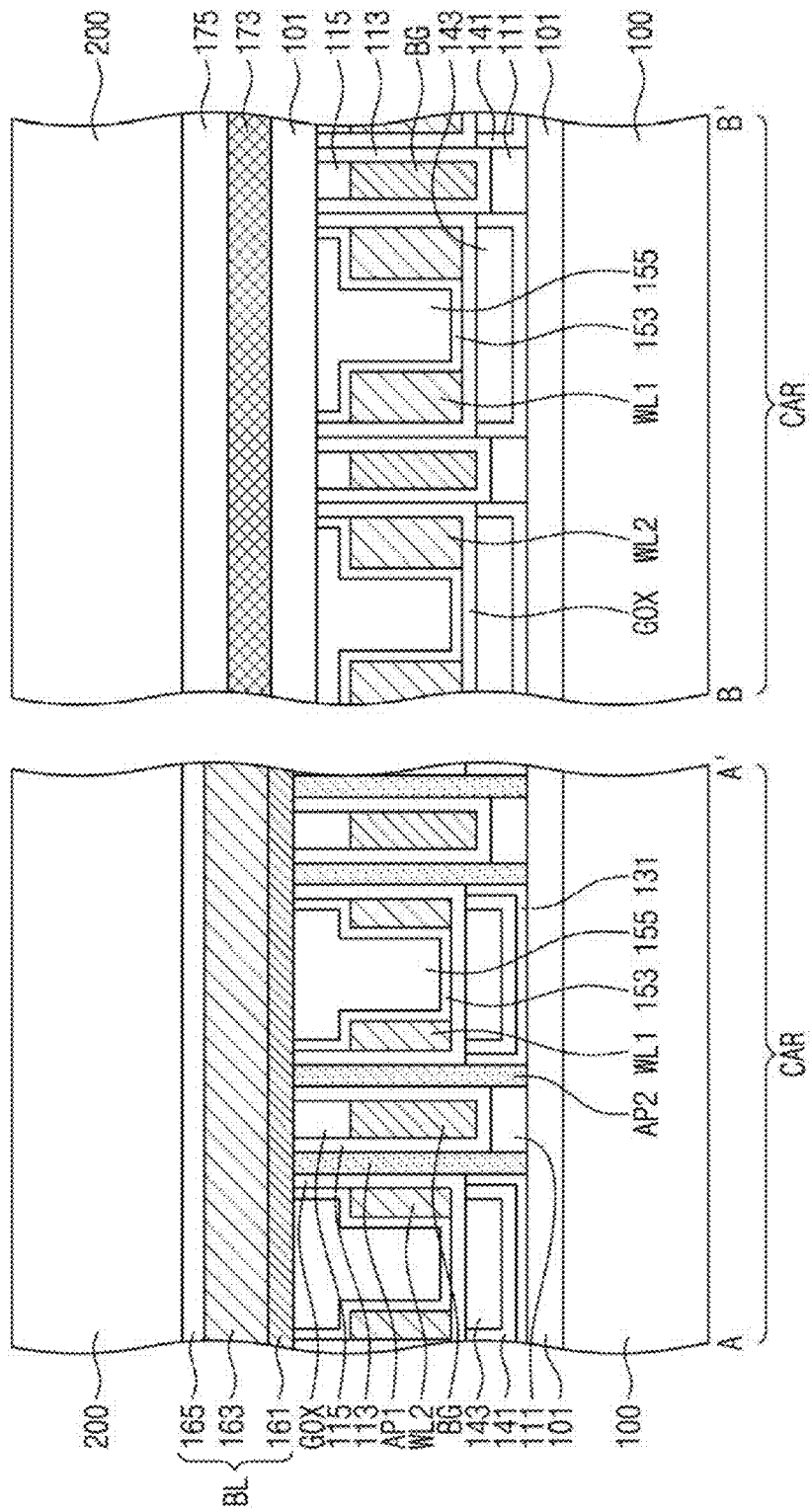
Figure 25C:
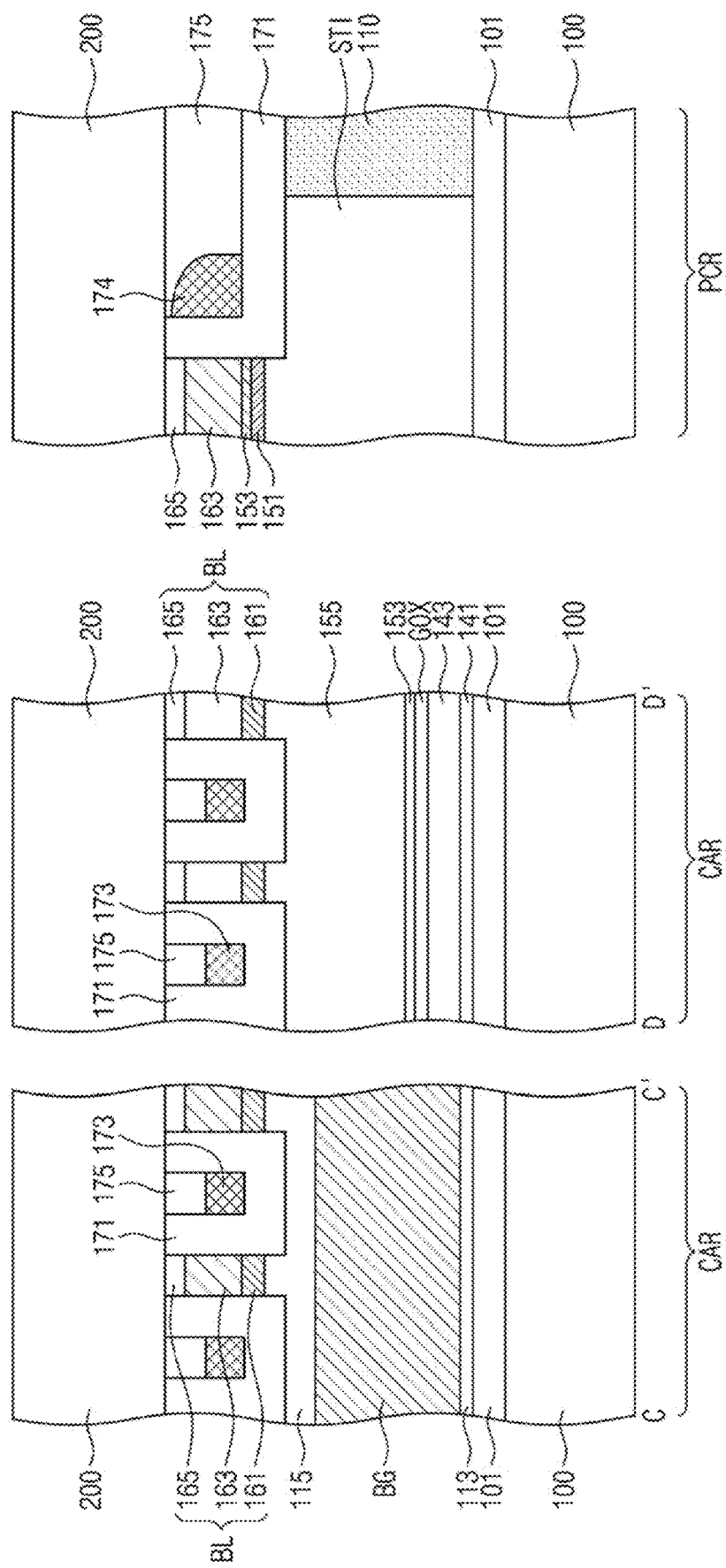

Referring to FIGS. 25A, 25B, and 25C, second line insulating layers 175 may be formed on the gap structures 173, after the formation of the gap structures 173. In addition, the second line insulating layers 175 may cover the end portion 174 of the gap structure 173 on the peripheral circuit region PCR.

The formation of the second line insulating layers 175 may include forming a capping insulating layer to fill the gap regions provided with the gap structures 173 and performing a planarization process on the capping insulating layer and the third insulating layer 170 to expose the top surfaces of the bit lines BL (i.e., a top surface of the hard mask layer 165). Herein, an upper portion of the third insulating layer 170 may be etched to form the first line insulating pattern 171 by the planarization process.

In some example embodiments, the formation of the gap structures 173 may be omitted, and in the case where a deposition method having a poor step coverage property is used to form the capping insulating layer, a void or air gap may be formed in the gap region, due to an over-hang phenomenon.

Next, the first substrate 100, on which the back-gate electrodes BG, the word lines WL1 and WL2, the active patterns AP1 and AP2, and the bit lines BL are formed, may be bonded to a second substrate 200 (in S70 of FIG. 9).

The second substrate 200 may be bonded to the top surfaces of the bit lines BL (i.e., the top surface of the hard mask layer 165) and the top surfaces of the second line insulating layers 175 using an adhesive layer. The second substrate 200 may be formed of or include single-crystalline silicon or glass (e.g., quartz).

Figure 26A:
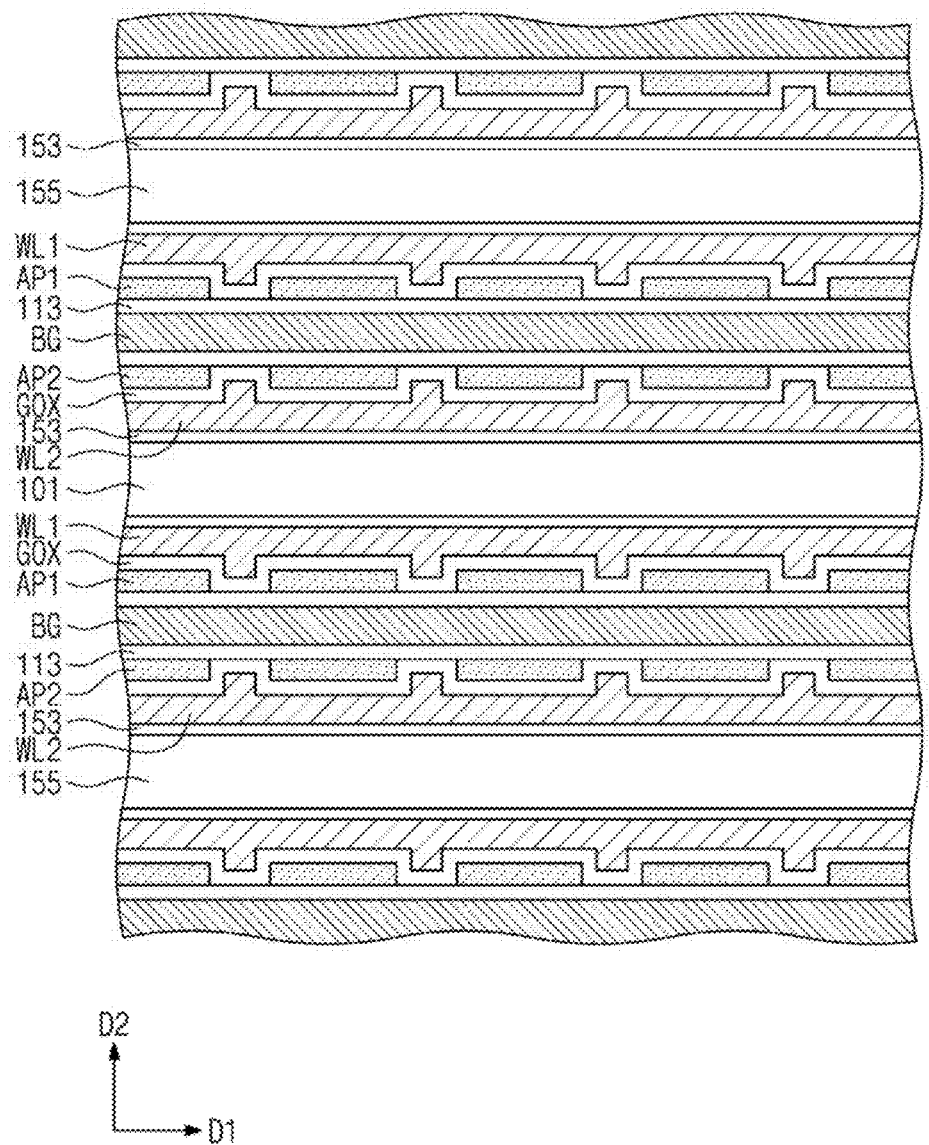
Figure 26B:
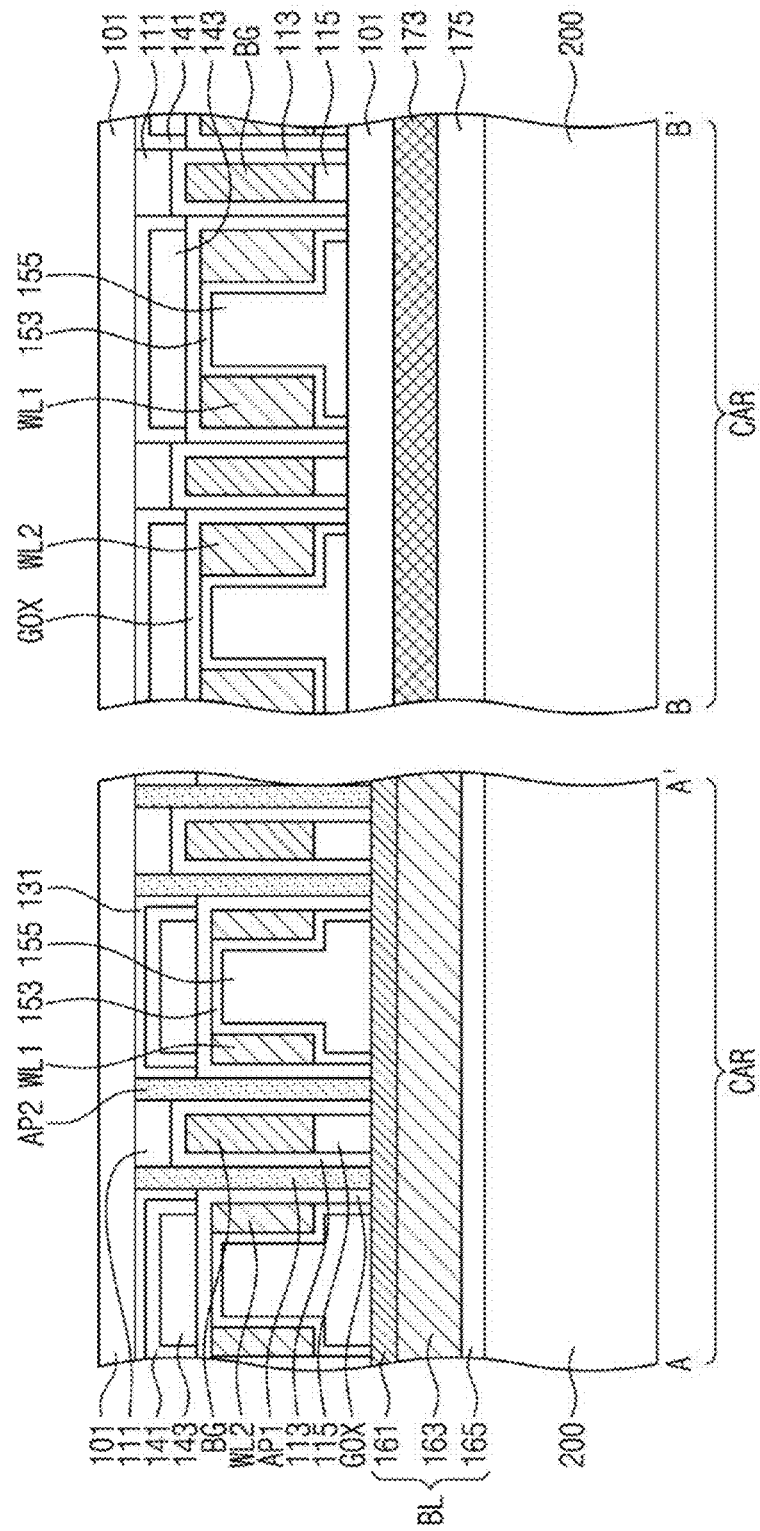
Figure 26C:
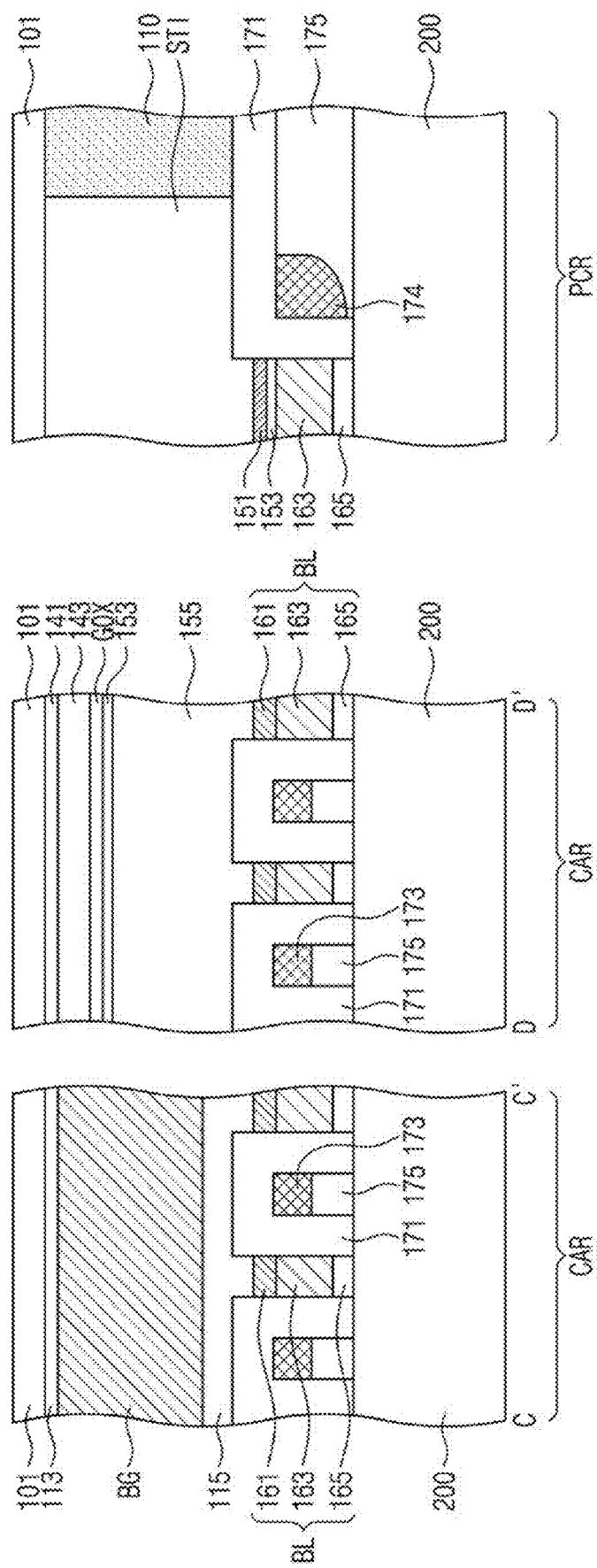

Referring to FIGS. 26A, 26B, and 26C, after the bonding of the second substrate 200, a back-side lapping process may be performed to remove the first substrate 100 (in S80 of FIG. 9). The removal of the first substrate 100 may include sequentially performing a grinding process and a wet etching process to expose the gapfill insulating layer 101.

Figure 27A:
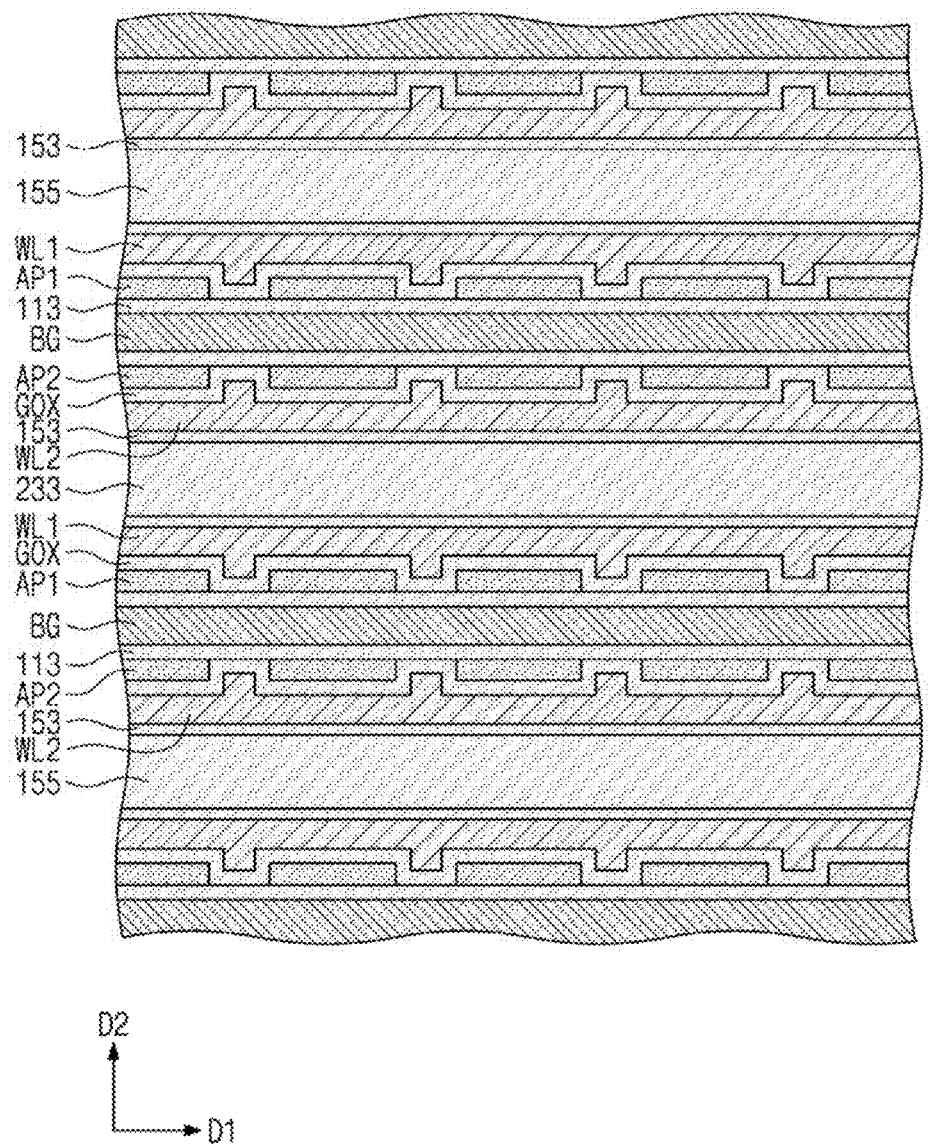
Figure 27B:
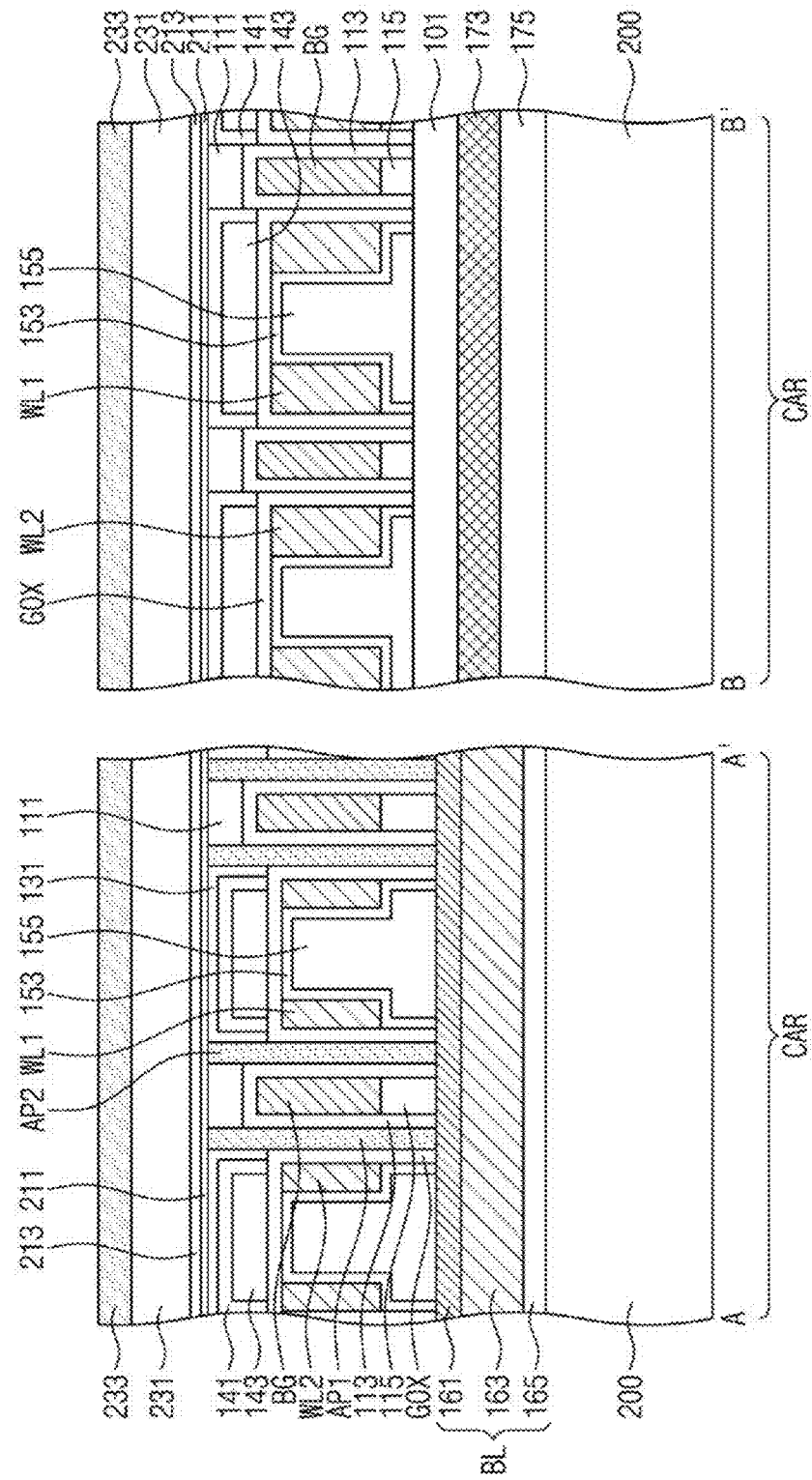
Figure 27C:
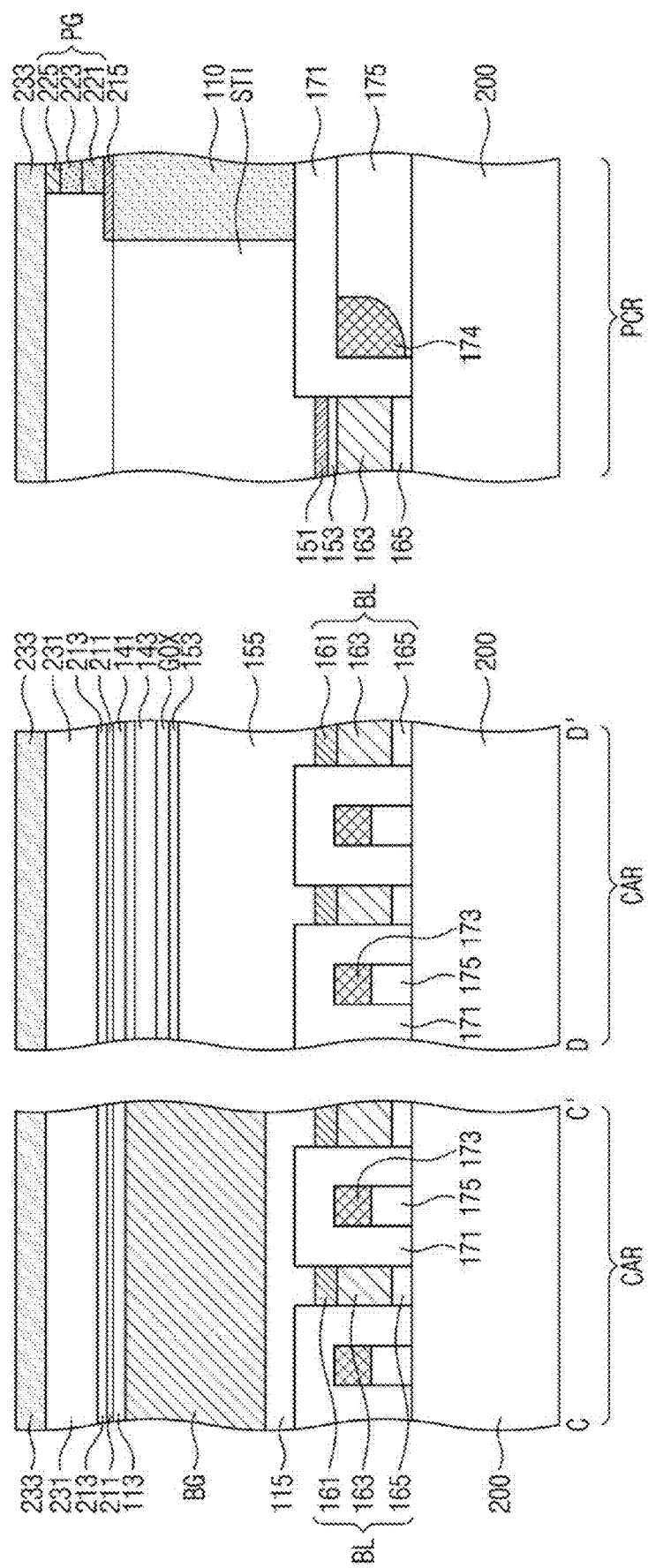

Thereafter, referring to FIGS. 27A, 27B, and 27C, the gapfill insulating layer 101 may be removed, and thus, the active patterns AP1 and AP2, the first insulating patterns 111, and the back-gate insulating patterns 113 may be exposed to the outside. Furthermore, the second surface of the active layer 110 may be exposed on the peripheral circuit region PCR.

Next, third and fourth etch stop layers 211 and 213 may be sequentially formed on the cell array region CAR. The third etch stop layer 211 may be formed of silicon oxide and may be deposited on the active patterns AP1 and AP2, the first insulating patterns 111, and the back-gate insulating patterns 113. The fourth etch stop layer 213 may be formed of a material (e.g., silicon nitride) having an etch selectivity with respect to the third etch stop layer 211.

Thereafter, a peripheral transistor may be formed on the second surface of the active layer 110 and on the peripheral circuit region PCR (in S90 of FIG. 9). In detail, a peripheral gate insulating layer 215 may be formed on the peripheral circuit region PCR to cover the second surface of the active layer 110, and a peripheral gate electrode PG may be formed on the peripheral gate insulating layer 215. The peripheral gate electrode PG may include a peripheral conductive pattern 221, a peripheral metal pattern 223, and a peripheral hard mask pattern 225, which are sequentially stacked.

An interlayer insulating layer 231 and an etch stop layer 233 may be formed on the cell array region CAR and the peripheral circuit region PCR. The interlayer insulating layer 231 may be formed by depositing an insulating material and planarizing the insulating material to expose a top surface of the peripheral gate electrode PG. The etch stop layer 233 may be formed of an insulating material having an etch selectivity with respect to the interlayer insulating layer 231.

Figure 28A:
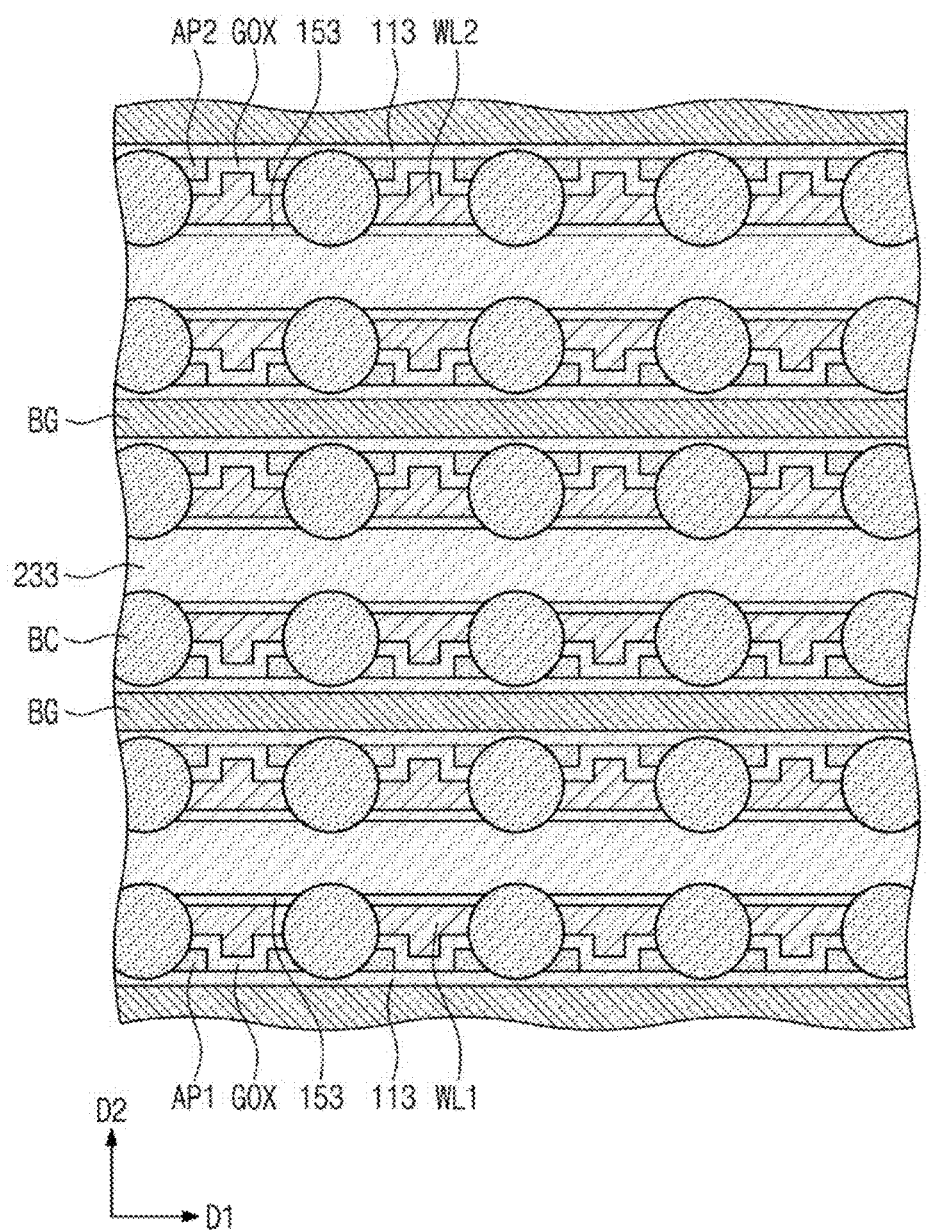
Figure 28B:
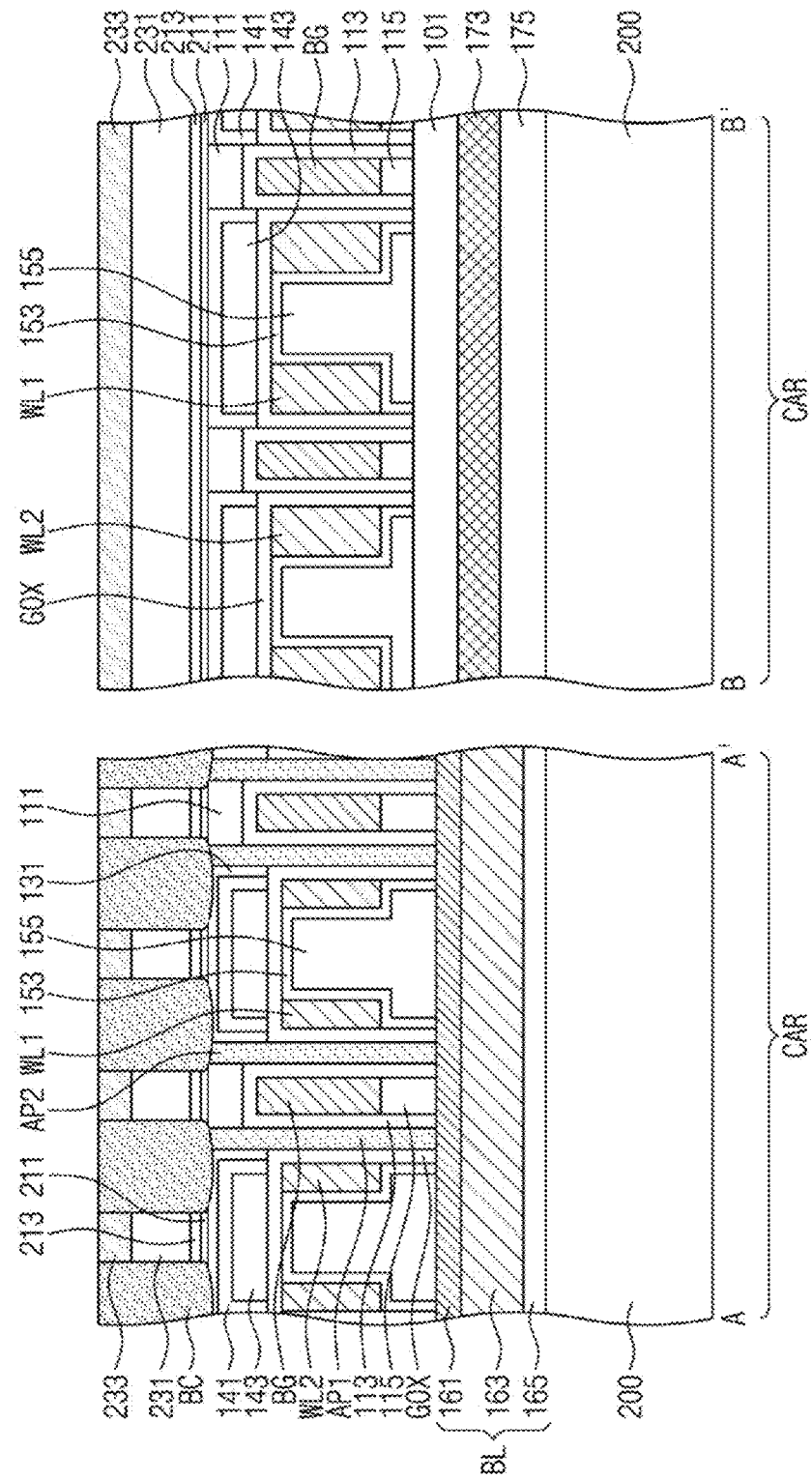
Figure 28C:
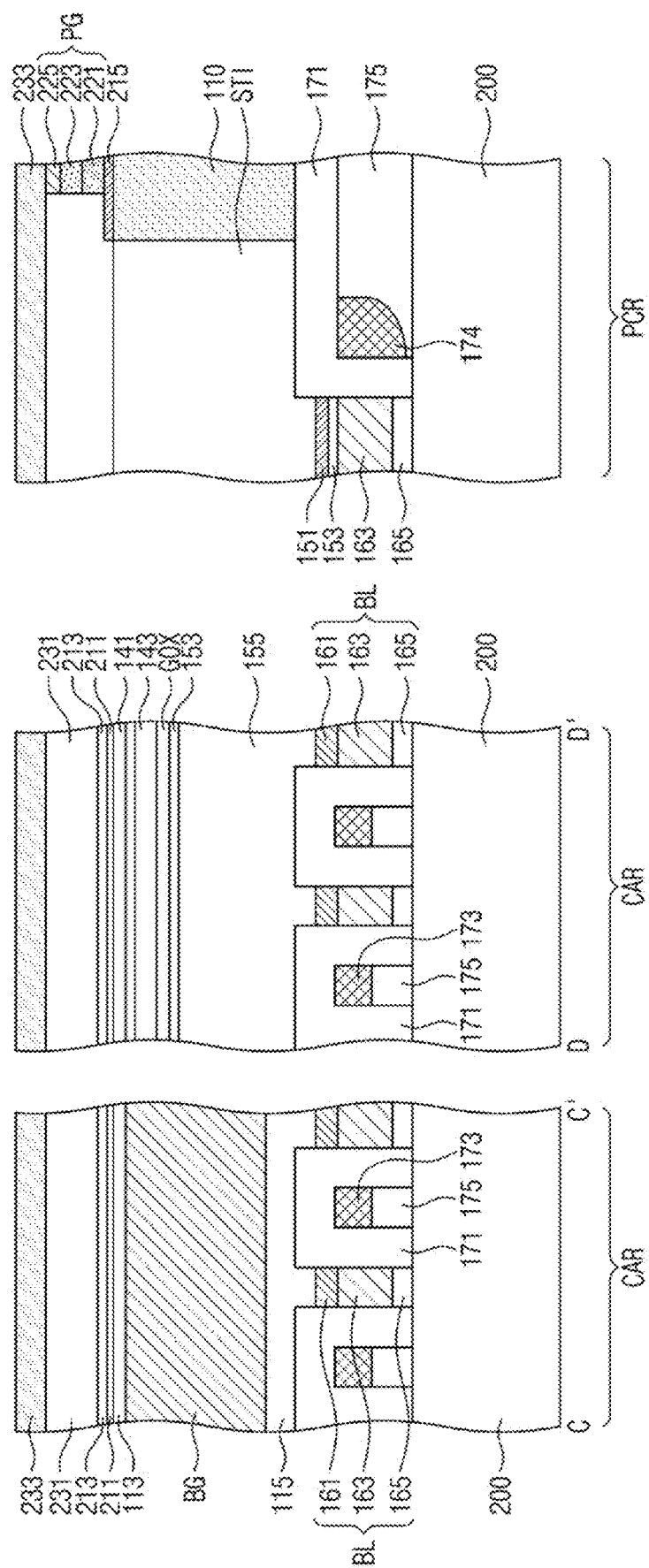

Thereafter, referring to FIGS. 28A, 28B, and 28C, contact patterns BC may be formed to penetrate the interlayer insulating layer 231 and the etch stop layer 233 and to be connected to the first and second active patterns AP1 and AP2 (in S100 of FIG. 9).

The formation of the contact patterns BC may include patterning the interlayer insulating layer 231 and the etch stop layer 233 to form holes exposing the first and second active patterns AP1 and AP2, respectively, depositing a conductive layer to fill the holes, and planarizing the conductive layer to expose a top surface of the etch stop layer 233.

Figure 29A:
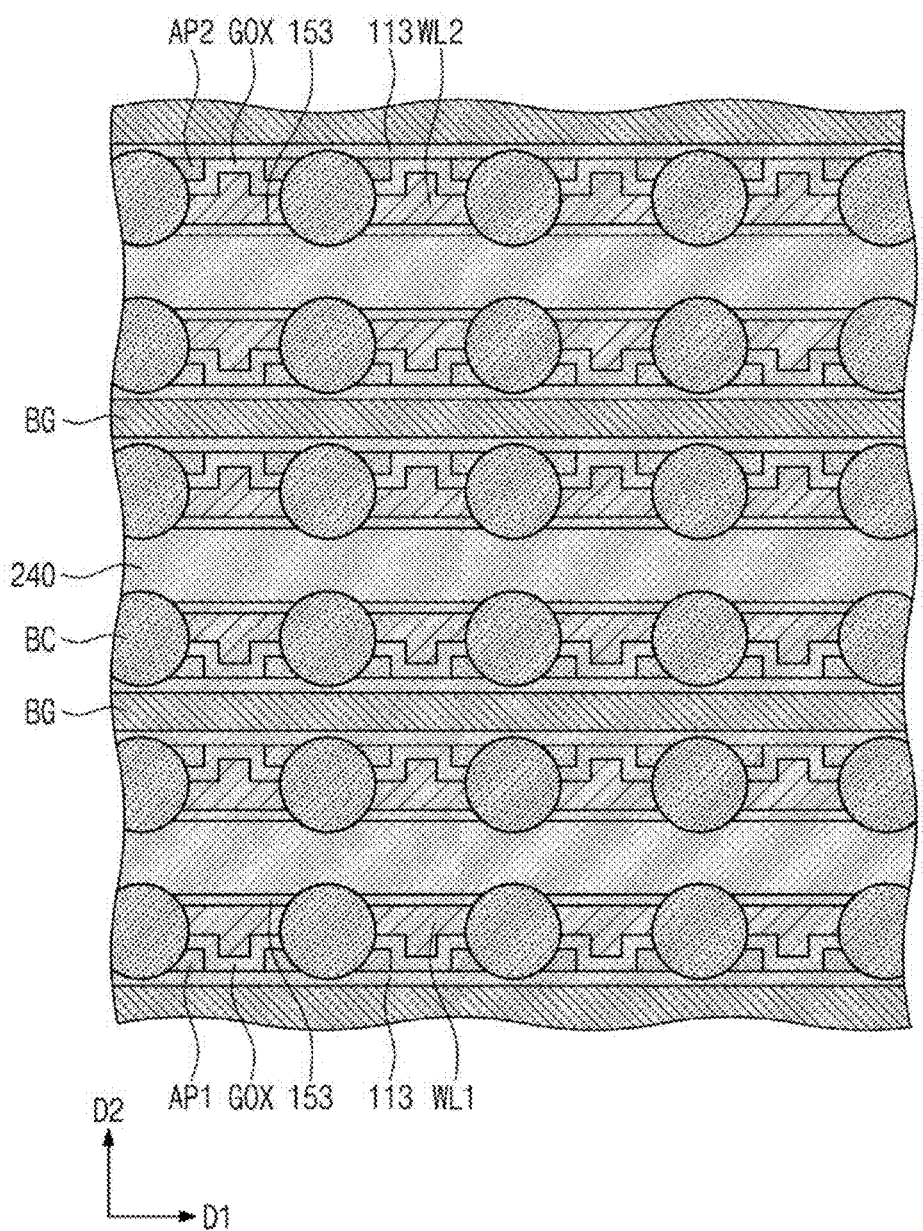
Figure 29B:
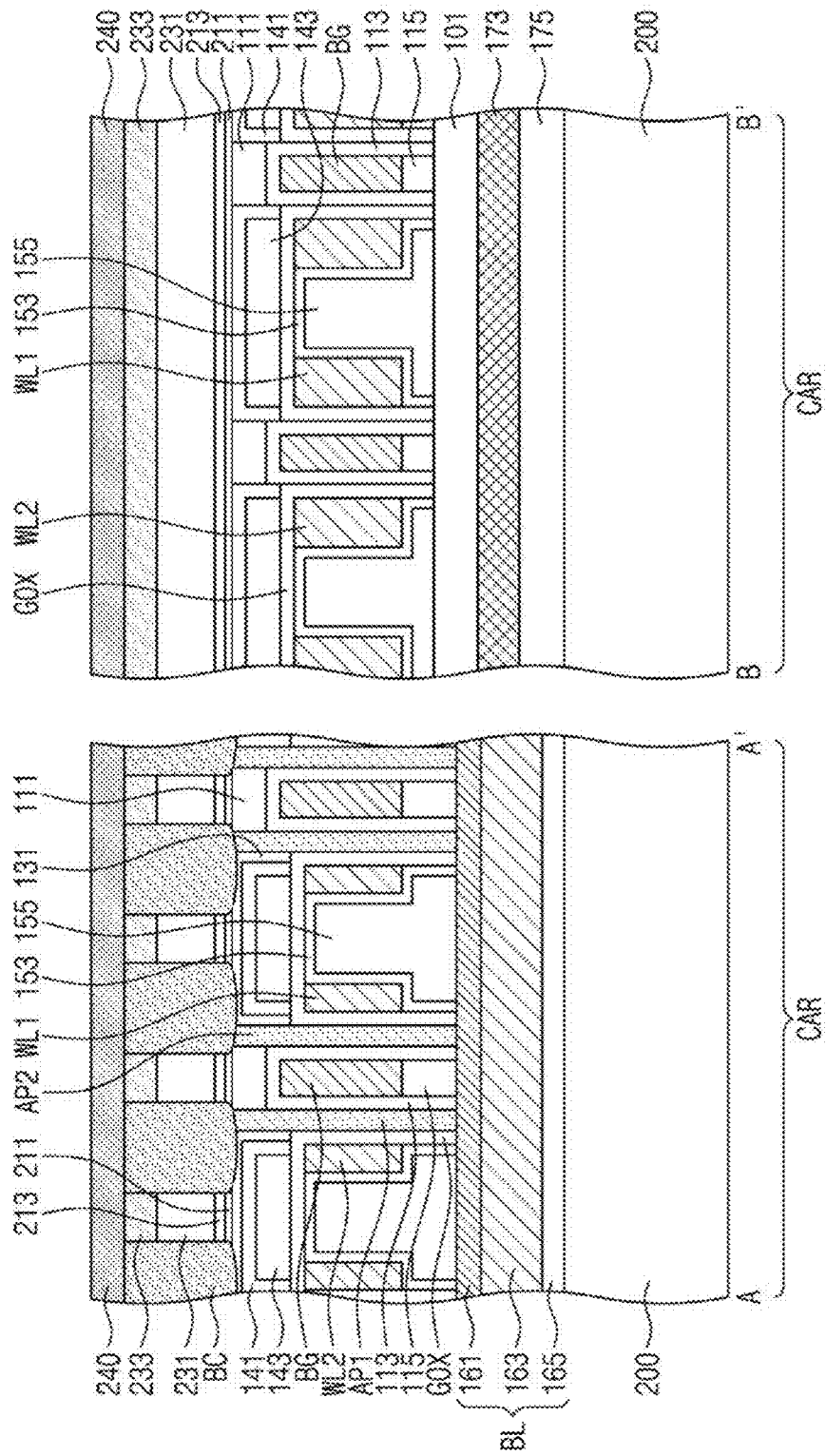

Referring to FIGS. 29A, 29B, and 29C, peripheral contact plugs PCPa, PCPb, and PCPc may be formed on the peripheral circuit region PCR (in S110 of FIG. 9).

The formation of the peripheral contact plugs PCPa, PCPb, and PCPc may include patterning the etch stop layer 233, the interlayer insulating layer 231, and the device isolation layer STI to form contact holes and depositing a conductive layer 240 on the etch stop layer 233 to fill the contact holes. The peripheral contact plugs PCPa, PCPb, and PCPc may include a first peripheral contact plug PCPa, which is formed to penetrate the etch stop layer 233, the interlayer insulating layer 231, and the device isolation layer STI and is coupled to the end portion of the bit line (i.e., the end portion of the metal layer 163), a second peripheral contact plug PCPb, which is coupled to the end portion 174 of the gap structure 173, and a third peripheral contact plug PCPc, which is connected to a source/drain region of the peripheral transistor.

Figure 30A:
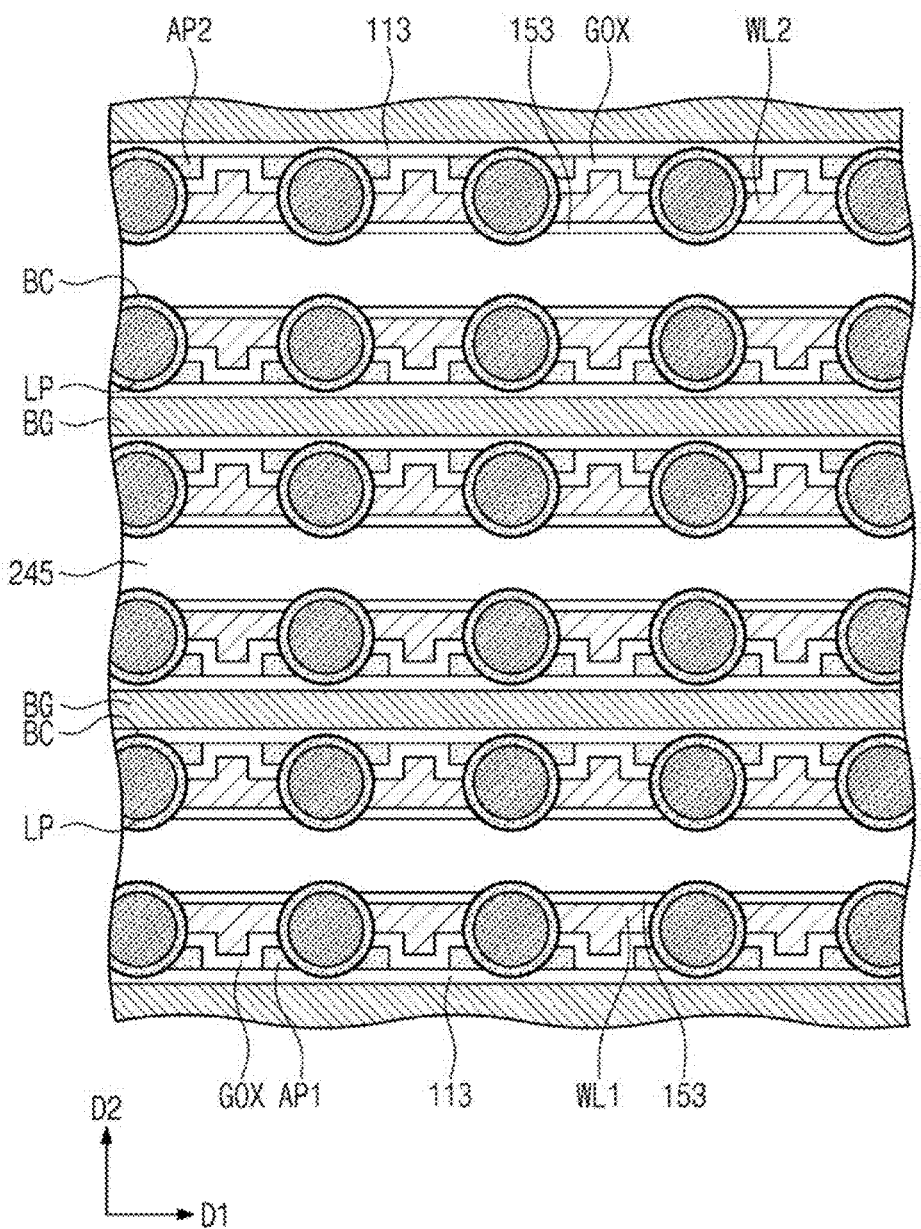
Figure 30B:
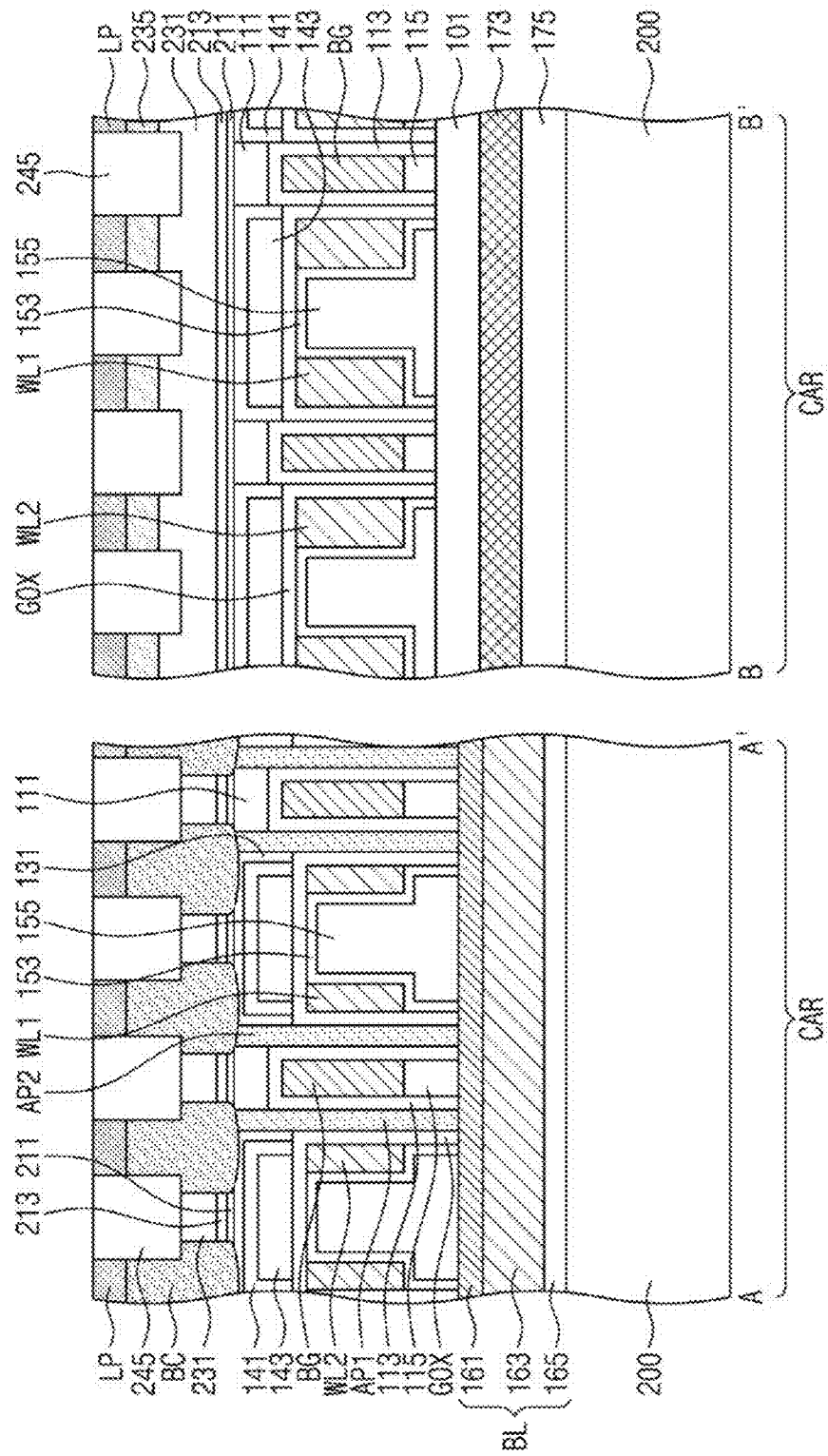
Figure 30C:
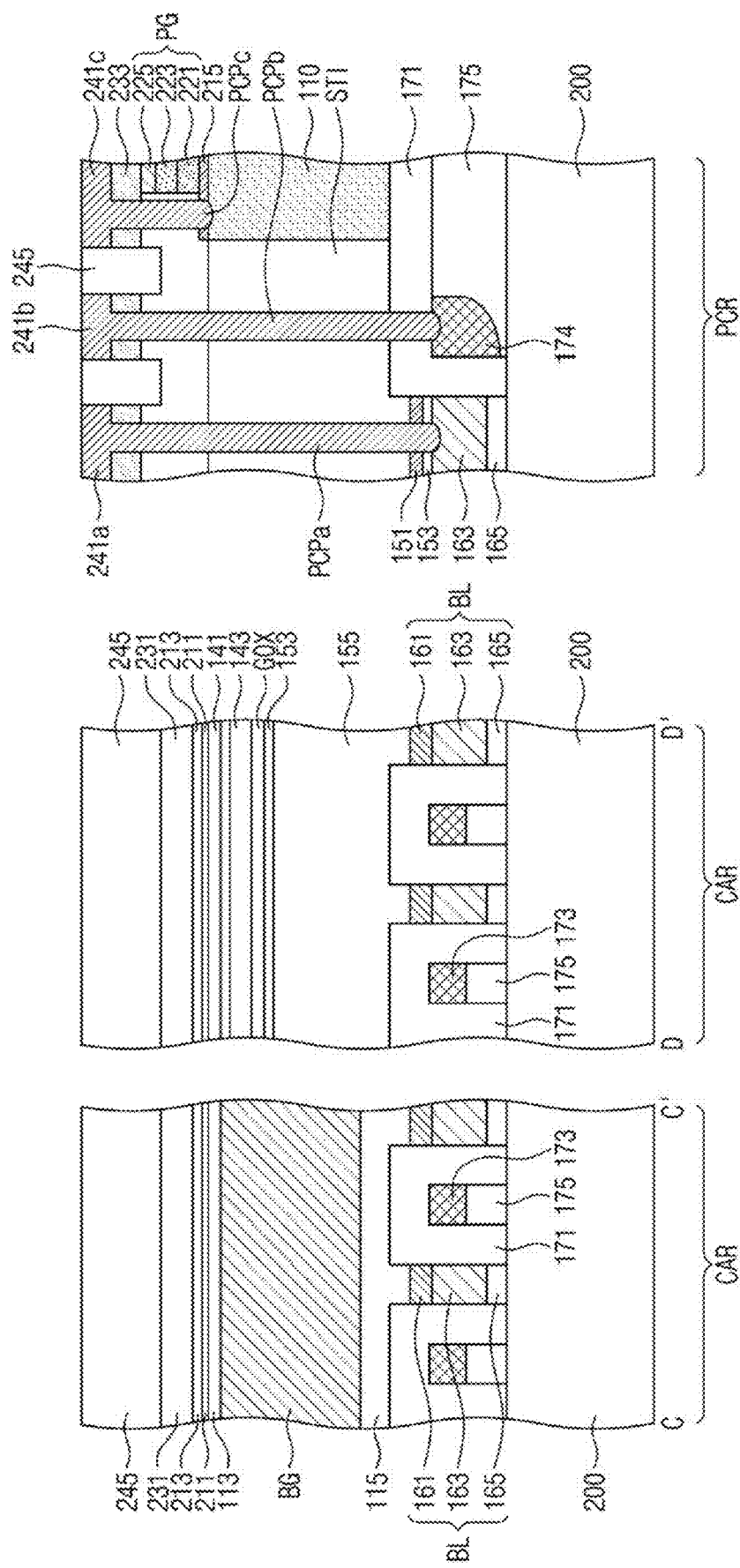

Referring to FIGS. 30A, 30B, and 30C, the conductive layer 240 may be patterned to form the landing pads LP, which are respectively connected to the contact patterns BC, on the cell array region CAR (in S120 of FIG. 9).

The formation of the landing pads LP may include forming a recess region by anisotropically etching the conductive layer 240, the etch stop layer 233, and the interlayer insulating layer 231 using mask patterns and forming an isolation insulating pattern 245 by filling the recess region with an insulating material. The contact patterns BC may be partially etched, during the formation of the recess region. A top surface of the isolation insulating pattern 245 may be substantially coplanar with the top surfaces of the landing pads LP.

When the landing pads LP are formed, the conductive layer 240 may be patterned to form peripheral circuit lines 241a, 241b, and 241c on the peripheral circuit region PCR. In the peripheral circuit region PCR, the isolation insulating pattern 245 may separate the peripheral circuit lines 241a, 241b, and 241c from each other.

Figure 31A:
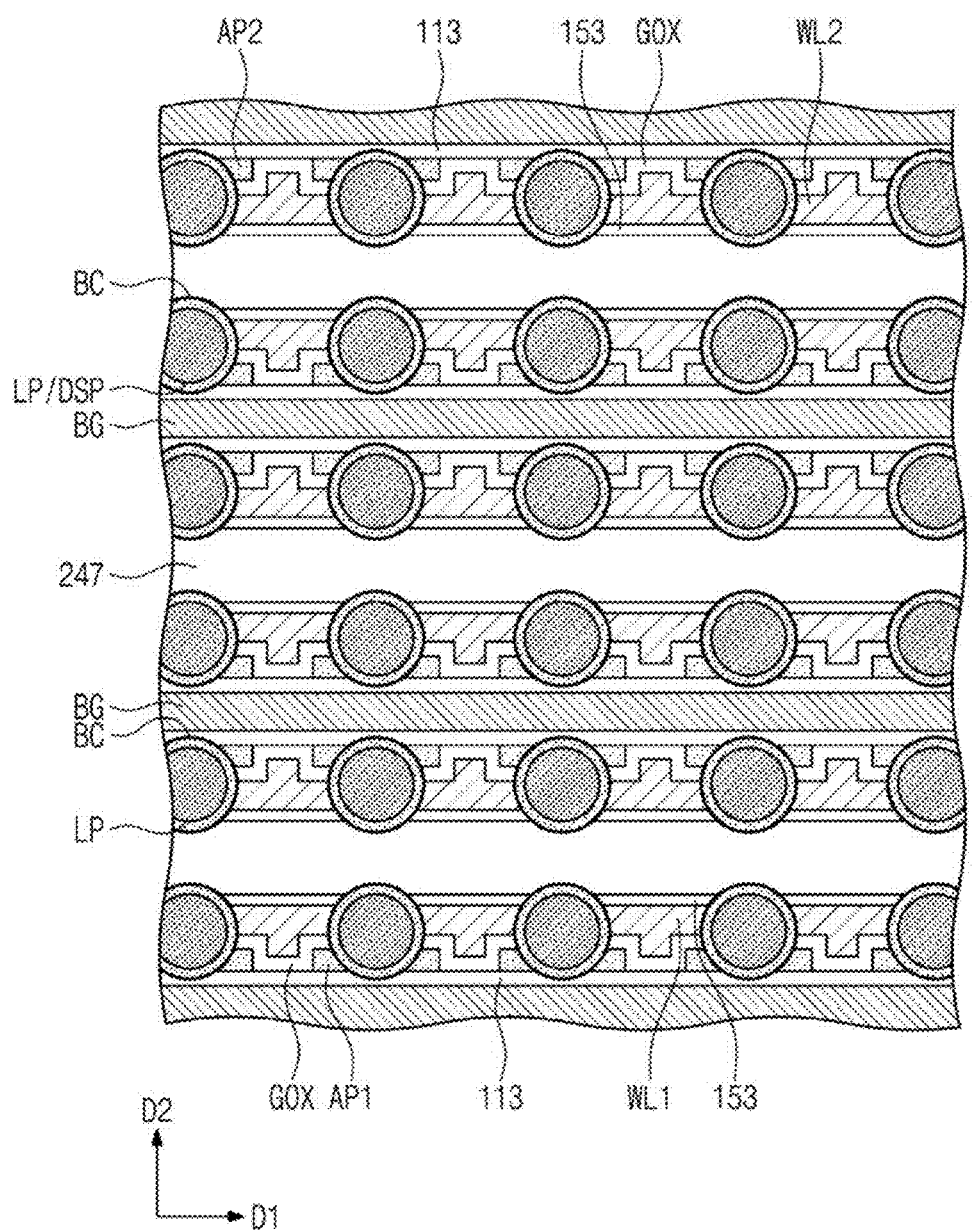
Figure 31B:
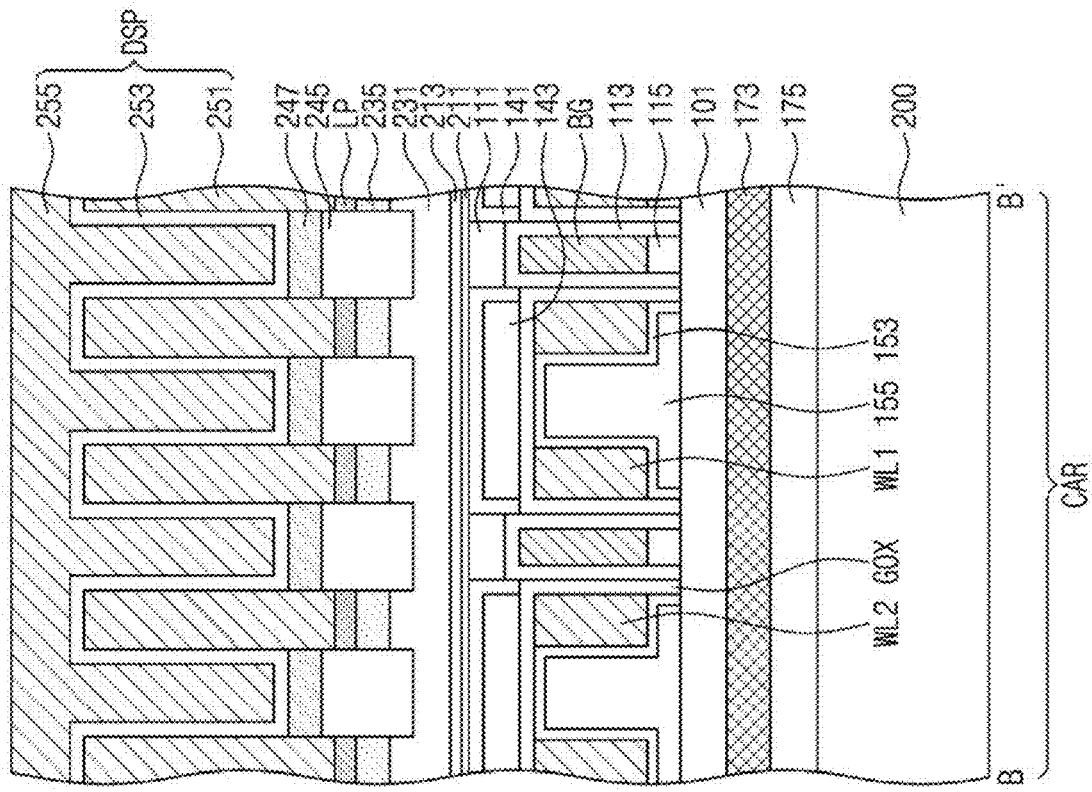
Figure 31B:
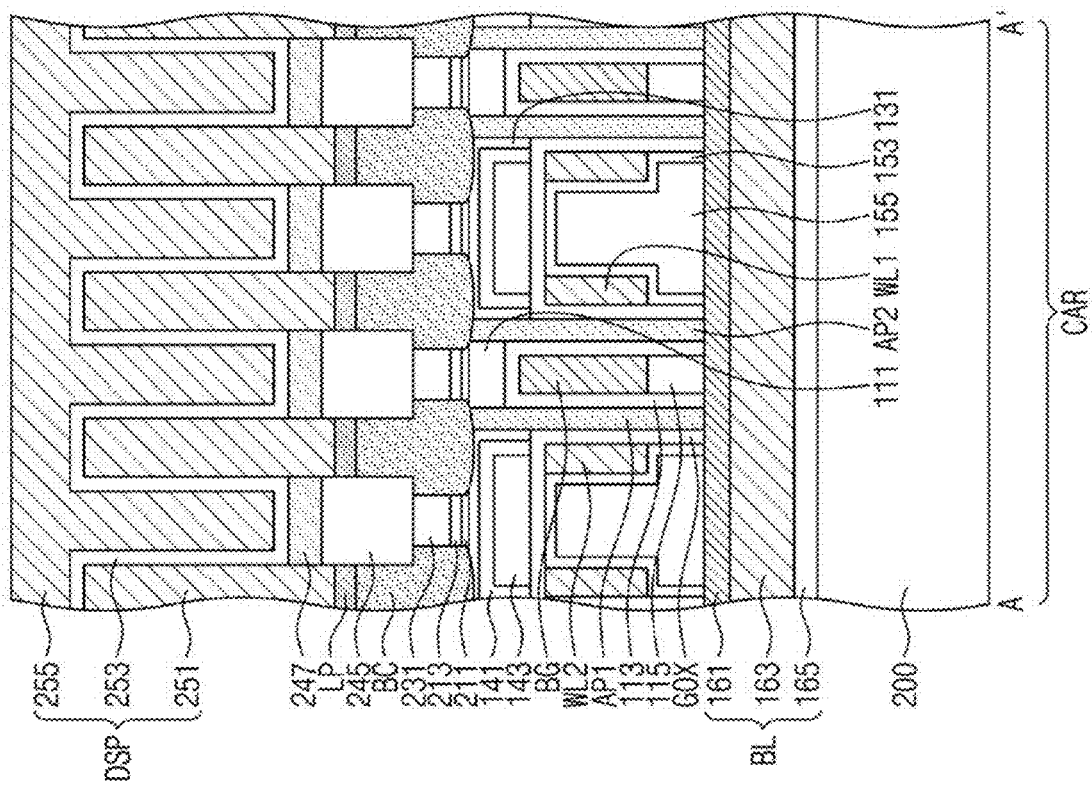

Referring to FIGS. 31A, 31B, and 31C, capacitors DSP, which are used as data storage elements, may be formed on the landing pads LP (in S130 of FIG. 9).

In detail, storage electrodes 251 may be formed on the landing pads LP, respectively, and a capacitor dielectric layer 253 may be formed to conformally cover surfaces of the storage electrodes 251. Thereafter, a plate electrode 255 may be formed on the capacitor dielectric layer 253.

After the formation of the capacitors DSP, a peripheral circuit insulating layer 263 may be formed to cover the peripheral circuit region PCR, and an upper insulating layer 270 may be formed on the capacitors DSP and the peripheral circuit insulating layer 263.

According to some example embodiments of the inventive concepts, in a semiconductor memory device with vertical channel transistors, active patterns may be formed of a single-crystalline semiconductor material, and thus, it may be possible to improve a leakage current property of the vertical channel transistor.

A back-gate electrode may be provided to increase a threshold voltage of the vertical channel transistor, and thus, it may be possible to reduce, minimize, or prevent a leakage current property of the vertical channel transistor from being deteriorated by a reduction of the threshold voltage of the vertical channel transistor, which occurs when the vertical channel transistor is scaled down.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
a bit line extending in a first direction;
first and second active patterns on the bit line;
a back-gate electrode, which is between the first and second active patterns and extends in a second direction that is different from the first direction to cross the bit line;
a first word line, which is at a side of the first active pattern and extends in the second direction such that the first active pattern is between the first word line and the back-gate electrode;
a second word line, which is at an opposite side of the second active pattern and is extended in the second direction such that the second active pattern is between the second word line and the back-gate electrode; and
contact patterns coupled to separate, respective active patterns of the first and second active patterns.

2. The semiconductor memory device of claim 1, wherein the first and second active patterns each include a single-crystalline semiconductor material.

3. The semiconductor memory device of claim 1, wherein each of the first and second active patterns has a length in the second direction which is larger than a bit line width of the bit line in the second direction.

4. The semiconductor memory device of claim 1, wherein each of the first and second active patterns has a uniform width in the first direction.

5. The semiconductor memory device of claim 1, wherein each of the first and second word lines and the back-gate electrode has a bottom surface that is proximate to the bit line and a top surface that is proximate to at least one contact pattern of the contact patterns, and
the bottom surfaces of the first and second word lines are located at a level different from a level of the bottom surface of the back-gate electrode.

6. The semiconductor memory device of claim 5, wherein the top surfaces of the first and second word lines are located at a level different from a level of the top surface of the back-gate electrode.

7. The semiconductor memory device of claim 1, wherein each of the first and second word lines and the back-gate electrode has a height in a third direction that is perpendicular to the first and second directions, and
the height of the first and second word lines is different from a height of the back-gate electrode in the third direction.

8. The semiconductor memory device of claim 1, wherein each of the first and second active patterns comprises
a dopant region, which is adjacent to the contact patterns, and
a channel region, which is adjacent to the first and second word lines, and
a doping concentration in the dopant region is higher than a doping concentration in the channel region.

9. The semiconductor memory device of claim 1, further comprising:
a first insulating pattern between the bit line and the back-gate electrode; and
a second insulating pattern between the contact patterns and the back-gate electrode.

10. The semiconductor memory device of claim 1, further comprising a back-gate insulating pattern between the back-gate electrode and the first and second active patterns,
wherein the back-gate insulating pattern comprises a first vertical portion adjacent to the first active pattern, a second vertical portion adjacent to the second active pattern, and a horizontal portion connecting the first and second vertical portions, and
wherein the horizontal portion is closer to the contact patterns than the bit line.

11. The semiconductor memory device of claim 1, further comprising gate insulating patterns, which are respectively disposed between the first and second active patterns and the first and second word lines,
wherein each of the gate insulating patterns comprises
a vertical portion, which is adjacent to the first and second active patterns, and
a horizontal portion, which protrudes from the vertical portion in the first direction, and
wherein the horizontal portion is closer to the contact patterns than the bit line.

12. A semiconductor memory device, comprising:
an active pattern having
a first surface and a second surface, which are opposite to each other in a vertical direction, and
a first side surface and a second side surface, which are opposite to each other in a horizontal direction;
a bit line in contact with the first surface of the active pattern;
a word line crossing the bit line and adjacent to the first side surface of the active pattern;
a gate insulating pattern including
a vertical portion, which is between the first side surface of the active pattern and the word line, and
a horizontal portion, which protrudes from the vertical portion in the horizontal direction;
a back-gate electrode crossing the bit line and adjacent to the second side surface of the active pattern;
a back-gate insulating pattern between the second side surface of the active pattern and the back-gate electrode; and
a contact pattern in contact with the second surface of the active pattern,
wherein the horizontal portion of the gate insulating pattern is closer to the contact pattern than to the bit line.

13. The semiconductor memory device of claim 12, wherein the active pattern includes a single-crystalline semiconductor material.

14. The semiconductor memory device of claim 12, wherein the active pattern has substantially a same width at the first and second surfaces.

15. The semiconductor memory device of claim 12, wherein a length of the active pattern is larger than a width of the bit line.

16. The semiconductor memory device of claim 12, wherein a distance between the bit line and the back-gate electrode is different from a distance between the bit line and the word line.

17. A semiconductor memory device, comprising:
bit lines on a substrate and extending in a first direction;
first active patterns and second active patterns on the bit lines in an alternating arrangement, which alternates in the first direction between the first and second active patterns;
back-gate electrodes, which are respectively between adjacent ones of the first and second active patterns and each extend in a second direction that is different from the first direction to cross the bit lines;
first word lines, which are adjacent to separate, respective first active patterns of the first active patterns, and each extend in the second direction;
second word lines, which are adjacent to separate, respective second active patterns of the second active patterns, and each extend in the second direction;
gate insulating patterns between the first and second active patterns and the first and second word lines;
back-gate insulating patterns between the first and second active patterns and the back-gate electrodes;
contact patterns coupled to the first and second active patterns, respectively;
isolation insulating patterns between the first and second word lines, which are adjacent to each other in the first direction;
first insulating patterns between the bit lines and the back-gate electrodes;
second insulating patterns between the first and second word lines and the bit lines;
third insulating patterns between the contact patterns and the back-gate electrodes;
fourth insulating patterns between the contact patterns and the first and second word lines; and
data storage patterns coupled to the contact patterns, respectively,
wherein each of the gate insulating patterns includes
a vertical portion, which is adjacent to the first and second active patterns, and
a horizontal portion, which protrudes from the vertical portion in the first direction, and
wherein the horizontal portion of each of the gate insulating patterns is between at least one of the fourth insulating patterns and at least one of the isolation insulating patterns.

18. The semiconductor memory device of claim 17, further comprising:
gap structures between adjacent ones of the bit lines; and
insulating patterns between the gap structures and the bit lines,
wherein the gap structures comprise a conductive material or a dielectric material.

19. The semiconductor memory device of claim 17, wherein
each of the first and second active patterns comprises
a dopant region, which is adjacent to the contact patterns and is doped with impurities, and
a channel region, which is adjacent to the first and second word lines, and
a doping concentration in the dopant region is higher than a doping concentration in the channel region.

20. The semiconductor memory device of claim 17, wherein
the substrate comprises a cell array region and a peripheral circuit region,
the semiconductor memory device further includes
an active layer on the peripheral circuit region of the substrate, the active layer having a first surface and a second surface, which are opposite to each other, and
a peripheral transistor integrated on the first surface of the active layer, and
the second surface of the active layer is located at substantially a same level as respective surfaces of the first and second active patterns, which are in contact with the bit lines.

* * * * *